(12) United States Patent
Kuekes et al.

(10) Patent No.: US 7,350,132 B2
(45) Date of Patent: *Mar. 25, 2008

(54) NANOSCALE INTERCONNECTION INTERFACE

(75) Inventors: Philip J. Kuekes, Menlo Park, CA (US); J. Warren Robinett, Pittsboro, NC (US); Gadiel Seroussi, Cupertino, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 194 days.

This patent is subject to a terminal disclaimer.

(21) Appl. No.: 11/115,887

(22) Filed: Apr. 26, 2005

(65) Prior Publication Data

US 2005/0193356 A1 Sep. 1, 2005

Related U.S. Application Data

(63) Continuation-in-part of application No. 10/659,892, filed on Sep. 10, 2003, now Pat. No. 7,191,380.

(51) Int. Cl.
*H03M 10/00* (2006.01)

(52) U.S. Cl. ............... 714/758; 714/752; 714/805; 716/12; 716/17; 708/1

(58) Field of Classification Search ............ 714/758, 714/752, 805; 716/5, 12, 17; 708/1; 370/405, 370/406; 340/146
See application file for complete search history.

(56) References Cited

U.S. PATENT DOCUMENTS

| | | |
|---|---|---|
| 4,556,960 A | 12/1985 | Cohn et al. |
| 6,466,512 B1 | 10/2002 | Hogan et al. |
| 7,073,157 B2 * | 7/2006 | DeHon et al. ......... 716/17 |
| 7,191,380 B2 * | 3/2007 | Kuekes et al. ......... 714/758 |

FOREIGN PATENT DOCUMENTS

WO WO2005/026957 3/2005

OTHER PUBLICATIONS

Chen, Yong, et al., "Nanoscale molecular-switch devices fabricated by imprint lithography," Applied Physics Letter, vol. 82, No. 10, Mar. 10, 2003, pp. 1610-1612.

(Continued)

*Primary Examiner*—Guy J. Lamarre

(57) ABSTRACT

One embodiment of the present invention provides a demultiplexer implemented as a nanowire crossbar or a hybrid nanowire/microscale-signal-line crossbar with resistor-like nanowire junctions. The demultiplexer of one embodiment provides demultiplexing of signals input on k microscale address lines to $2^k$ or fewer nanowires, employing supplemental, internal address lines to map $2^k$ nanowire addresses to a larger, internal, n-bit address space, where n>k. A second demultiplexer embodiment of the present invention provides demultiplexing of signals input on n microscale address lines to $2^k$ nanowires, with n>k, using $2^k$, well-distributed, n-bit external addresses to access the $2^k$ nanowires. Additional embodiments of the present invention include a method for evaluating different mappings of nanowire addresses to internal address-spaces of different sizes, or to evaluate mappings of nanowires to external address-spaces of different sizes, metrics for evaluating address mapping and demultiplexer designs, and demultiplexer design methods.

14 Claims, 79 Drawing Sheets

OTHER PUBLICATIONS

Dehon, Andre, "Array-Based Architecture for FET-Based, Nanoscale Electronics," IEEE Transactions on Nanotechnology, vol. 2, No. 1, Mar. 2003 (Abstract only).

Collier, C.P., et al., "Electronically configurable Molecular-Based Logic Gates," SCIENCE, vol. 285, Jul. 16, 1999, pp. 391-394.

Zhong, Zhaohui, et al., "Nanowire Crossbar Arrays as Address Decoders for Interated Nanosystems," SCIENCE, vol. 302, No. 21, 2003, pp. 1377-1379.

Chen, Yong, et al., "Nanoscale molecular-switch crossbar circuits," Nanotechnology, vol. 14, 2003, (Abstract only).

Heath, James R., et al., "A Defect-Tolerant Computer Architecture: Opportunities for Nanotechnology," SCIENCE, vol. 280, Jun. 12, 1998, pp. 1716-1721.

Nikolic, K., et al., "Fault-tolerant techniques for nanocomputers," Nanotechnology, vol. 13, May 23, 2002, (Abstract only).

Han, Jie, et al., "A defect-and fault-tolerant architecture for nanocomputers," Nanotechnology, vol. 14, Jan. 16, 2003, (Abstract only).

Stapper, C.H., et al., "High-reliability fault-tolerant 16-MBit memory chip," IEEE Transactions on Reliability, vol. 42, Issue 4, Dec. 1993, (Abstract only).

Kuekes, Philip J., et al., "Defect-Tolerant Interconnect to Nanoelectronic Circuits: Internally-Redundant Demultiplexers Based on Error-Correcting Codes," HP Labs, Apr. 13, 2004.

Jaffe, David B., "Information about binary linear codes," Whitehead Institute/MIT Center for Genome Research, (Abstract only).

Luo, Yi, et al., "Two-Dimensional Molecular Electronics Circuits,"CHEMPHYSCHEM, vol. 3, 2002, pp. 519-525.

* cited by examiner

|  | 00 | 01 | 10 | 11 ← 504 |
|---|---|---|---|---|
| 11 | $0.95 V_H$ | $0.90 V_H$ | $0.90 V_H$ | 0 |
| 10 | $0.90 V_H$ | $0.95 V_H$ | 0 | $0.90 V_H$ |
| 01 | $0.90 V_H$ | 0 | $0.95 V_H$ | $0.90 V_H$ |
| 00 | 0 | $0.90 V_H$ | $0.90 V_H$ | $0.95 V_H$ |

|     | 00 | 01 | 10 | 11 |
|-----|-----|-----|-----|-----|
| 11  | 0.95 $V_H$ | 0.90 $V_H$ | 0.90 $V_H$ | 0 |
| 10  | 0.90 $V_H$ | 0.95 $V_H$ | 0 | 0.90 $V_H$ |
| 01  | 0.90 $V_H$ | 0 | 0.90 $V_H$ | 0 |
| 00  | 0 | 0.90 $V_H$ | 0.90 $V_H$ | 0.95 $V_H$ |

Figure 8

|  | 00 | 01 | 10 | 11 |
|---|---|---|---|---|
| 11 | 0.90 $V_H$ | 0.90 $V_H$ | 0 | 0 |
| 10 | 0.90 $V_H$ | 0.95 $V_H$ | 0 | 0.90 $V_H$ |
| 01 | 0.90 $V_H$ | 0 | 0.90 $V_H$ | 0 |
| 00 | 0 | 0.90 $V_H$ | 0.90 $V_H$ | 0.95 $V_H$ |

Figure 10

|     | 00 | 01 | 10 | 11 |
| --- | --- | --- | --- | --- |
| 11 | 0.95 $V_H$ | 0.95 $V_H$ | 0.95 $V_H$ | 0 |
| 10 | 0.95 $V_H$ | 0.95 $V_H$ | 0 | 0.95 $V_H$ |
| 01 | 0.95 $V_H$ | 0 | 0.95 $V_H$ | 0.95 $V_H$ |
| 00 | 0 | 0.95 $V_H$ | 0.95 $V_H$ | 0.95 $V_H$ |

Figure 13

|  | 00 | 01 | 10 | 11 |
|---|---|---|---|---|
| 11 | 0.95 $V_H$ | 0.95 $V_H$ | 0.95 $V_H$ | 0 |
| 10 | 0.95 $V_H$ | 0.95 $V_H$ | 0 | 0.95 $V_H$ |
| 01 | 0.95 $V_H$ | 0 | 0.90 $V_H$ | 0.90 $V_H$ |
| 00 | 0 | 0.95 $V_H$ | 0.95 $V_H$ | 0.95 $V_H$ |

|    | 00 | 01 | 10 | 11 |
|----|----|----|----|----|
| 11 | $0.90\ V_H$ | $0.95\ V_H$ | $0.90\ V_H$ | 0 |
| 10 | $0.95\ V_H$ | $0.95\ V_H$ | 0 | $0.95\ V_H$ |
| 01 | $0.95\ V_H$ | 0 | $0.90\ V_H$ | $0.90\ V_H$ |
| 00 | 0 | $0.95\ V_H$ | $0.95\ V_H$ | $0.95\ V_H$ |

Figure 18

|  | 00 | 01 | 10 | 11 |
|---|---|---|---|---|
| 11 | $0.90\,V_H$ | $0.95\,V_H$ | $0.90\,V_H$ | 0 |
| 10 | $0.95\,V_H$ | $0.90\,V_H$ | 0 | $0.90\,V_H$ |
| 01 | $0.95\,V_H$ | 0 | $0.90\,V_H$ | $0.90\,V_H$ |
| 00 | 0 | $0.95\,V_H$ | $0.95\,V_H$ | $0.95\,V_H$ |

Figure 20

|  | 00 | 01 | 10 | 11 |
|---|---|---|---|---|
| 11 | 0 | $0.90 V_H$ | $0.90 V_H$ | 0 |
| 10 | $0.95 V_H$ | $0.90 V_H$ | 0 | $0.90 V_H$ |
| 01 | $0.95 V_H$ | 0 | $0.90 V_H$ | $0.90 V_H$ |
| 00 | 0 | $0.95 V_H$ | $0.95 V_H$ | $0.95 V_H$ |

Figure 22

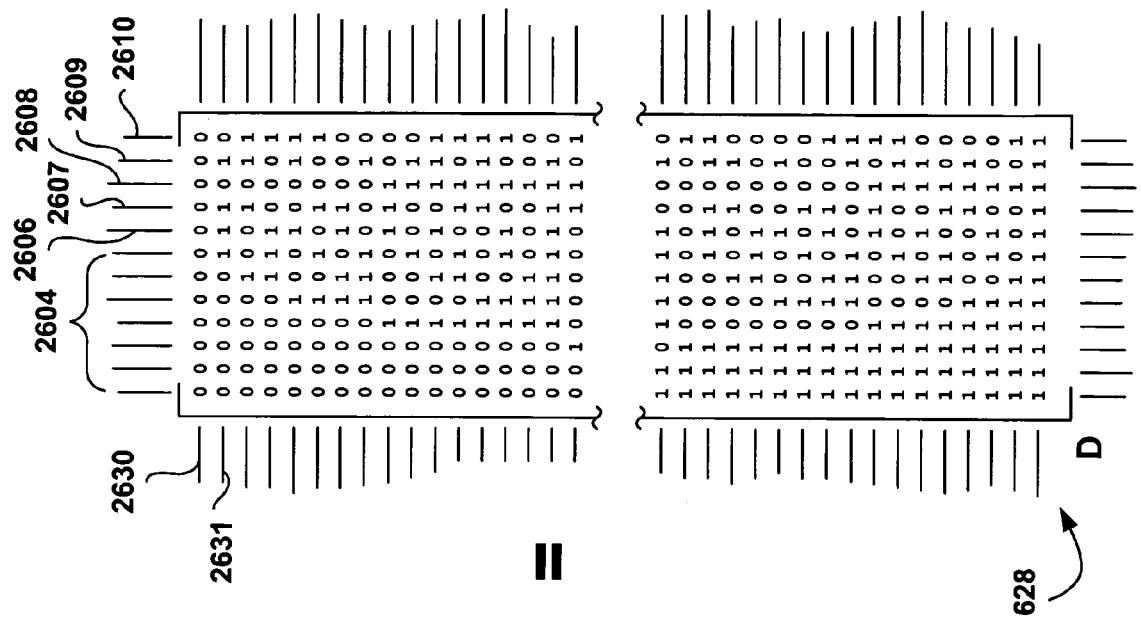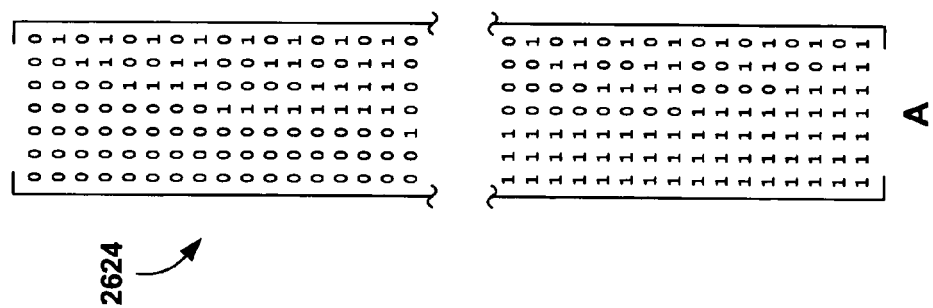
Figure 26B

3200

| A0 | A1 | S |
|---|---|---|
| 0 | 0 | 0 |
| 0 | 1 | $\sim \frac{V}{2}$ |
| 1 | 0 | $\sim \frac{V}{2}$ |
| 1 | 1 | $\sim V$ |

| parameter | | optimization |
|---|---|---|
| $n$ | $\dfrac{\text{input address lines}}{2}$ | |
| $k$ | $\log_z$ output signal lines | |
| $d$ | Hamming distance | |
| $R$ | $\dfrac{k}{n}$ | maximize $R$ |
| $S$ | $\dfrac{d_{max} - d}{d_{max}}$ | minimize $S$ |
| $S'$ | $\dfrac{d_{max} - (d + c)}{d_{max}}$ | minimize $S'$ |

Figure 45

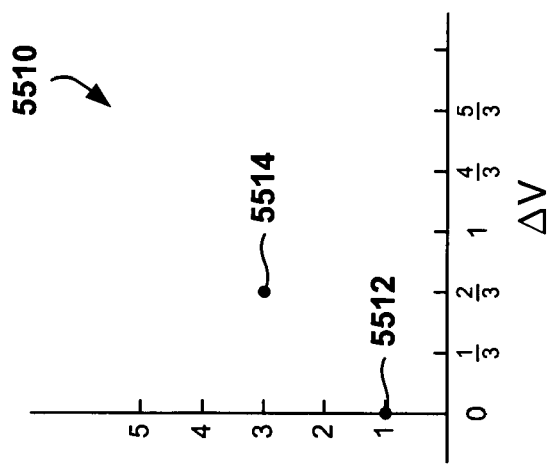
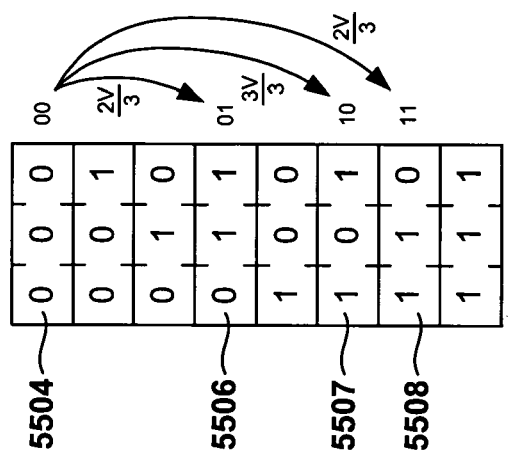
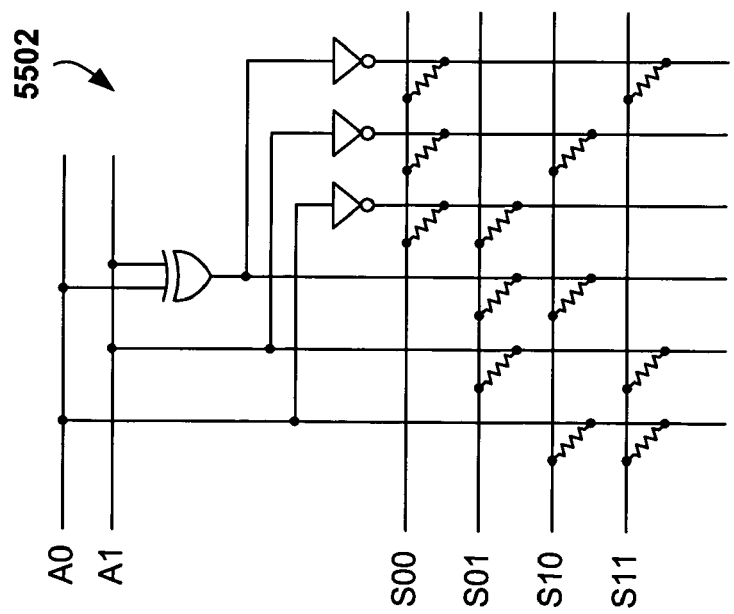
Figure 55A

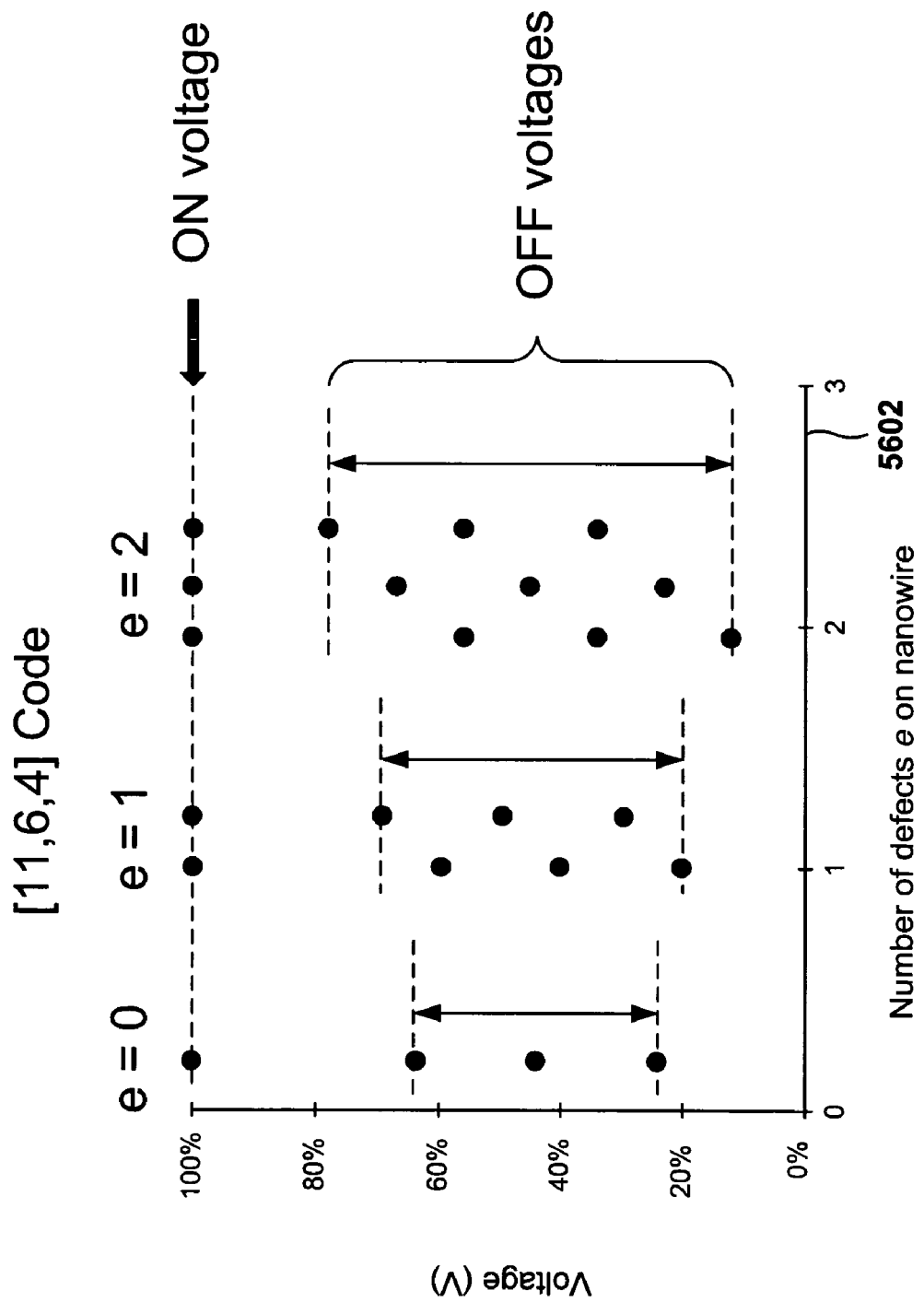

NANOSCALE INTERCONNECTION INTERFACE

CROSS REFERENCE TO RELATED APPLICATION

This application is a continuation-in-part of application Ser. No. 10/659,892, now U.S. Pat. No. 7,191,380, filed Sep. 10, 2003, issued Mar. 13, 2007.

STATEMENT OF GOVERNMENT INTEREST

This invention has been made with Government support under Agreement #MDA972-01-3-005, awarded by DARPA Moletronics. The government has certain rights in the invention.

TECHNICAL FIELD

The present invention relates to nanoscale and hybrid nanoscale/microscale electronic circuits and, in particular, to defect-tolerant interconnection interface devices, including demultiplexers, that produce electrically distinguishable signal levels and that are defect tolerant.

BACKGROUND OF THE INVENTION

The present invention is related to nanoscale electronic circuits, including defect-tolerant demultiplexers, with electrically distinguishable output signal levels. In many embodiments, these circuits are implemented using nanoscale or hybrid nanowire/microscale crossbars.

Nanowire crossbars provide an enormous decrease in circuitry size compared with current, photolithography-produced microelectronic and sub-microelectronic circuitry. However, many alignment and spontaneous defect problems need to be overcome to successfully manufacture electronic devices that include nanoelectronic circuits, including nanowire crossbars. A number of techniques and nanowire-crossbar implementations have been designed to overcome these alignment and defect problems, including configurable, or reprogrammable, nanowire-crossbar implementations that allow defects to be detected and circumvented by programming configurations that provide desired functionality without incorporating defective molecular junctions. These techniques are not needed for current microelectronic circuitry produced by photolithographic techniques, because microelectronic circuits can be assumed, in the current discussion, to be essentially perfect or, more precisely, the defect rate in photolithography-produced microelectronic circuits is so far below the current defect rate in nanoscale electronic circuitry that the comparatively very low defect rate in microelectronic circuitry can be ignored.

Nanoscale electronic circuits need to interface to microelectronic circuitry in order to be incorporated within commercially viable and useful electronic devices. The interface between essentially non-defective microelectronic circuitry and nanoelectronic circuitry is problematic. While various correctly functioning nanoelectronic circuits can be configured from defect-prone nanowire crossbars, these nanoscale circuits need to be interconnected with microelectronic circuits. The relatively high manufacturing-defect rate that occurs in fabricating nanoelectronic devices may produce a yield of usable combination nanoscale/microscale circuits too low to be economically viable. However, it is not feasible to extend existing redundancy-based, defect avoidance strategies designed for nanoscale circuits to microelectronic circuitry through nanoscale-to-microscale interfaces, because these redundancy-based techniques depend on an ability to attempt a measurement of each junction in the nanoscale circuits to determine whether or not the junction is defective. Such individual access to junctions within an interconnection interface would require the interconnection interface to be properly functioning in the first place. In other words, the redundancy-based techniques assume defective nanoscale circuitry components, but rely on an ability to address the components through a properly working interconnection interface. Thus, defects in the interconnection interface result in degradation or complete lack of addressability of interconnection interface components. The interconnection interface may be viewed as a type of bootstrap mechanism that allows defect control in a nanoscale circuit, the components of which are addressed through the bootstrap For example, electronic memories based on nanowire-crossbar-implemented memory-element arrays are attractive with respect to size and power consumption, but are not economically viable using current designs and manufacturing strategies, because defects in the interconnect would make large portions of the memory unaddressable, pushing the effective cost/bit of manufacture to a level too high to be competitive.

Another problem that arises in nanoscale electronics is that the separations between ON and OFF voltage or current states may not be sufficiently large to distinguish between ON and OFF states in the presence of noise and imperfect manufacturing tolerances in certain types of circuits, including in groups of nanowires activated by intersecting address signal lines in demultiplexers and other types of circuits. For binary-logic-based circuitry, an easily detected voltage or current separation between "1," or ON, and "0," or OFF, states is needed. In certain types of demultiplexers, for example, one of a large set of nanowires may be addressed by the voltage or current states on a smaller number of address lines that cross the nanowire of interest. If the selected nanowire is designed to have a low, "0," or, synonymously, OFF state, and the unselected nanowires are designed to have a high, "1," or, synonymously, ON state, then the voltage or current difference between the selected nanowire and the lowest voltage or lowest current unselected nanowire must be sufficiently large to be easily detected. Unfortunately, the electronic characteristics of nanowire molecular junctions may be difficult to precisely manufacture, leading to leaky diodes, resistors with a wide variation in resistance, and leaky transistors, in turn leading to undesirably narrow differences between ON and OFF states in addressed nanowires.

For these reasons, designers and manufacturers of nanoscale electronic circuitry, and, in particular, nanoscale electronic memories, have recognized the need for defect-tolerant interconnection within nanoscale circuitry in the interface between microscale and nanoscale circuits. Moreover, designers and manufacturers of nanoscale electronic circuitry have recognized the need for interconnections with distinguishable signal levels between nanowires and address signal lines that select one or a subset of nanowires to have a different voltage or current state than the remaining nanowires.

SUMMARY OF THE INVENTION

One embodiment of the present invention provides a demultiplexer implemented as a nanowire crossbar or a hybrid nanowire/microscale-signal-line crossbar with resistor-like nanowire junctions. The demultiplexer of one embodiment provides demultiplexing of signals input on k microscale address lines to $2^k$ or fewer nanowires, employing supplemental, internal address lines to map $2^k$ nanowire addresses to a larger, internal, n-bit address space, where n>k. A second demultiplexer embodiment of the present invention provides demultiplexing of signals input on n microscale address lines to $2^k$ nanowires, with n>k, using $2^k$, well-distributed, n-bit external addresses to access the $2^k$ nanowires. Additional embodiments of the present invention include a method for evaluating different mappings of nanowire addresses to internal address-spaces of different sizes, or to evaluate mappings of nanowires to external address-spaces of different sizes, metrics for evaluating address mapping and demultiplexer designs, and demultiplexer design methods.

BRIEF DESCRIPTION OF THE DRAWINGS

FIG. 5 shows a table indicating voltage states of nanowires resulting from address signals input to microelectronic address signal lines of a nanoscale interconnection interface.

FIG. 8 shows a table indicating voltage states of nanowires resulting from address signals input to microelectronic address signal lines of a nanoscale interconnection interface, using the same illustration conventions as used in FIG. 5, for the defective nanoscale interconnection interface illustrated in FIGS. 6-7D.

FIG. 10 shows a table indicating voltage states of nanowires resulting from address signals input to microelectronic address signal lines of a nanoscale interconnection interface, using the same illustration conventions as used in FIGS. 5 and 8, for the defective nanoscale interconnection interface illustrated in FIG. 9.

FIG. 13 shows a table indicating voltage states of nanowires resulting from address signals input to microelectronic address signal lines of a nanoscale interconnection interface, using the same illustration conventions as used in FIGS. 5, 8, and 10, for the defective nanoscale interconnection interface illustrated in FIGS. 11-12D.

FIG. 16 shows a table indicating voltage states of nanowires resulting from address signals input to microelectronic address signal lines of a nanoscale interconnection interface, using the same illustration conventions as used in FIGS. 5, 8, 10, and 13, for the defective, modified nanoscale interconnection interface illustrated in FIGS. 14-15D.

FIG. 18 shows a table indicating voltage states of nanowires resulting from address signals input to microelectronic address signal lines of a nanoscale interconnection interface, using the same illustration conventions as used in FIGS. 5, 8, 10, 13, and 16, for the defective, modified nanoscale interconnection interface illustrated in FIG. 17.

FIG. 20 shows a table indicating voltage states of nanowires resulting from address signals input to microelectronic address signal lines of a nanoscale interconnection interface, using the same illustration conventions as used in FIGS. 5, 8, 10, 13, and 16, for the defective, modified nanoscale interconnection interface illustrated in FIG. 17.

FIGS. 21 and 22 illustrate loss of unique addressability in the modified nanoscale interconnection interface, which involves the loss of two connections from microwires to one nanowire.

FIGS. 26A-B illustrate the derivation of an encoding circuit that adds parity-check address signal lines to an incoming set of address signal lines and derivation of a demultiplexer corresponding to the encoding circuit that both represent embodiments of the present invention.

FIG. 32 shows a table that summarizes the voltage states possible on a nanoscale output signal line S for the resistor-based demultiplexer shown in FIG. 30A when any particular two-bit address is input.

FIG. 45 shows a table of the various parameters and metrics associated with choosing BLCs for designing resistor-based demultiplexers according to various embodiments of the present invention.

FIGS. 55A-D illustrate the effects of stuck-open, or broken wire, defects within the 3-address-line, 4-output-signal-line demultiplexer, representing one embodiment of the present invention, initially shown in FIG. 38.

FIG. 56 illustrates the same defect trend in a demultiplexer, representing one embodiment of the present invention, designed according to an [11,6,4] linear binary code as that shown in FIGS. 55A-C.

DETAILED DESCRIPTION OF THE INVENTION

Figure 1:
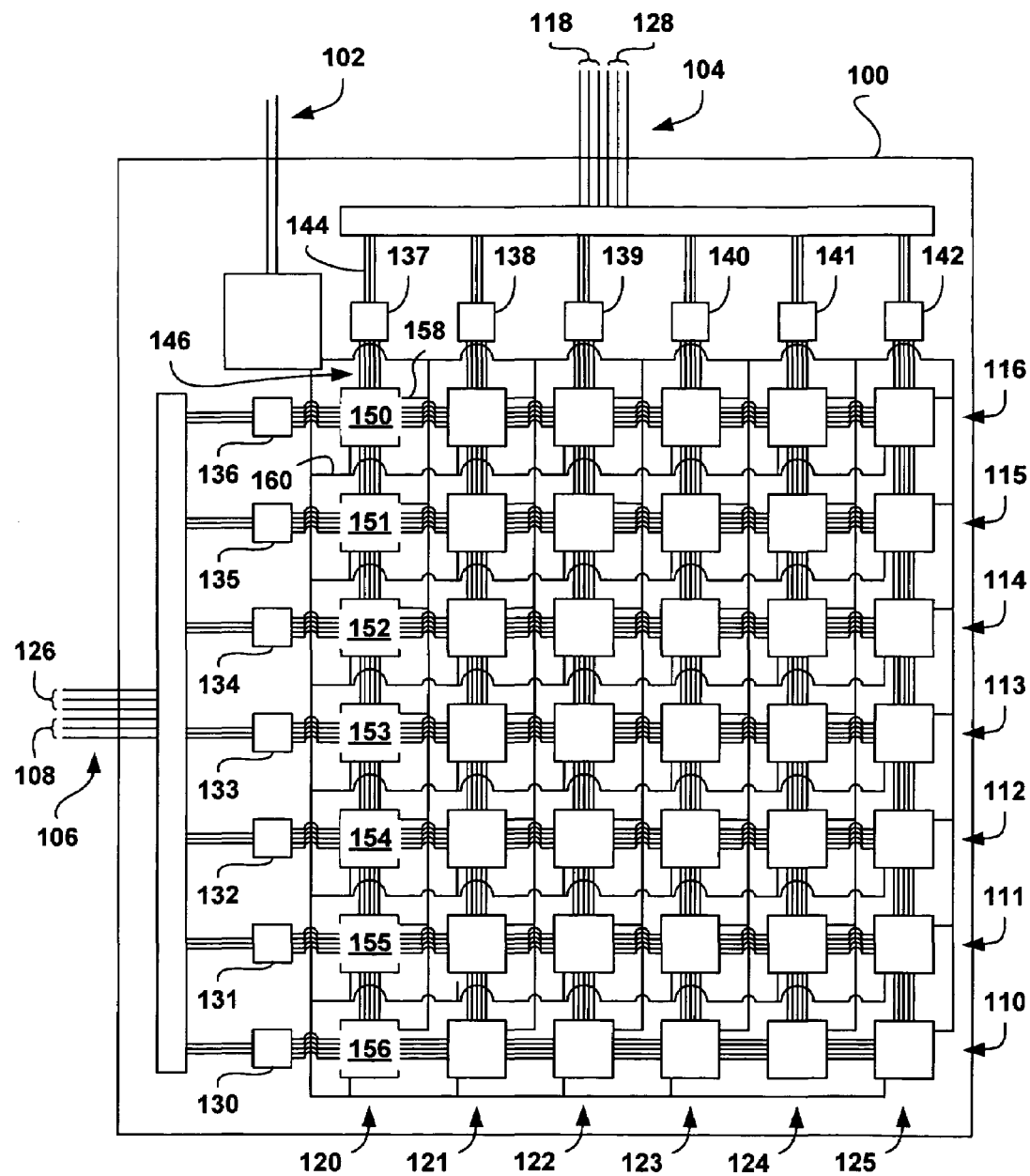
FIG. 1 shows a high-level diagram of a combined nanoscale/microscale electronic memory device.

Various embodiments of the present invention include combined nanoscale/microscale electronic memory devices and fault-tolerant interconnections between microelectronic circuits and nanoelectronic circuits within the electronic memory. Specific embodiments include nanoscale and hybrid nanoscale/microscale demultiplexes. Embodiments of the present invention employ concepts and mathematical techniques developed for error-control coding used in various data-transmission applications. Therefore, in a first subsection, a mathematical description of a number of error-control encoding techniques is provided. In a second subsection, a partially nanoscale electronic memory is described. In a third subsection, a method for determining the nanoelectronic-to-microelectronic circuit-interface topologies within the electronic memory is described. In a fourth subsection, resistor-based demultiplexers and methods for designing demultiplexers and evaluating demultiplexer designs are described.

Mathematical Description of Selected Error-Control Encoding Techniques

Embodiments of the present invention employ concepts derived from well-known techniques in error-control encoding. An excellent reference for this field is the textbook "Error Control Coding: The Fundamentals and Applications," Lin and Costello, Prentice-Hall, Incorporated, New Jersey, 1983. In this subsection, a brief description of the error-detection and error-correction techniques used in error-control encoding are described. Additional details can be obtained from the above-referenced textbook, or from many other textbooks, papers, and journal articles in this field. The current subsection represents a rather mathematically precise, but concise, description of certain types of error-control encoding techniques. The current invention employs concepts inherent in these error-control encoding techniques for a different purpose. Error-control encoding techniques systematically introduce supplemental bits or symbols into plain-text messages, or encode plain-text messages using a greater number of bits or symbols than absolutely required, in order to provide information in encoded messages to allow for errors arising in storage or transmission to be detected and, in some cases, corrected. One effect of the supplemental or more-than-absolutely-needed bits or symbols is to increase the distance between valid codewords, when codewords are viewed as vectors in a vector space and the distance between codewords is a metric derived from the vector subtraction of the codewords. The current invention employs concepts used in error-control coding to add supplemental address signal lines to increase the distance between valid addresses in order to correspondingly increase the signal separation, e.g. voltage or current, between ON and OFF states of address signal lines and to provide defective-junction tolerance in interface interconnections. Thus, in the current invention, the plain-text and encoded messages of error-control encoding are analogous to input addresses and coded addresses, and the additional or greater-number-than-needed symbols or bits in error-control encoding are analogous to supplemental or a greater-than-absolutely-needed number of address signal lines.

In describing error detection and correction, it is useful to describe the data to be transmitted, stored, and retrieved as one or more messages, where a message $\mu$ comprises an ordered sequence of symbols, $\mu_i$, that are elements of a field F. A message $\mu$ can be expressed as:

$$\mu = (\mu_0, \mu_1, \ldots \mu_{k-1})$$

where $\mu_i \in F$.

The field F is a set that is closed under multiplication and addition, and that includes multiplicative and additive inverses. It is common, in computational error detection and correction, to employ fields comprising a subset of integers with sizes equal to a prime number, with the addition and multiplication operators defined as modulo addition and modulo multiplication. In practice, the binary field is commonly employed. Commonly, the original message is encoded into a message c that also comprises an ordered sequence of elements of the field F, expressed as follows:

$$c = (c_0, c_1, \ldots c_{n-1})$$

where $c_i \in F$.

Block encoding techniques encode data in blocks. In this discussion, a block can be viewed as a message $\mu$ comprising a fixed number of symbols k that is encoded into a message c comprising an ordered sequence of n symbols. The encoded message c generally contains a greater number of symbols than the original message $\mu$, and therefore n is greater than k. The r extra symbols in the encoded message, where r equals n−k, are used to carry redundant check information to allow for errors that arise during transmission, storage, and retrieval to be detected with an extremely high probability of detection and, in many cases, corrected.

In a linear block code, the $2^k$ codewords form a k-dimensional subspace of the vector space of all n-tuples over the field F. The Hamming weight of a codeword is the number of non-zero elements in the codeword, and the Hamming distance between two codewords is the number of elements in which the two codewords differ. For example, consider the following two codewords a and b, assuming elements from the binary field:

$$a = (1\ 0\ 0\ 1\ 1)$$

$$b = (1\ 0\ 0\ 0\ 1)$$

The codeword a has a Hamming weight of 3, the codeword b has a Hamming weight of 2, and the Hamming distance between codewords a and b is 1, since codewords a and b differ only in the fourth element. Linear block codes are often designated by a three-element tuple [n, k, d], where n is the codeword length, k is the message length, or, equivalently, the base-2 logarithm of the number of codewords, and d is the minimum Hamming distance between different codewords, equal to the minimal-Hamming-weight, non-zero codeword in the code.

The encoding of data for transmission, storage, and retrieval, and subsequent decoding of the encoded data, can be notationally described as follows, when no errors arise during the transmission, storage, and retrieval of the data:

$$\mu \rightarrow c(s) \rightarrow c(r) \rightarrow \mu$$

where c(s) is the encoded message prior to transmission, and c(r) is the initially retrieved or received, message. Thus, an initial message $\mu$ is encoded to produce encoded message c(s) which is then transmitted, stored, or transmitted and stored, and is then subsequently retrieved or received as initially received message c(r). When not corrupted, the initially received message c(r) is then decoded to produce the original message $\mu$. As indicated above, when no errors arise, the originally encoded message c(s) is equal to the initially received message c(r), and the initially received message c(r) is straightforwardly decoded, without error correction, to the original message $\mu$.

When errors arise during the transmission, storage, or retrieval of an encoded message, message encoding and decoding can be expressed as follows:

$$\mu(s) \rightarrow c(s) \rightarrow c(r) \rightarrow \mu(r)$$

Thus, as stated above, the final message $\mu_r$ may or may not be equal to the initial message $\mu(s)$, depending on the fidelity of the error detection and error correction techniques employed to encode the original message $\mu(s)$ and decode or reconstruct the initially received message c(r) to produce the final received message $\mu(r)$. Error detection is the process of determining that:

$$c(r) \neq c(s)$$

while error correction is a process that reconstructs the initial, encoded message from a corrupted initially received message:

$$c(r) \rightarrow c(s)$$

The encoding process is a process by which messages, symbolized as $\mu$, are transformed into encoded messages c. Alternatively, a message $\mu$ can be considered to be a word comprising an ordered set of symbols from the alphabet consisting of elements of F, and the encoded messages c can be considered to be a codeword also comprising an ordered set of symbols from the alphabet of elements of F. A word $\mu$ can be any ordered combination of k symbols selected from the elements of F, while a codeword c is defined as an ordered sequence of n symbols selected from elements of F via the encoding process:

$$\{c:\mu \rightarrow c\}$$

Linear block encoding techniques encode words of length k by considering the word $\mu$ to be a vector in a k-dimensional vector space, and multiplying the vector $\mu$ by a generator matrix, as follows:

$$c = \mu \cdot G$$

Notationally expanding the symbols in the above equation produces either of the following alternative expressions:

$$(c_0, c_1, \ldots, c_{n-1}) = (\mu_0, \mu_1, \ldots, \mu_{k-1}) \begin{pmatrix} g_{00} & g_{01} & g_{02} & \cdots & g_{0,n-1} \\ \vdots & & \ddots & & \vdots \\ g_{k-1,0} & g_{k-1,1} & g_{k-1,2} & \cdots & g_{k-1,n-1} \end{pmatrix}$$

$$(c_0, c_1, \ldots, c_{n-1}) = (\mu_0, \mu_1, \ldots, \mu_{k-1}) \begin{pmatrix} g_0 \\ g_1 \\ \vdots \\ g_{k-1} \end{pmatrix}$$

where $g_i = (g_{i,0}, g_{i,1}, g_{i,2} \ldots g_{i,n-1})$.

The generator matrix G for a linear block code can have the form:

$$G_{k,n} = \begin{pmatrix} p_{0,0} & p_{0,1} & \cdots & p_{0,r-1} & 1 & 0 & 0 & \cdots & 0 \\ p_{1,0} & p_{1,1} & \cdots & p_{1,r-1} & 0 & 1 & 0 & \cdots & 0 \\ \cdot & \cdot & \cdots & & & 0 & 0 & 1 & \cdots & 0 \\ \cdot & \cdot & \cdots & & & & & \cdots & \cdot \\ \cdot & \cdot & \cdots & & & & & \cdots & \cdot \\ p_{k-1,0} & p_{k-1,1} & \cdots & p_{k-1,r-1} & 0 & 0 & 0 & \cdots & 1 \end{pmatrix}$$

or, alternatively:

$$G_{k,n} = [P_{k,r} | I_{k,k}].$$

Thus, the generator matrix G can be placed into a form of a matrix P augmented with a k by k identity matrix $I_{k,k}$. A code generated by a generator in this form is referred to as a "systematic code." When this generator matrix is applied to a word $\mu$, the resulting codeword c has the form:

$$c = (c_0, c_1, \ldots, c_{r-1}, \mu_0, \mu_1, \ldots, \mu_{k-1})$$

where $c_i = \mu_0 p_{0,i} + \mu_1 p_{1,i}, \ldots, \mu_{k-1} p_{k-1,i})$.

Note that, in this discussion, a convention is employed in which the check symbols precede the message symbols. An alternate convention, in which the check symbols follow the message symbols, may also be used, with the parity-check and identity submatrices within the generator matrix interposed to generate codewords conforming to the alternate convention. Thus, in a systematic linear block code, the codewords comprise r parity-check symbols $c_i$ followed by the symbols comprising the original word $\mu$. When no errors arise, the original word, or message $\mu$, occurs in clear-text form within, and is easily extracted from, the corresponding codeword. The parity-check symbols turn out to be linear combinations of the symbols of the original message, or word $\mu$.

One form of a second, useful matrix is the parity-check matrix $H_{r,n}$, defined as:

$$H_{r,n} = [I_{r,r} | -P^T]$$

or, equivalently, $$H_{r,n} = \begin{pmatrix} 1 & 0 & 0 & \cdots & 0 & -p_{0,0} & -p_{1,0} & -p_{2,0} & \cdots & -p_{k-1,0} \\ 0 & 1 & 0 & \cdots & 0 & -p_{0,1} & -p_{1,1} & -p_{2,1} & \cdots & -p_{k-1,1} \\ 0 & 0 & 1 & \cdots & 0 & -p_{0,2} & -p_{1,2} & -p_{2,2} & \cdots & -p_{k-1,2} \\ \cdot & \cdot & \cdot & \cdots & \cdot & \cdot & \cdot & \cdot & \cdots & \cdot \\ 0 & 0 & 0 & \cdots & 1 & -p_{0,r-1} & -p_{1,r-1} & -p_{0,r-1} & \cdots & -p_{k-1,r-1} \end{pmatrix}.$$

The parity-check matrix can be used for systematic error detection and error correction. Error detection and correction involves computing a syndrome S from an initially received or retrieved message c(r) as follows:

$$S = (s_0, s_1, \ldots, s_{r-1}) = c(r) \cdot H^T$$

where $H^T$ is the transpose of the parity-check matrix $H_{r,n}$ expressed as:

$$H^T = \begin{pmatrix} 1 & 0 & 0 & \cdots & 0 \\ 0 & 1 & 0 & \cdots & 0 \\ 0 & 0 & 1 & \cdots & 0 \\ \cdot & \cdot & \cdot & \cdots & 1 \\ -p_{0,0} & -p_{0,1} & -p_{0,2} & \cdots & -p_{0,r-1} \\ -p_{1,0} & -p_{0,1} & -p_{0,2} & \cdots & -p_{0,r-1} \\ -p_{2,0} & -p_{0,1} & -p_{0,2} & \cdots & -p_{0,r-1} \\ \cdot & \cdot & \cdot & \cdots & \cdot \\ -p_{k-1,0} & -p_{k-1,1} & -p_{k-1,2} & \cdots & -p_{k-1,r-1} \end{pmatrix}.$$

Note that, when a binary field is employed, $x = -x$, so the minus signs shown above in $H^T$ are generally not shown.

Hamming codes are linear codes created for error-correction purposes. For any positive integer m greater than or equal to 3, there exists a Hamming code having a codeword length n, a message length k, number of parity-check symbols r, and minimum Hamming distance $d_{min}$ as follows:

$$n = 2^m - 1$$

$$k = 2 - m - 1$$

$$r = n - k = m$$

$$d_{min} = 3$$

The parity-check matrix H for a Hamming Code can be expressed as:

$$H = [I_m | Q]$$

where $I_m$ is an m×m identity matrix and the submatrix Q comprises all $2^m - m - 1$ distinct columns which are m-tuples each having 2 or more non-zero elements. For example, for m=3, a parity-check matrix for a [7,4,3] linear block Hamming code is $$H = \begin{pmatrix} 1 & 0 & 0 & 0 & 1 & 1 & 1 \\ 0 & 1 & 0 & 1 & 1 & 1 & 0 \\ 0 & 0 & 1 & 1 & 0 & 1 & 1 \end{pmatrix}$$

A generator matrix for a Hamming code is given by:

$G = [Q^T I_{2^m-m-1}]$ where $Q^T$ is the transpose of the submartix Q, and $I_{2^m-m-1}$ is a $(2^m-m-1) \times (2^m-m-1)$ identity matrix. By systematically deleting l columns from the parity-check matrix H, a parity-check matrix H' for a shortened Hamming code can generally be obtained, with:

$n = 2^m - l - 1$ $k = 2^m - m - l - 1$ $r = n - k = m$ $d_{min} \geq 3$

As will be discussed, below, one embodiment of the present invention involves employing the above-described error-control coding techniques to a very different problem space, in which, rather than generating codewords of length k+r from messages of length k, interconnections between k+r internal signal lines are generated from addresses input into k input signal lines. In other words, one embodiment of the present invention involves applying error-control coding techniques to addresses within an address space of size $2^k$ to generate interconnection mappings between address signal lines and up to $2^k$ signal lines addressed by the $2^k$ addresses.

Other types of codes are employed to increase the Hamming distance between codewords in various applications. Many of these alternative codes do not have the convenient properties of linear block codes, including easy generation using generator matrices, and the transparent, pass-through feature of linear block codes allowing for the encoded value to be directly read from the code word. For linear block codes, a plain-text message transfers directly to a codeword containing, in addition, parity-check symbols or bits. In other types of codes, the plain-text message is not directly readable in a corresponding codeword. In both cases, codewords contain a greater number of symbols or bits than absolutely needed to enumerate all valid messages to be encoded. In the case of linear block codes, the additional symbols or bits are parity-check symbols or bits that supplement the plain-text symbols or bits, while in the other types of codes, valid messages are distributed throughout a vector space of dimension equal to the codeword size. It should be noted that, in the following descriptions of the present invention, the term "supplemental address lines" refers to either parity-check address signal lines, analogous to parity-check symbols or bits in linear block codes, or to the greater-number-than-absolutely-needed address signal lines, analogous to the greater-number-than-needed symbols or bits in these other types of codes. However, these other codes may have different advantages that provide utility in different applications.

Combinatoric codes provide a straightforward approach to increasing the Hamming distance between codewords. To create a combinatoric code (also known as a "constant-weight code" or an "r-hot code"), one may select combinations of r bits having a fixed number of 1's from a total codeword space of n bits to produce $$C_r^n = \frac{n!}{r!(n-r)!}$$

codewords of length n. Of course, one can produce a symmetrical code with an identical number of codewords by choosing combinations of r bits having a fixed number of 0's from a total codeword space of n bits. For example, a combinatoric code including $$C_r^n = \frac{n!}{r!(n-r)!} = 165$$

codewords can be obtained by choosing all possible 11-bit codewords with exactly three bits having the value "1," the codewords provided in the following table:

TABLE 1

| | | | | | |
|---|---|---|---|---|---|
| 11100000000 | 11010000000 | 11001000000 | 11000100000 | 11000010000 | 11000001000 |
| 11000000100 | 11000000010 | 11000000001 | 10110000000 | 10101000000 | 10100100000 |
| 10100010000 | 10100001000 | 10100000100 | 10100000010 | 10100000001 | 10011000000 |
| 10010100000 | 10010010000 | 10010001000 | 10010000100 | 10010000010 | 10010000001 |
| 10001100000 | 10001010000 | 10001001000 | 10001000100 | 10001000010 | 10001000001 |
| 10000110000 | 10000101000 | 10000100100 | 10000100010 | 10000100001 | 10000011000 |
| 10000010100 | 10000010010 | 10000010001 | 10000001100 | 10000001010 | 10000001001 |
| 10000000110 | 10000000101 | 10000000011 | 01110000000 | 01101000000 | 01100100000 |
| 01100010000 | 01100001000 | 01100000100 | 01100000010 | 01100000001 | 01011000000 |
| 01010100000 | 01010010000 | 01010001000 | 01010000100 | 01010000010 | 01010000001 |
| 01001100000 | 01001010000 | 01001001000 | 01001000100 | 01001000010 | 01001000001 |
| 01000110000 | 01000101000 | 01000100100 | 01000100010 | 01000100001 | 01000011000 |
| 01000010100 | 01000010010 | 01000010001 | 01000001100 | 01000001010 | 01000001001 |
| 01000000110 | 01000000101 | 01000000011 | 00111000000 | 00110100000 | 00110010000 |
| 00110001000 | 00110000100 | 00110000010 | 00110000001 | 00101100000 | 00101010000 |
| 00101001000 | 00101000100 | 00101000010 | 00101000001 | 00100110000 | 00100101000 |
| 00100100100 | 00100100010 | 00100100001 | 00100011000 | 00100010100 | 00100010010 |
| 00100010001 | 00100001100 | 00100001010 | 00100001001 | 00100000110 | 00100000101 |
| 00100000011 | 00011100000 | 00011010000 | 00011001000 | 00011000100 | 00011000010 |
| 00011000001 | 00010110000 | 00010101000 | 00010100100 | 00010100010 | 00010100001 |
| 00010011000 | 00010010100 | 00010010010 | 00010010001 | 00010001100 | 00010001010 |
| 00010001001 | 00010000110 | 00010000101 | 00010000011 | 00001110000 | 00001101000 |
| 00001100100 | 00001100010 | 00001100001 | 00001011000 | 00001010100 | 00001010010 |

TABLE 1-continued

| | | | | | |
|---|---|---|---|---|---|
| 00001010001 | 00001001100 | 00001001010 | 00001001001 | 00001000110 | 00001000101 |
| 00001000011 | 00000111000 | 00000110100 | 00000110010 | 00000110001 | 00000101100 |
| 00000101010 | 00000101001 | 00000100110 | 00000100101 | 00000100011 | 00000011100 |
| 00000011010 | 00000011001 | 00000010110 | 00000010101 | 00000010011 | 00000001110 |
| 00000001101 | 00000001011 | 00000000111 | | | |

It is somewhat more complex to encode messages into combinatoric codes, but the logic to do so may be straightforwardly constructed at the logic-circuit level. Combinatoric codes have a guaranteed minimum Hamming distance of 2, and may have significantly better average Hamming distance separations between codewords.

For example, in the above $$\binom{11}{3}$$

code, the average Hamming distance between codewords is 4.39. Combinatoric codes also have an advantage in producing total signal distinguishability within relatively narrow ranges, since these codes have constant weights, where the weight is defined as the number of bits having the value "1."

Another, similar type of code, referred to as a "random" code, is obtained by choosing random codewords of fixed length. For example, one can choose a fixed-length, binary, n-bit codeword size, and select a sufficient number of random n-bit binary numbers in order to obtain a desired number of binary codewords $2^k$, where n>Ak. The greater the value of A, the greater the expected minimum Hamming distance between the codewords. When creating random codes, distance checking can be carried out to reject new codewords that have a Hamming distance less than a minimum value with respect to those codewords already selected, and random codewords having approximately equal numbers of "1" and "0" bits can be used in order to obtain an increased average Hamming distance and increased expected minimum Hamming distance.

Yet another type of code that may be employed in the methods and systems of the present invention is a random linear code. In a random linear code, the generator matrix is randomly generated, under linearity constraints, rather than generated as the combination of a parity-check matrix generated from linear sums of information elements that represent parity-check sums, and an identity matrix. A random linear block code is generally not systematic, but linear.

In general, codes that may be employed in the methods and systems of the present invention may be systematic and linear, systematic and non-linear, non-systematic and linear, or non-systematic and non-linear. For example, if C is a code, and u is an arbitrary n-vector, then the coset C'=u+C={u+c:c ∈C} is another code with the same distance properties, and hence with the same error correction and defect tolerance capabilities. If C is linear, and u is non-zero, then C' is non-linear, technically, an affine space. Certain embodiments, discussed below, employ systematic non-linear codes (see, for example, FIGS. 11-12), while others employ systematic linear block codes (see, for example, FIGS. 26A-B). The random codes are generally neither systematic nor linear. Although linear block codes have properties that are attractive in the applications to be discussed below, linear codes, systematic codes, and non-linear, non-systematic codes may also be employed in various embodiments of the present invention.

A Nanoscale Electronic Memory Device

In the current subsection, a combined nanoscale/microscale electronic memory device is discussed. The present invention is not limited in applicability to nanoscale/microscale electronic memory devices, or even to nanoscale/microscale electronic devices, but may also find application in purely nanoscale interconnection interfaces and other nanoscale devices, and may also find application in sub-microscale electronic devices, interconnection interfaces, and memories. In the described embodiment, single nanowires are uniquely addressed by addresses transmitted to intersecting microscale address signal lines. In other circuits, subsets of nanowires may be addressed, rather than single nanowires, by a single address. The present invention is related to general addressing of components within a circuit, and not limited to uniquely addressing single components or signal lines, nor limited to components or signal lines of particular sizes.

FIG. 1 shows a high-level diagram of a combined nanoscale/microscale electronic memory device. The combined nanoscale/microscale electronic memory device 100 interfaces to an external electronic environment through reference voltage signal lines 102 and through two sets of address signal lines 104 and 106. The memory elements within the combined nanoscale/microscale electronic memory device 100 can logically be considered to compose a two-dimensional array, with each memory element specified by a pair of coordinates (x,y), where the x coordinate specifies the row of the two-dimensional array inhabited by the memory element and the y coordinate specifies the column of the two-dimensional array inhabited by the memory element. The set of address signal lines 106 may be used to specify one of $2^p$ two-dimensional memory-element-array rows, where p is the number of address signal lines in the set of address signal lines 106, and the set of address signal lines 104 specifies one of $2^q$ columns in the logical, two-dimensional array of memory elements, where q is the number of address signal lines in the set of address signal lines 104. Although the dimensions p and q of the two-dimensional array of memory elements need not be equal, in the following discussion, both dimensions will be assumed to be equal to p, in the interest of notational brevity.

The external sets of address signal lines 104 and 106 are electronically used within the electronic memory device 100 to select a column and row of nanowire-crossbar memory-element subarrays, and therefore a particular nanowire-crossbar memory-element subarray, and to select a particular row or column within a selected nanowire-crossbar array. For example, in one configuration, the upper three address signal lines 108 of the set of address signal lines 106 may specify one of seven horizontal rows 110-116 of nanowire-crossbar subarrays, and the upper three address signal lines 118 of the set of address signal lines 104 may specify one of six vertical columns 120-125 of nanowire crossbar memory-element subarrays. The lower three address signal lines 126 in the set of address signal lines 106 specify a particular row of nanoscale memory elements within a selected nanowire-crossbar memory-element subarray, and the lower three address signal lines 128 in the set of address signal lines 104 specifies a particular column of nanoscale memory elements within a selected nanowire-crossbar memory-element sub-array. Note that, in general, a larger number of input address signal lines would be employed to address a larger number of columns and rows of nanowire-crossbar memory-element subarrays than shown in FIG. 1, as well as a larger number of nanoscale-memory-element rows and columns within each nanowire-crossbar memory-element subarray. The small number of input address lines shown in FIG. 1 is chosen for illustration convenience only.

Each row and column of nanowire-crossbar memory-element subarrays is accessed through an encoder 130-142. The encoder receives, in FIG. 1, the high-order three input address signal lines and outputs a larger number of coded address signal lines. For example, encoder 137 receives three address signal lines 144 directly interconnected with the high-order input address signal lines 128, and outputs five coded address signal lines 146. The address signal lines output by an encoder pass through all of the nanowire-crossbar memory-element subarrays within the column or row accessed via the encoder. For example, the five coded address signal lines 146 output by the encoder 137 pass through nanowire-crossbar memory-element subarrays 150-156. Each nanowire-crossbar memory-element subarray is also connected to two reference voltage signal lines. For example, nanowire-crossbar memory-element subarray 150 is connected to the reference voltage through reference-voltage signal lines 158 and 160.

The input address signal lines may be microscale address signal lines, or may have even larger dimensions. The coded address signal lines are generally microelectronic or submicroelectronic signal lines produced by currently available photolithographic techniques. The nanowire-crossbar memory-element subarrays, by contrast, are composed of nanoscale wires, or nanowires. Nanowires have cross-sectional diameters of less than 100 nanometers, while submicroelectronic signal lines have cross-sectional diameters of greater than 100 nanometers. Therefore, there are two nanoscale interconnection interfaces within each nanowire-crossbar memory-element subarray. In general, the circuitry within the encoders 130-142 is significantly more complex than the circuitry within the nanowire-crossbar memory-element subarrays. However, each encoder provides access to an entire row or column of nanowire-crossbar memory-element subarrays, thus amortizing the complexity of the encoders over an often large number of nanowire-crossbar memory-element subarrays. As is discussed below, in great detail, defect and fault-tolerant nanoscale interconnection interfaces are facilitated by the supplemental address signal lines output by each encoder.

Figure 2:
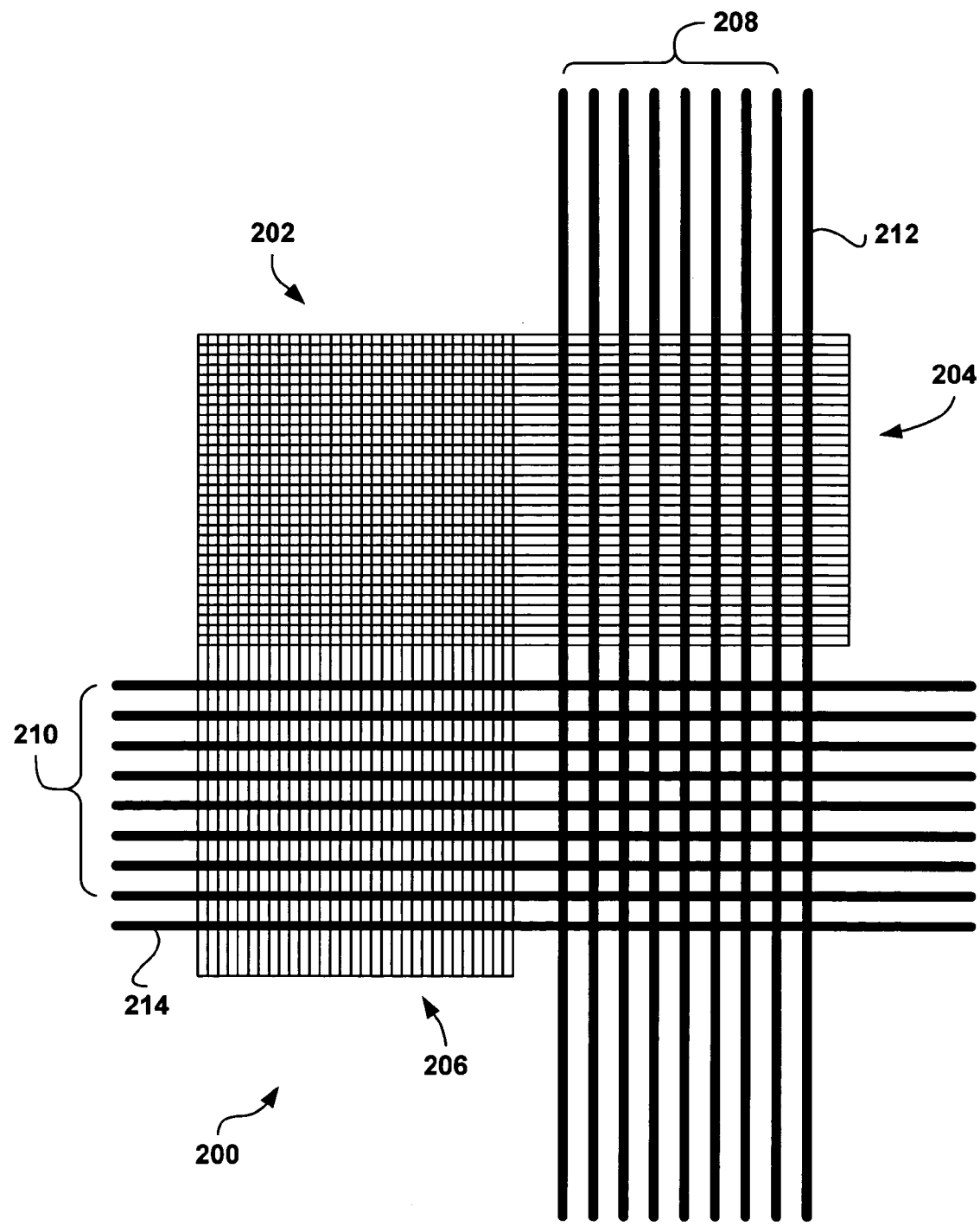
FIG. 2 shows an abstract representation of a nanowire-crossbar memory-element subarray within a combined nanoscale/microscale electronic memory device.

FIG. 2 shows an abstract representation of a nanowire-crossbar memory-element subarray within a combined nanoscale/microscale electronic memory device. The nanowire-crossbar memory-element subarray 200 is composed of a nanowire crossbar 202 with a similarly sized region 204 of horizontally extending nanowires and a similarly sized region 206 of vertically extending nanowires. A vertical column 208 of microelectronic coded address signal lines passes over the region of horizontally extending nanowires 204, with selective rectifying connections, or nanoscale, molecular-junction diode connections, interconnecting microelectronic internal signal lines with particular horizontal extending nanowires. In alternative embodiments, resistive ohmic connections, semi-conductor gate connections, or other types of physical methods at nanowire junctions that determine the signals on the nanowires 204 may be employed. Similarly, a horizontal set 210 of microelectronic coded address signal lines passes over the region 206 of vertically extending nanowires, with the horizontal microelectronic address signal lines selectively interconnected via rectifying connections, or molecular diodes, to selected vertically extending nanowires. Note that each horizontally and vertically extended nanowire is also connected, through a resistive connection, to a vertical reference-voltage signal line 212 and a horizontal reference-voltage signal line 214, respectively. Each unique pattern of ON and OFF voltages, or, equivalently, HIGH and LOW voltages, on the set of vertical internal microelectronic address signal lines 208 uniquely addresses a particular, horizontally extending nanowire, and places that selected nanowire at a significantly different voltage than the remaining horizontally extending nanowires. Similarly, each different pattern of ON and OFF voltages on the set 210 of horizontal internal microelectronic address signal lines selects a unique vertically extending nanowire, and places that selected vertically extending nanowire at a significantly different voltage than the remaining vertically extending nanowires. The selected horizontally extending nanowire and the selected vertically extending nanowire are interconnected at a single crossover point within the nanowire crossbar, and the molecular junction at that crossover point is placed at a different voltage level than all other molecular junctions within the nanowire crossbar via the pattern of ON and OFF voltages present on the set of vertical and horizontal internal microelectronic signal lines 208 and 210.

Figure 3A:
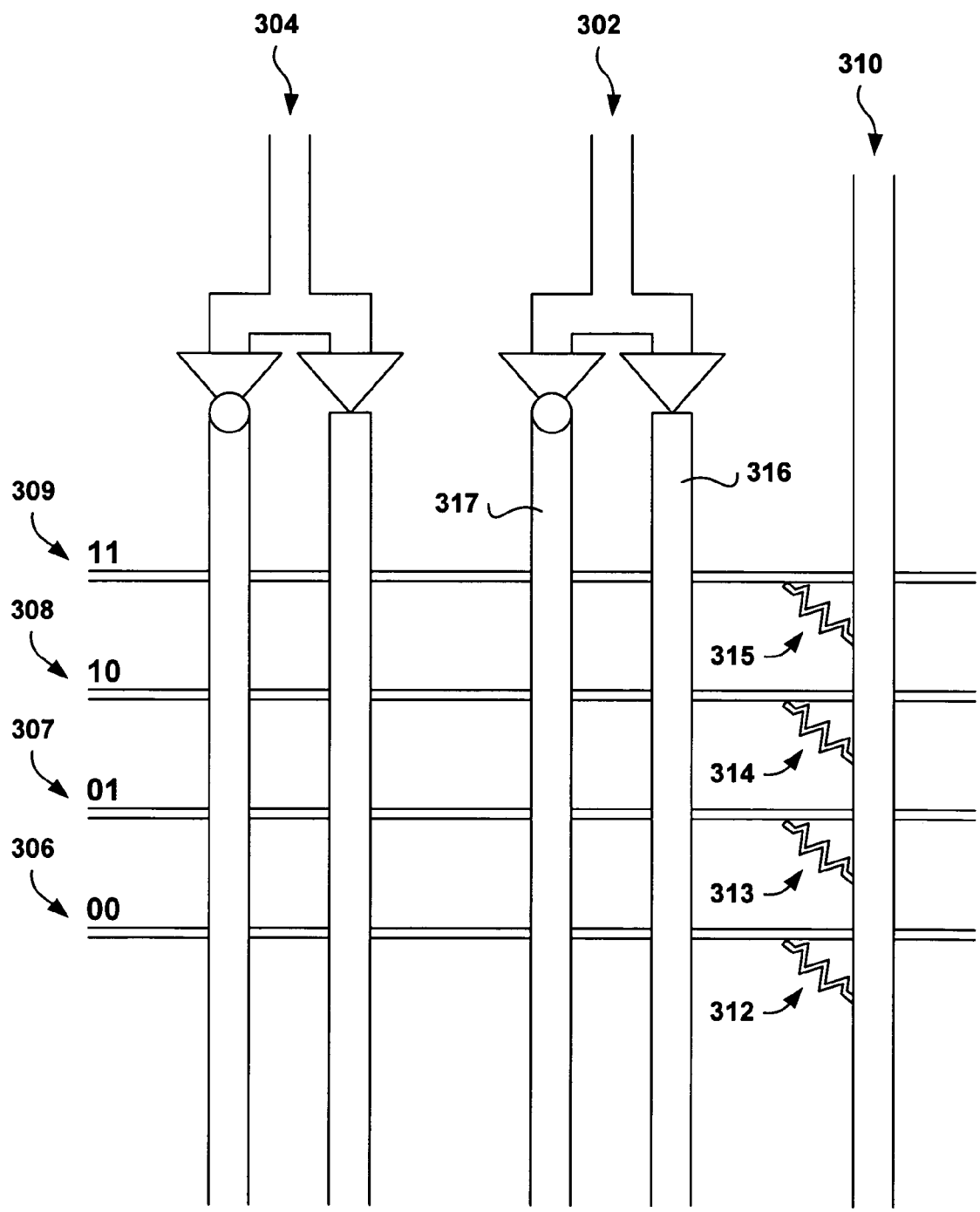
FIGS. 3A-B shows a simple nanoscale-to-microscale interface within a combined nanoscale/microscale electronic memory device.
Figure 3B:
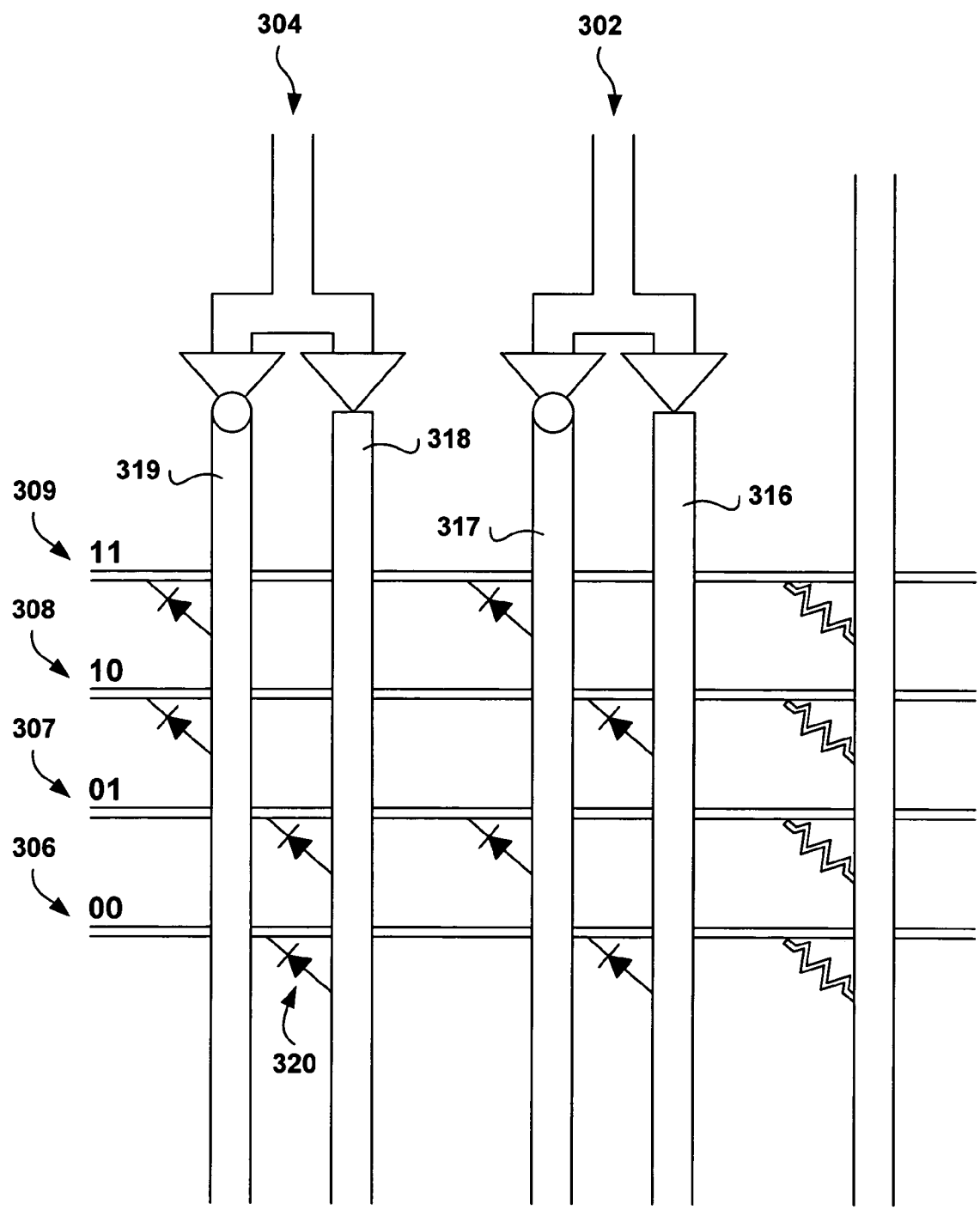

FIG. 3A shows a simple nanoscale-to-microscale interface within a combined nanoscale/microscale electronic memory device. In the simple interface shown in FIG. 3A, two internal microelectronic signal lines 302 and 304 pass over and selectively interconnect with four nanowires 306-309. Each nanowire 306-309 is interconnected to a reference-voltage microelectronic signal line 310 via a resistive interconnection 312-315, respectively. Note that each nanowire has been assigned a two-bit address. Nanowire 306 has the address "00," nanowire 307 has the address "01," nanowire 308 has the address "10," and nanowire 309 has the address "11." Note also that each internal microelectronic signal line 302 and 304 is split into a complementary pair. Thus, for example, internal microelectronic address signal line 302 passes over the nanowires as a pair of microelectronic signal lines 316-317, with the right-hand microelectronic signal line 316 of the pair having the same voltage as the internal microelectronic signal line 302, and the left-hand microelectronic signal line 317 of the pair having a voltage complementary to that of the internal microelectronic address signal line 302. Note that the coded address signal lines are not necessarily split into complementary pairs at each nanowire-crossbar memory-element subarray, but may be split once and pass through an entire row or column of nanowire-crossbar memory-element subarrays. FIG. 3B shows the selective rectifying crosspoint connections between the complementary-pair, microelectronic address signal lines 316-317 and 318-319 and the four nanowires 306-309. In FIG. 3B, each rectifying connection is indicated by a diagonally directed diode symbol, such as diagonally directed diode symbol 320. Those crosspoints, or intersections, without diagonally directed diode schematics are not electrically interconnected.

It should be noted that the term "coded signal line" refers, in this document, to either a single coded signal line or to a complementary pair of signal lines. In the following descriptions, various formulas and expressions are provided that are related to the number of coded signal lines in particular implementations or used in particular techniques. If, for example, a formula or expression refers to n coded signal lines, then n refers to the number of independent signal lines or to the number of independent, complementary pairs of signal lines. In certain implementations, single, independent coded signal lines may be employed. In other implementations, including the implementations discussed in this document, complementary pairs of signal are employed.

Figure 4A:
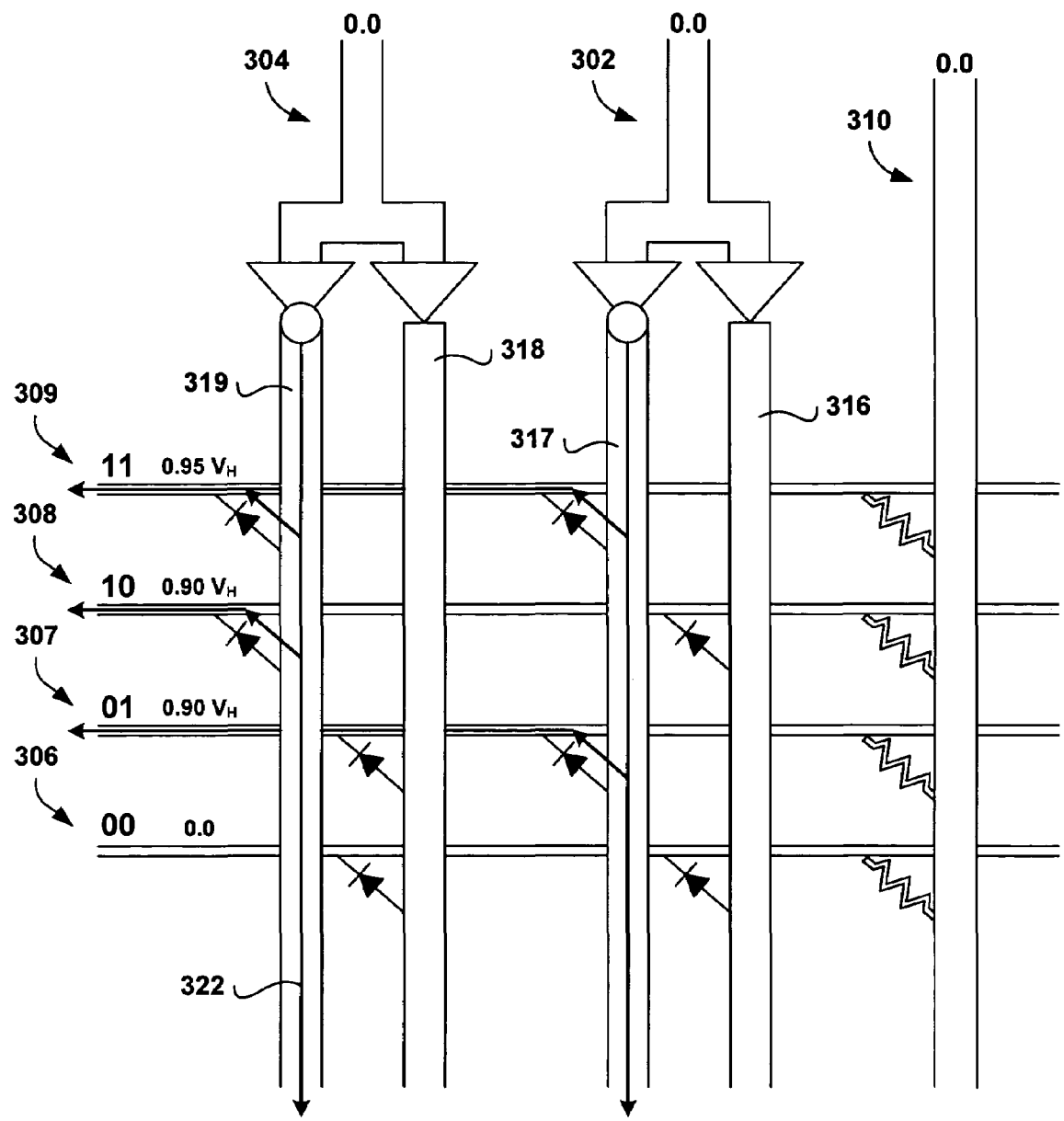
FIGS. 4A-D illustrate voltages on the horizontal nanowires resulting from four possible signal patterns input to the internal microelectronic address signal lines in the nanoscale interconnection interface illustrated in FIGS. 3A-B.

FIGS. 4A-D illustrate voltages on the horizontal nanowires resulting from four possible signal patterns input to the internal microelectronic address signal lines in the nanoscale interconnection interface illustrated in FIGS. 3A-B. The voltage V for a nanowire can be computed from the following formula:

$$\frac{V - V_S}{R_S} + \frac{V - V_A}{R_A} + \frac{V - V_B}{R_B} = 0$$

where $V_A$ and $V_B$ are the voltages of the relatively high-voltage-signal-carrying internal address lines, at a given point in time, connected to the nanowires of interest, e.g. internal address signal lines 317 and 319 for nanowire 309 at the point in time illustrated in FIG. 4A, $V_S$ is the source voltage, the resistance $R_S$ is the resistance of the resistor interconnecting reference-voltage signal line 310 with the nanowire, and the resistances $R_A$ and $R_B$ are the effective resistances of the forward-biased or reverse biased rectifying connections, depending on the voltages on the connected address signal lines, if the nanowire is interconnected with the internal microelectronic address signal lines. In this example, the relationship between the resistance of the resistor $R_S$, the resistance of a forward-biased rectifying connection $R_F$, and the resistance of reverse-biased rectifying connection $R_R$, are given by the following equation:

$$R_R = 10 R_S = 100 R_F$$

Figure 4B:
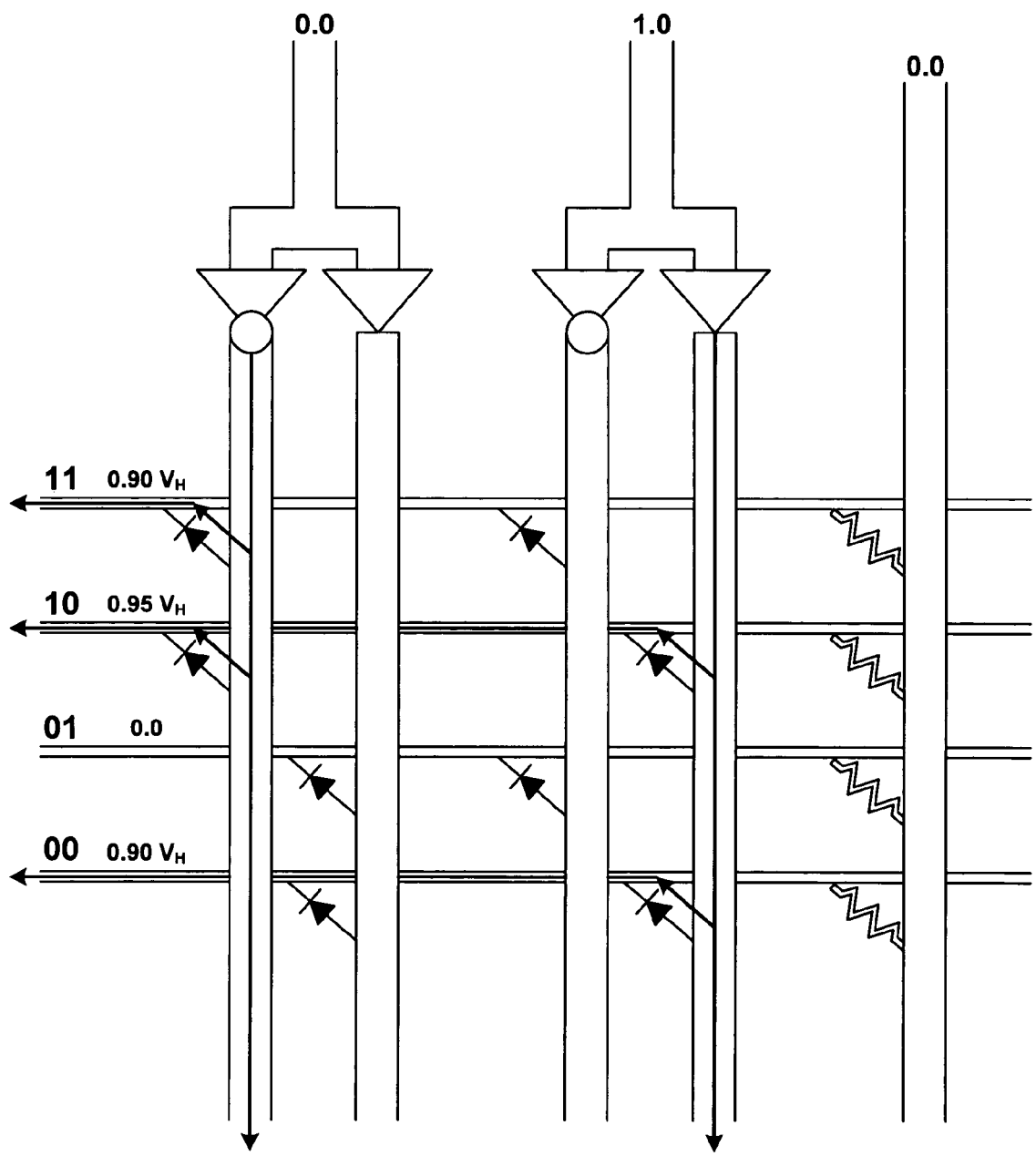
Figure 4C:
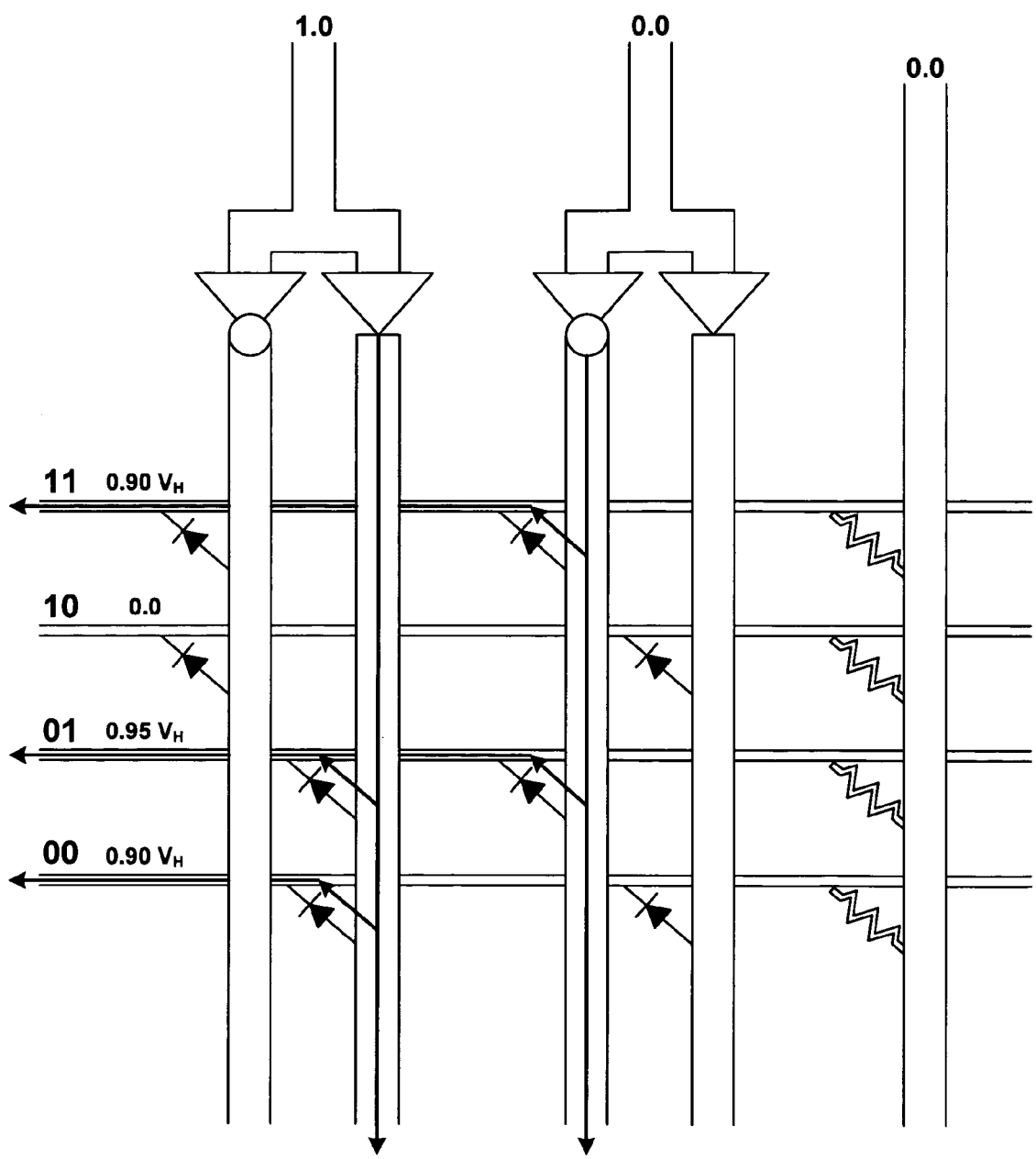
Figure 4D:
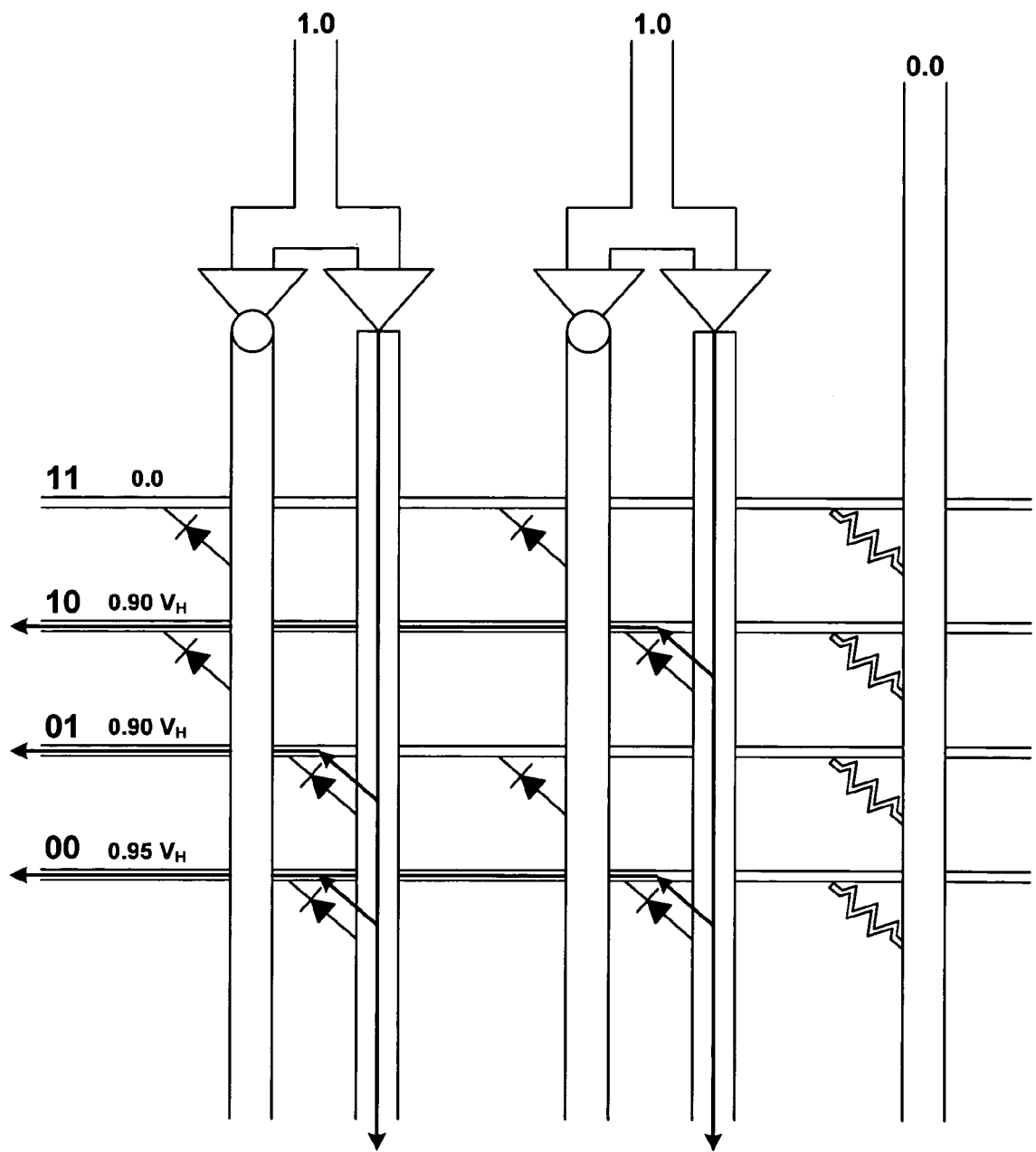

In FIG. 4A, the address-signal-line voltage pattern "00" is input into the internal, microelectronic address signal lines 302 and 304. Thus, the complement microelectronic signal lines 317 and 319 are held at a high voltage $V_H$ while the direct address signal lines of the complementary pairs 316 and 318 are held at essentially 0 volts. The reference-voltage signal line 310 is also held at 0 volts. In FIG. 4A, and in many similar figures to follow, the address signal lines held at high voltage are indicated by arrows, such as arrow 322, drawn within the address signal line. Horizontal nanowire 309 receives high voltage input from both complementary address signal lines 317 and 319, resulting in a voltage of 0.95 $V_H$. Each of the horizontal nanowires 307 and 308 receives a single high voltage input from one of the two complementary address signal lines 317 and 319. Horizontal nanowire 306 receives no high voltage input, and is therefore held at the reference voltage zero by the reference-voltage signal line 310. Thus, the address "00" input to the internal, microelectronic address signal lines 302 and 304 results in selection of nanowire "00" 306 for a low voltage state, and a high voltage state held on the remaining three horizontal nanowires 307-309. FIGS. 4B-4D illustrate the voltage states of the nanowires resulting from input of the remaining three voltage patterns "01," "10," and "11" to the internal microelectronic address signal lines, and demonstrates that a single, unique nanowire labeled with the input address is selected to have a low voltage state in each case. Thus, the interface between the nanowires and the microelectronic address signal lines in the memory-element subarray constitutes a demultiplexer that selects a particular nanowire for each input address. FIG. 5 shows a table indicating voltage states of nanowires resulting from address signals input to microelectronic address signal lines of a nanoscale interconnection interface. In FIG. 5, the nanowire addresses are shown on a vertical axis 502 and the address signals input to the microelectronic address signal lines are shown on a horizontal axis 504. The table clearly reveals that a single nanowire is held at low voltage for each different address, and that the address input to the internal, microelectronic address signal lines is equal to the address assigned to the selected nanowire.

The microscale-to-nanoscale demultiplexer interface discussed above with reference to FIGS. 3A-4D is fabricated with rectifying connections, or molecular diodes, interconnecting the address signal lines with the nanowires. In alternative embodiments, non-rectifying, resistive connections may be employed, with resistances substantially less than the resistance of the resistor interconnecting the nanowires with the reference-voltage signal line. When resistive interconnections are employed, rather than diode interconnections, the voltage differences between the selected, low-voltage nanowire and the remaining nanowires may be significantly less when a similar high voltage $V_H$ is applied to selected address signal lines. Moreover, while the difference in the voltages of the non-selected nanowires in the above example is small, 0.05 volts, the voltage states of the non-selected nanowires in a resistive connection implementation span a much larger range. Particularly in the resistive connection implementation, as the number of nanowires interconnected to the interface increases, problems arise in establishing voltage differences that are easily distinguished from one another and from the low voltage state of the selected nanowire.

Figure 6:
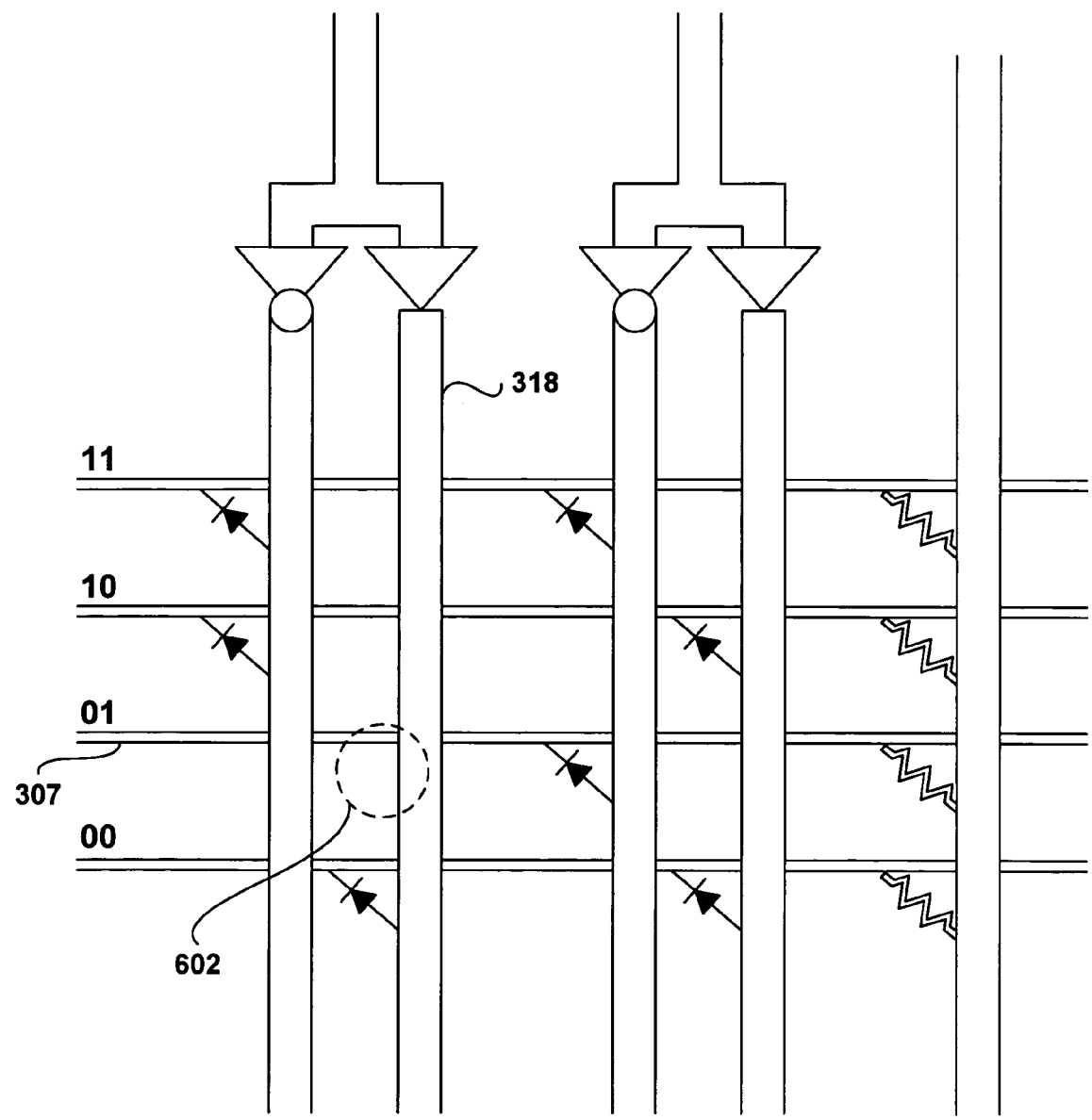
FIG. 6 shows the nanoscale interconnection interface discussed above with reference to FIGS. 3A-4D with a failed rectifying connection.

FIG. 6 shows the nanoscale interconnection interface discussed above with reference to FIG. 3A-4D with a failed rectifying connection. As shown in FIG. 6 by the circular dashed line 602, the rectifying connection interconnecting address signal line 318 with horizontal nanowire 307 is missing, leaving the crosspoint between the address signal line 318 and the nanowire 307 in a permanent open state. As discussed briefly in the background section, the nanoscale interconnections cannot, with current technologies, be as reliably fabricated as can interconnections in microscale electronics fabricated using photolithographic processes. Although it is not possible, presently, to reliably fabricate the selective rectifying connections, it is possible, in general, to fabricate the nanoscale interconnection interface so that failures resulting in permanent open crosspoints occur with much greater frequency than failures that result in a permanent short at a crosspoint. Thus, in the present discussion, defect and fault-tolerant designs and techniques are described with reference to ameliorating the effects of permanent open-type connection failures.

Figure 7A:
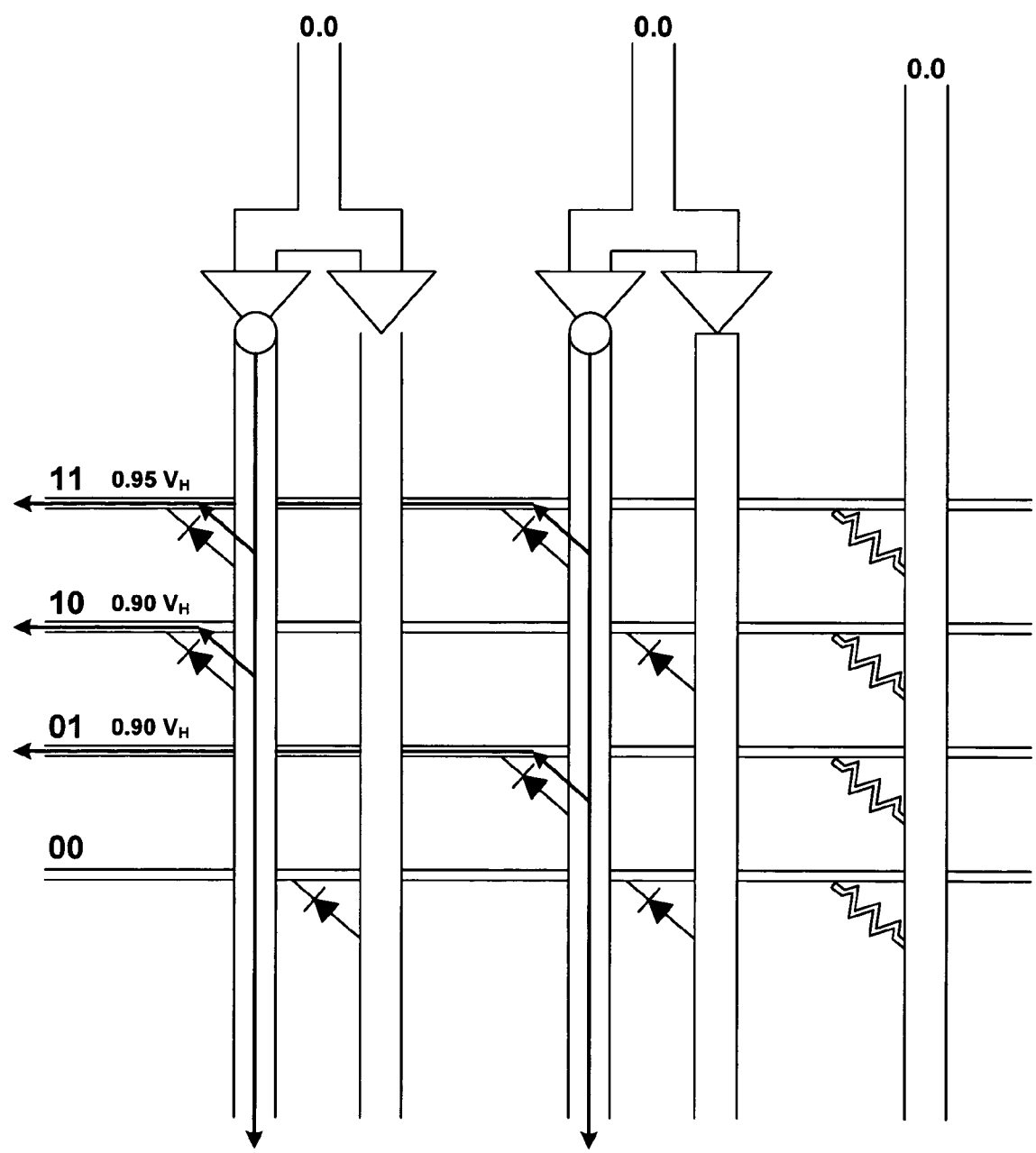
FIGS. 7A-D, using the same illustration conventions of FIGS. 4A-D, illustrate voltage states of nanowires that arise with each different, two-bit signal pattern input to the address signal lines.
Figure 7B:
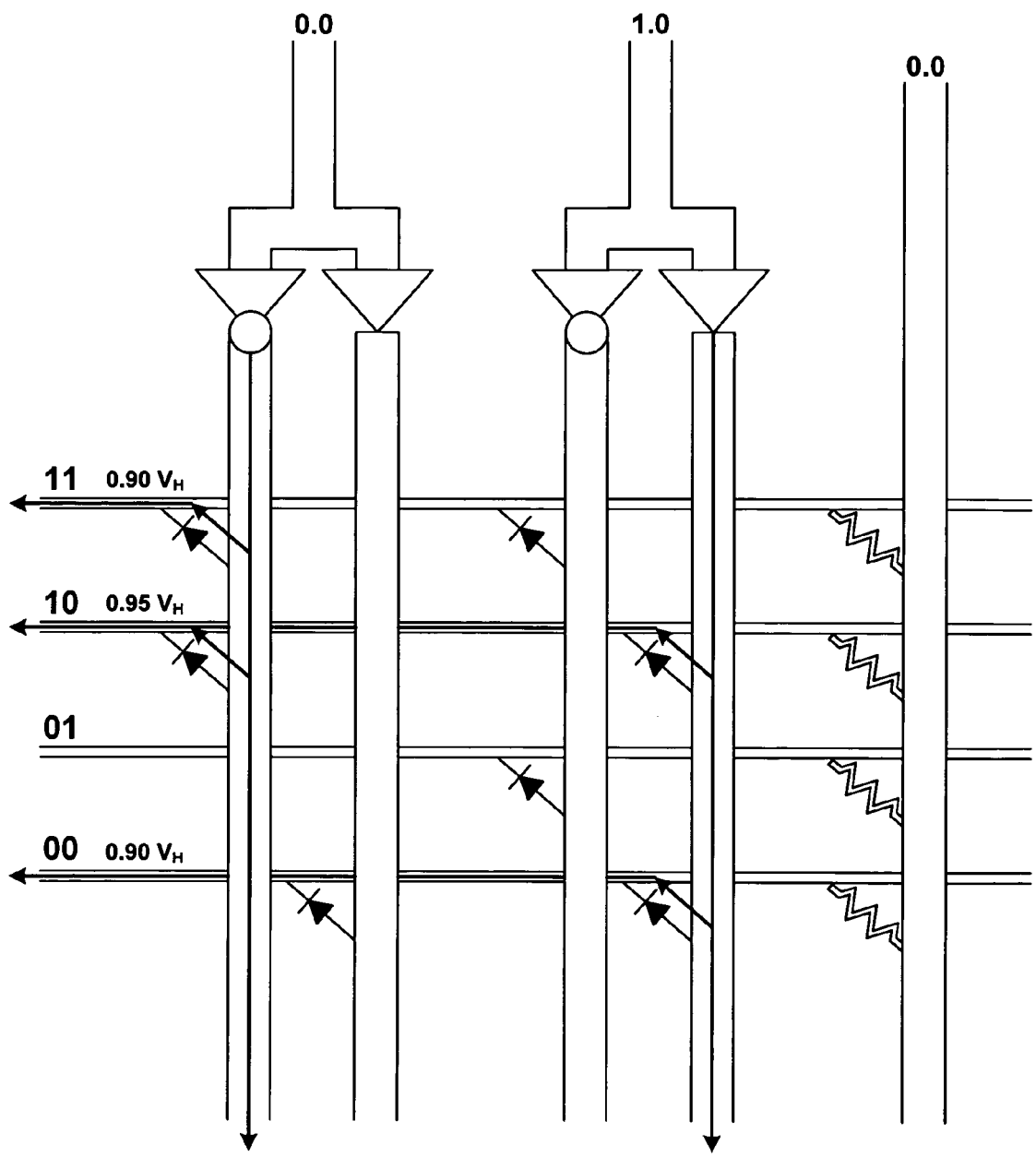
Figure 7C:
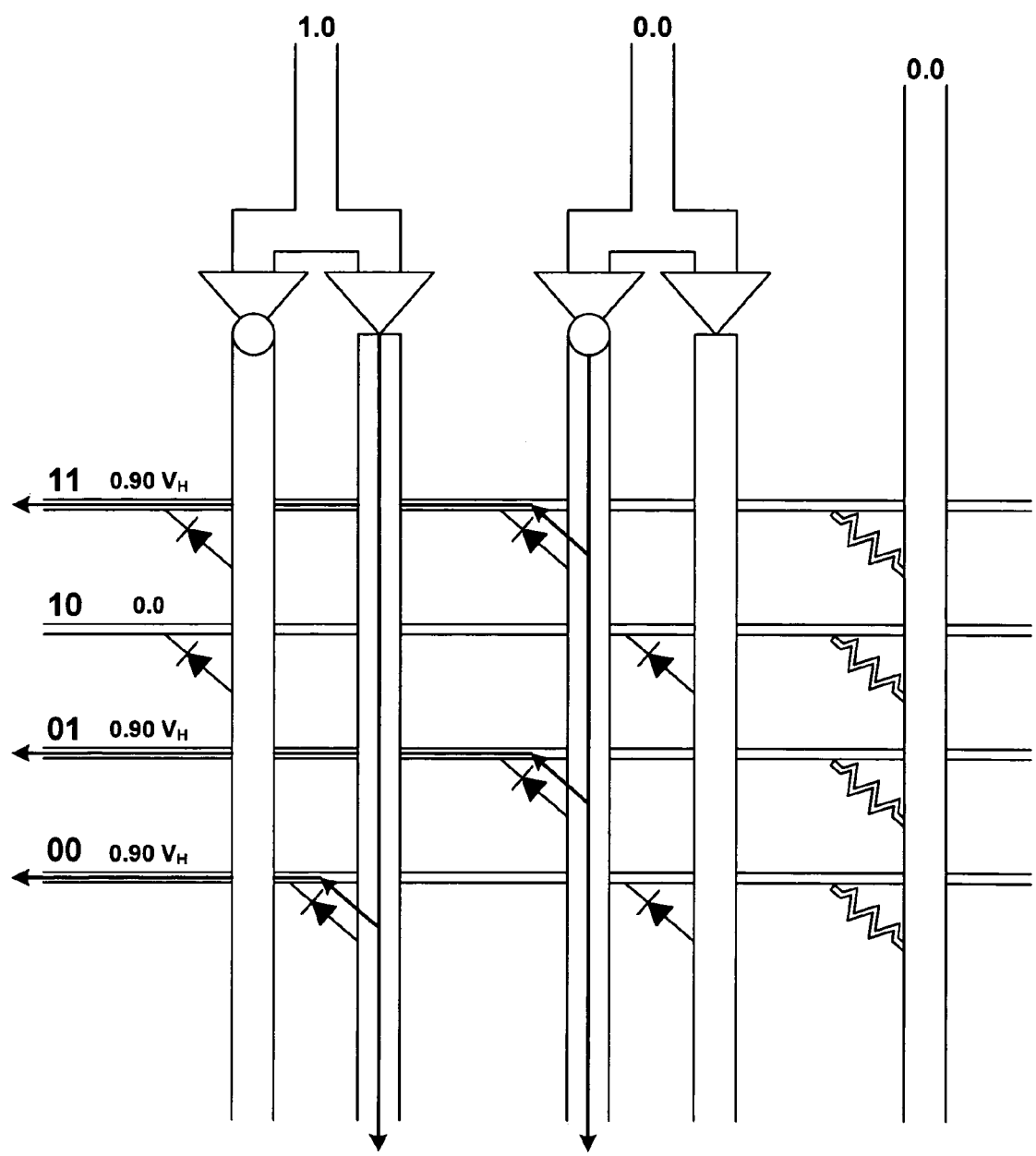
Figure 7D:
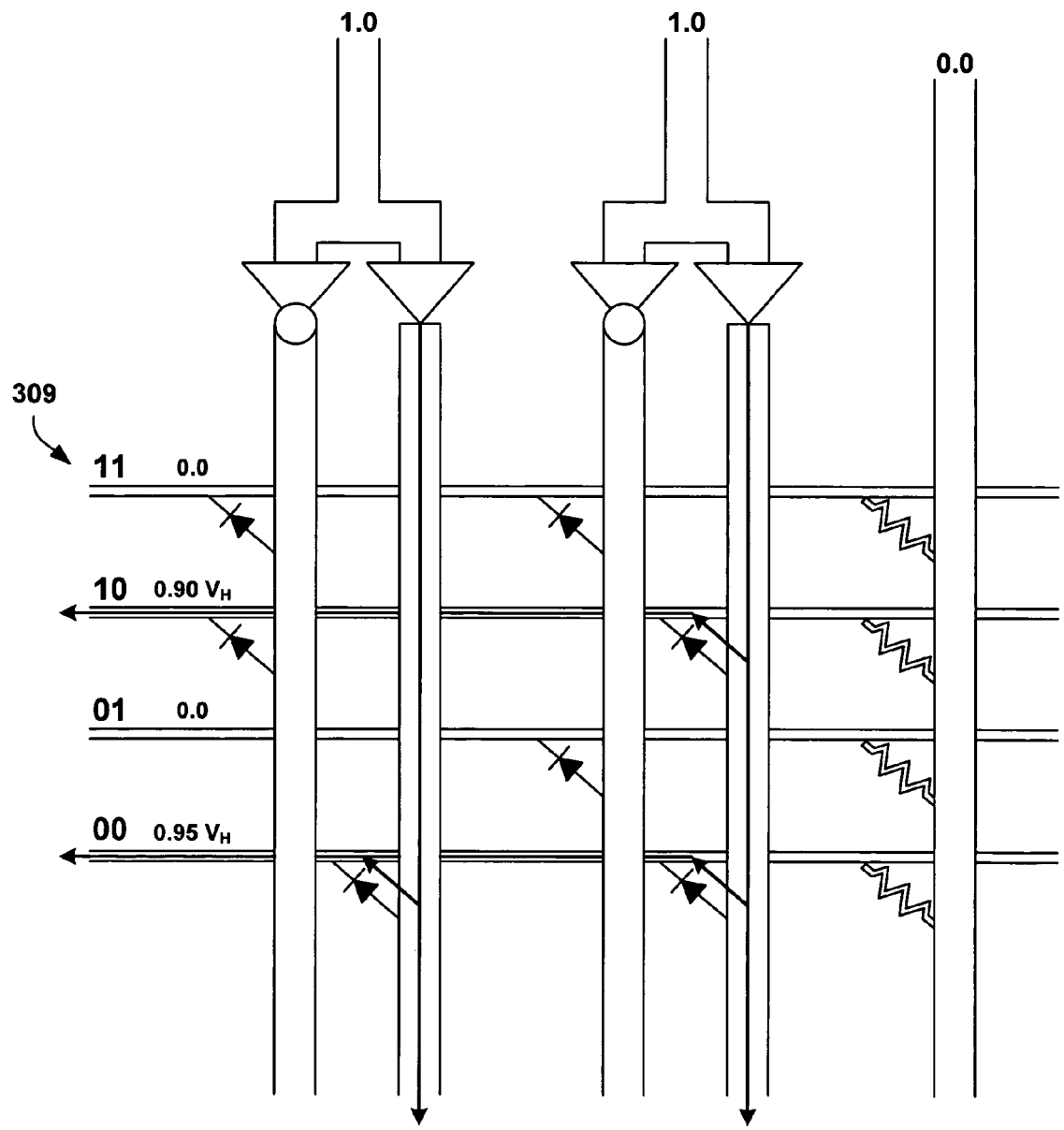

FIGS. 7A-D, using the same illustration conventions of FIGS. 4A-D, illustrate voltage states of nanowires that arise with each different, two-bit signal pattern input to the address signal lines. As can be seen in FIG. 7D, the lack of the rectifying connection (indicated by dashed circle 602 in FIG. 6) results in an inability to uniquely address nanowire "11" 309. FIG. 8 shows a table indicating voltage states of nanowires resulting from address signals input to microelectronic address signal lines of a nanoscale interconnection interface, using the same illustration conventions as used in FIG. 5, for the defective nanoscale interconnection interface illustrated in FIGS. 6-7D. Comparing FIG. 5, showing the nanowire voltage states for the perfectly manufactured interconnection interface, to FIG. 8, one can immediately appreciate the deleterious effects arising from the missing rectifying connection. First, as discussed above, nanowire "11" 309 cannot be uniquely addressed, as indicated by the two zero voltage states 802 and 804 in the column 806 corresponding to input signal "11." However, an additional effect may be observed. In FIG. 5, there is a descending, right diagonal of 0.95 $V_H$ voltage states, while in FIG. 8, voltage state 808 for nanowire "01" with input signal "10" is now 0.90 $V_H$, rather than 0.95 $V_H$. Thus, not only has the failure of the rectifying connection prevented both nanowires "01" and "11" from being uniquely addressed, the failed rectifying connection has also lowered the cumulative voltage difference between the selected-nanowire, low-voltage state and the high voltage states of the unselected nanowires.

Figure 9:
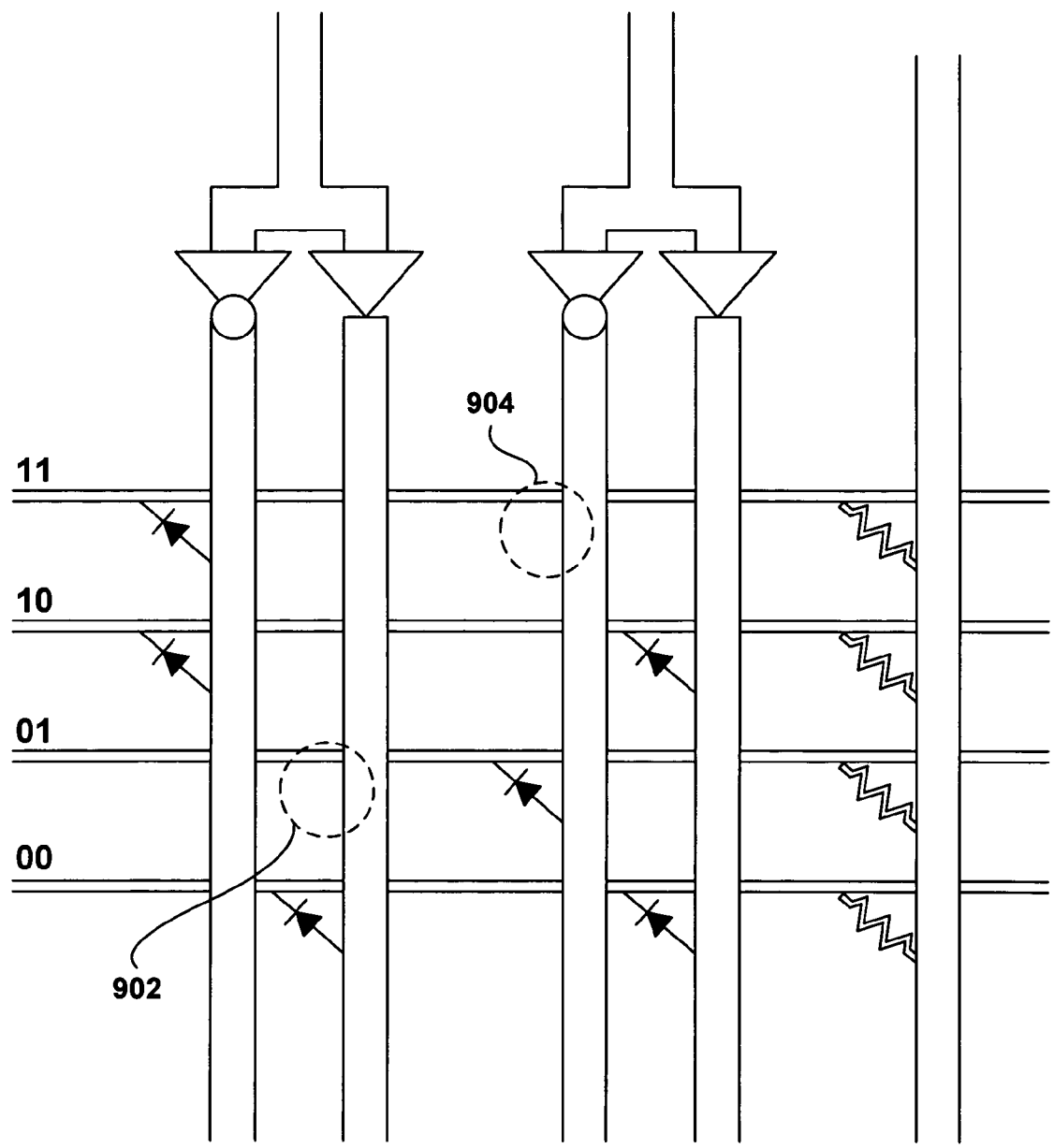
FIG. 9 illustrates a nanoscale interconnection interface in which two rectifying interconnections are defective.

FIG. 9 illustrates a nanoscale interconnection interface in which two rectifying interconnections are defective. The two defective rectifying interconnections are illustrated in FIG. 9 by dashed circles 902 and 904. FIG. 10 shows a table indicating voltage states of nanowires resulting from address signals input to microelectronic address signal lines of a nanoscale interconnection interface, using the same illustration conventions as used in FIGS. 5 and 8, for the defective nanoscale interconnection interface illustrated in FIG. 9. Comparison of FIG. 10 to FIGS. 5 and 8 show that the additional failed rectifying connection (904 in FIG. 9) has further degraded the nanoscale interconnection interface. Now, only nanowire "00" can be uniquely addressed. For example, input of the signal pattern "10" selects both nanowires "10" and "11," as indicated by the zero voltage states shown in cells 1002 and 1004. As another example, nanowire "01" is selected both by address signal pattern "01" and by signal pattern "11," as indicated by the zero voltage states in cells 1006 and 1010. Also, there are now only two maximum voltage states shown in cells 1012 and 1014, rather than four maximum voltage states shown in the rightward descending diagonal in FIG. 5.

Figure 11:
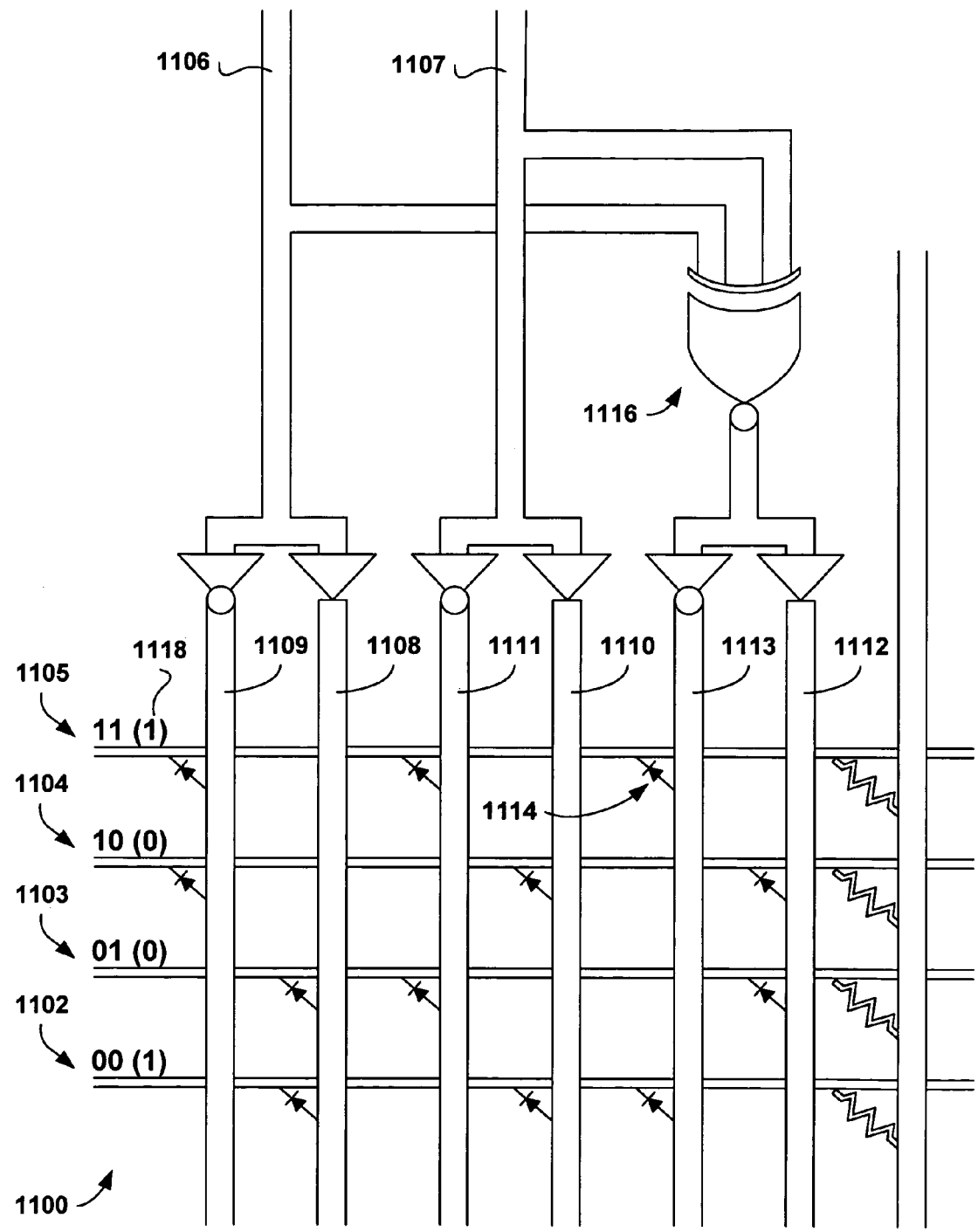
FIG. 11 shows a modified nanoscale interconnection interface, similar to the interconnect interfaces illustrated in FIGS. 3A-4D.
Figure 12A:
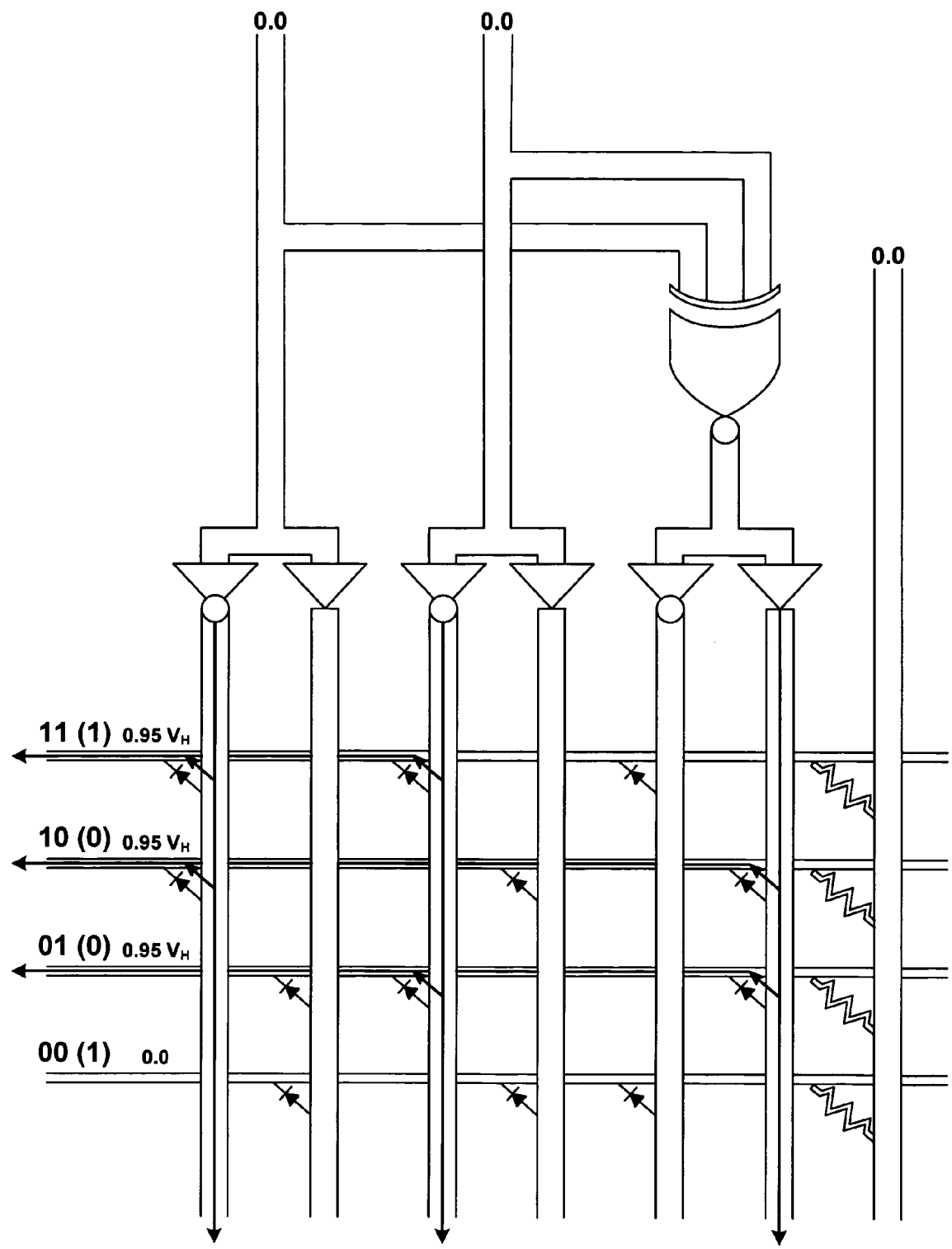
FIGS. 12A-D illustrate nanowire voltage states arising from input of four different, two-bit addresses to the address signal lines of the nanoscale interconnection interface shown in FIG. 11.
Figure 12B:
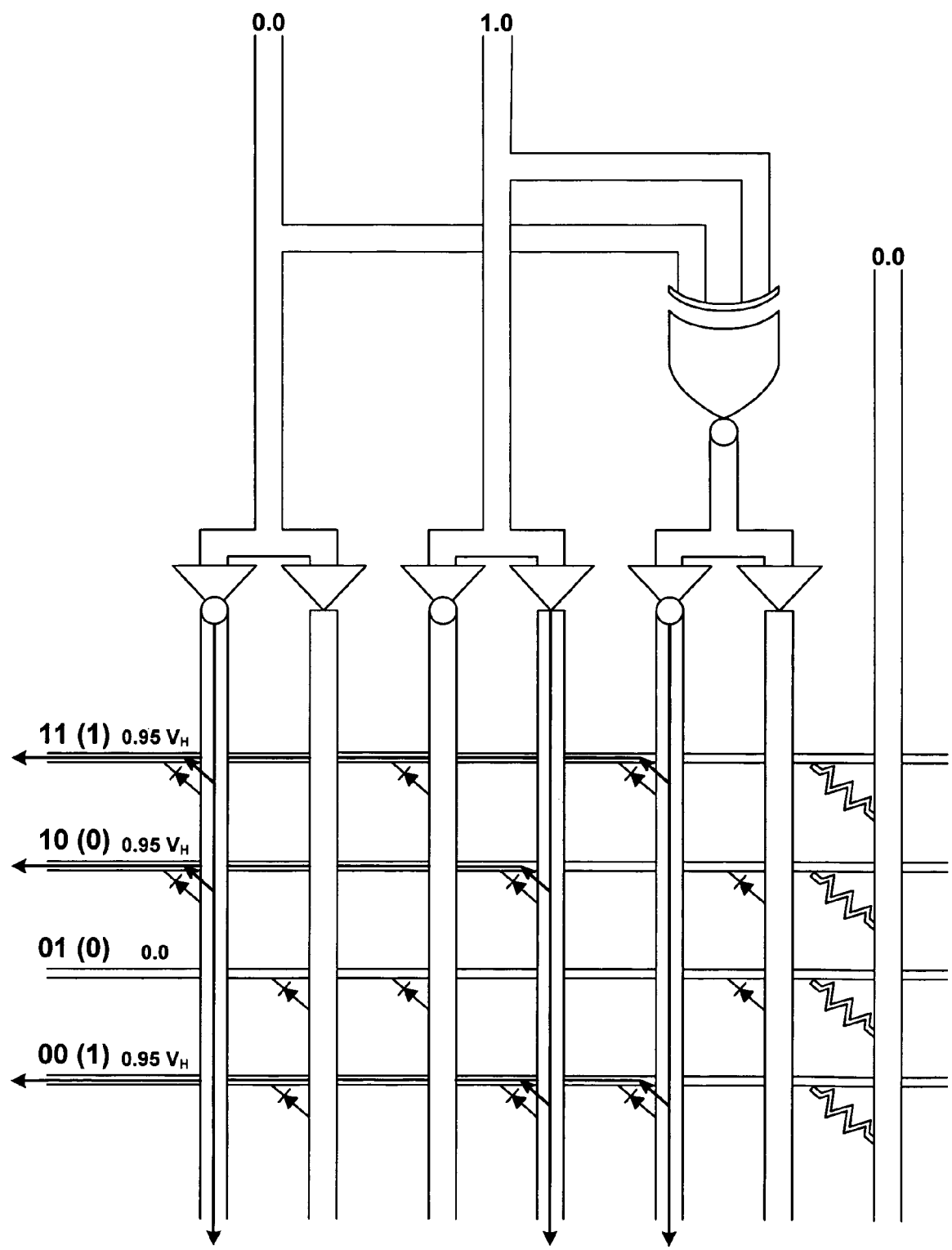
Figure 12C:
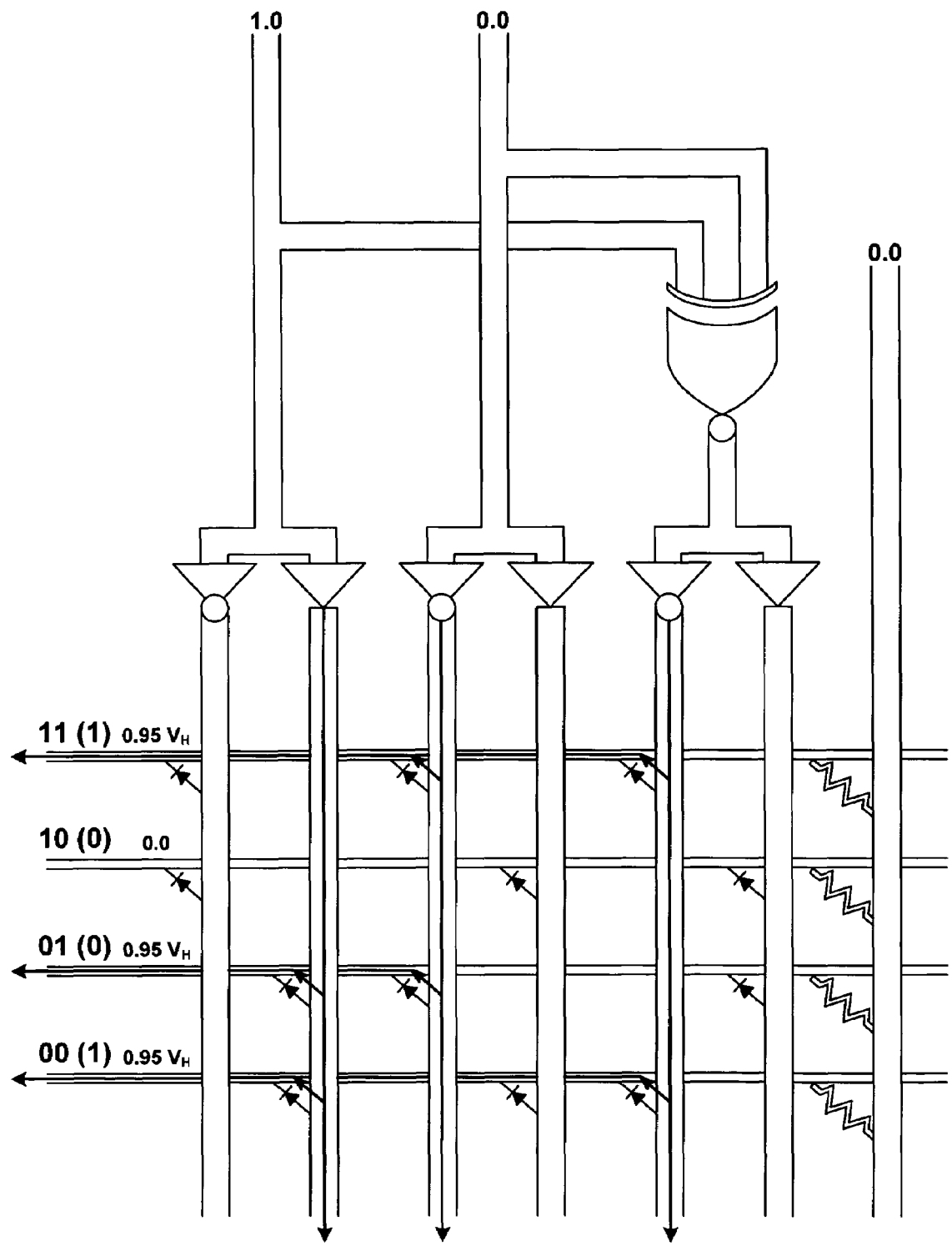
Figure 12D:
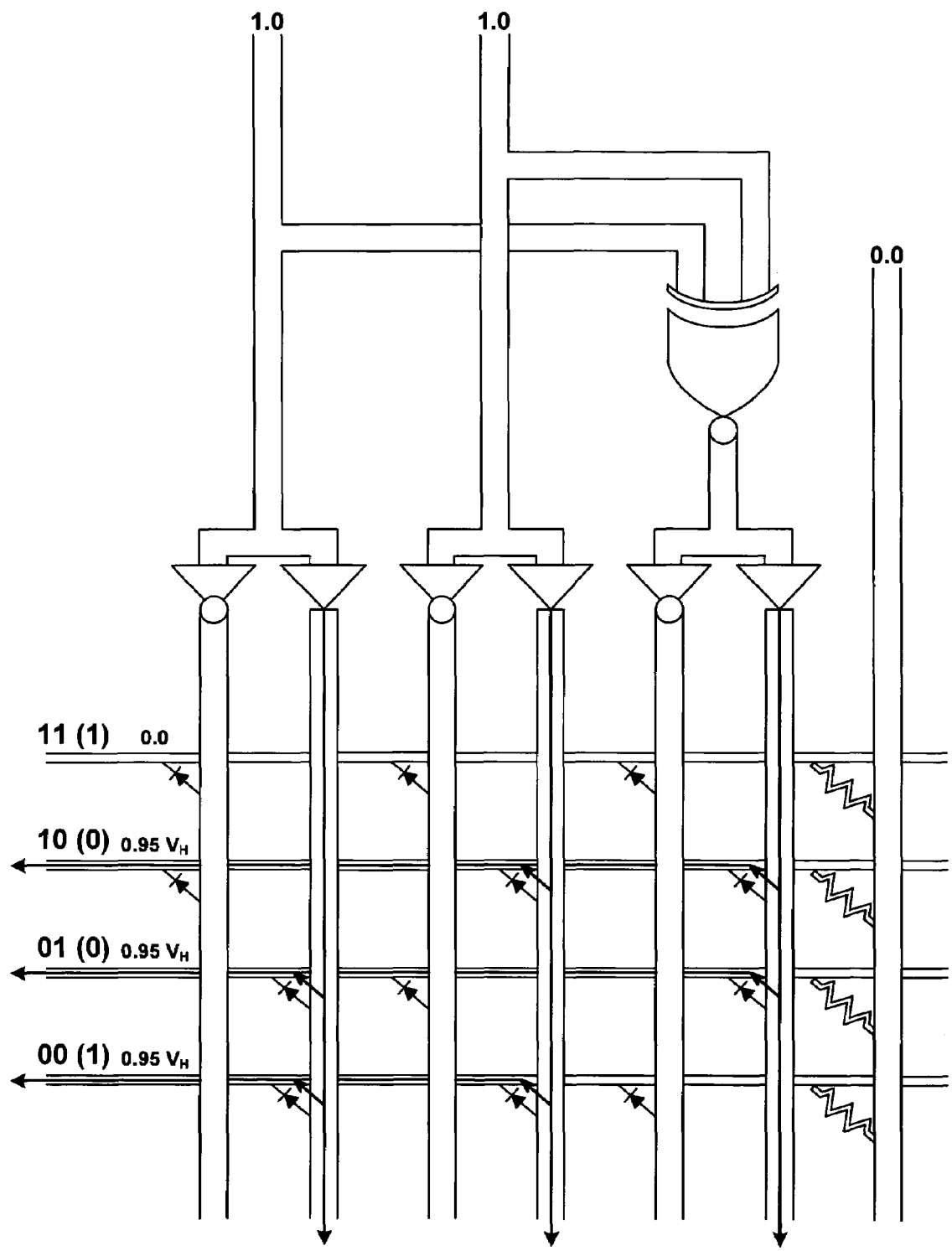

Because the nanoscale rectifying connections cannot be perfectly fabricated, and the because the effects of failed, open-state connections so seriously degrades the ability to uniquely address nanowires using different input addresses, a method for ameliorating the effects of failed nanoscale interconnections has been recognized as necessary in order to produce commercially viable products that include nanoelectronic circuits. FIG. 11 shows a modified nanoscale interconnection interface, similar to the interconnect interfaces illustrated in FIGS. 3A-4D. As shown in FIG. 11, the modified nanoscale interconnection interface 1100 has four addressable nanowires 1102-1105 with two-bit addresses "00," "01," "10," and "11," as in the interconnection interface shown in FIG. 3A. The modified interconnection interface also employs two address signal lines 1106 and 1107 into which two-bit addresses may be input. As in the previously described interconnection interface, shown in FIG. 3A, each address signal line 1106 and 1107 is split into a complementary pair, 1108-1109 and 1110-1111, respectively. However, an additional complementary pair of signal lines 1112 and 1113, with signals derived from the signals input to the address signal lines 1106 and 1107, are also selectively interconnected to the nanowires 1102-1105 via rectifying nanoscale connections, such as rectifying nanoscale connection 1114. The complementary signal-line pair 1112-1113, represents a parity-check signal line, derived from the address signal lines 1106-1107 by an inverted XOR logic component 1116. In essence, the parity-check complementary pair 1112-1113 adds an additional, although derived, and therefore not independent, address bit, so that the nanowires 1102-1105 can be considered to have three-bit addresses. In FIG. 11, the derived, parity-check address bit is shown parenthesized, as, for example, the parenthesized parity-check address bit 1118 for nanowire 1105. FIGS. 12A-D illustrate nanowire voltage states arising from input of four different, two-bit addresses to the address signal lines of the nanoscale interconnection interface shown in FIG. 11. As can be seen in FIGS. 12A-D, each different input address uniquely selects the nanowire designated as having that address, as in the case of the nanoscale interconnection interface described above with reference to FIGS. 3A-4D. FIG. 13 shows a table indicating voltage states of nanowires resulting from address signals input to microelectronic address signal lines of a nanoscale interconnection interface, using the same illustration conventions as used in FIGS. 5, 8, and 10, for the defective nanoscale interconnection interface illustrated in FIGS. 11-12 D. Comparison of FIG. 13 to FIG. 5 reveals an immediate advantage arising from the presence of the parity-check complementary pair (1112 and 1113 in FIG. 11). As can be seen in FIG. 13, regardless of the input address, each nanowire either has the low-voltage selected-nanowire state or a single high-voltage state. Thus, all voltages shown in FIG. 13 are either 0 or 0.95 $V_H$, while in FIG. 5, the non-selected voltage states range from 0.90 $V_H$ to 0.95 $V_H$. Thus, the added parity-check complementary signal-line pair decreases the range of voltage states for non-selected nanowires, and increases the voltage separation of selected nanowires from non-selected nanowires.

Figure 14:
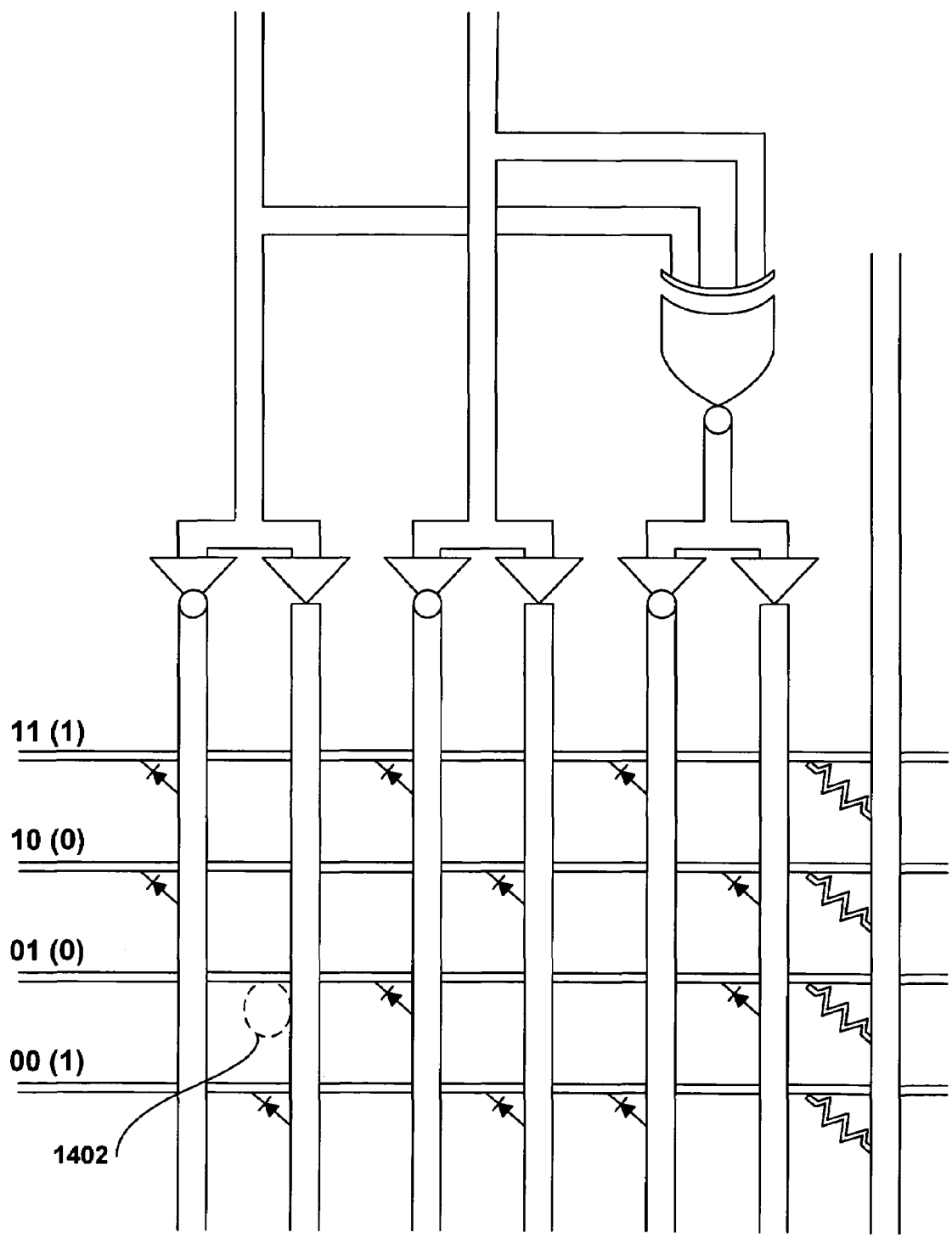
FIG. 14 shows the modified nanoscale interconnection interface shown in FIG. 11 with a single defective rectifying interconnect.
Figure 15A:
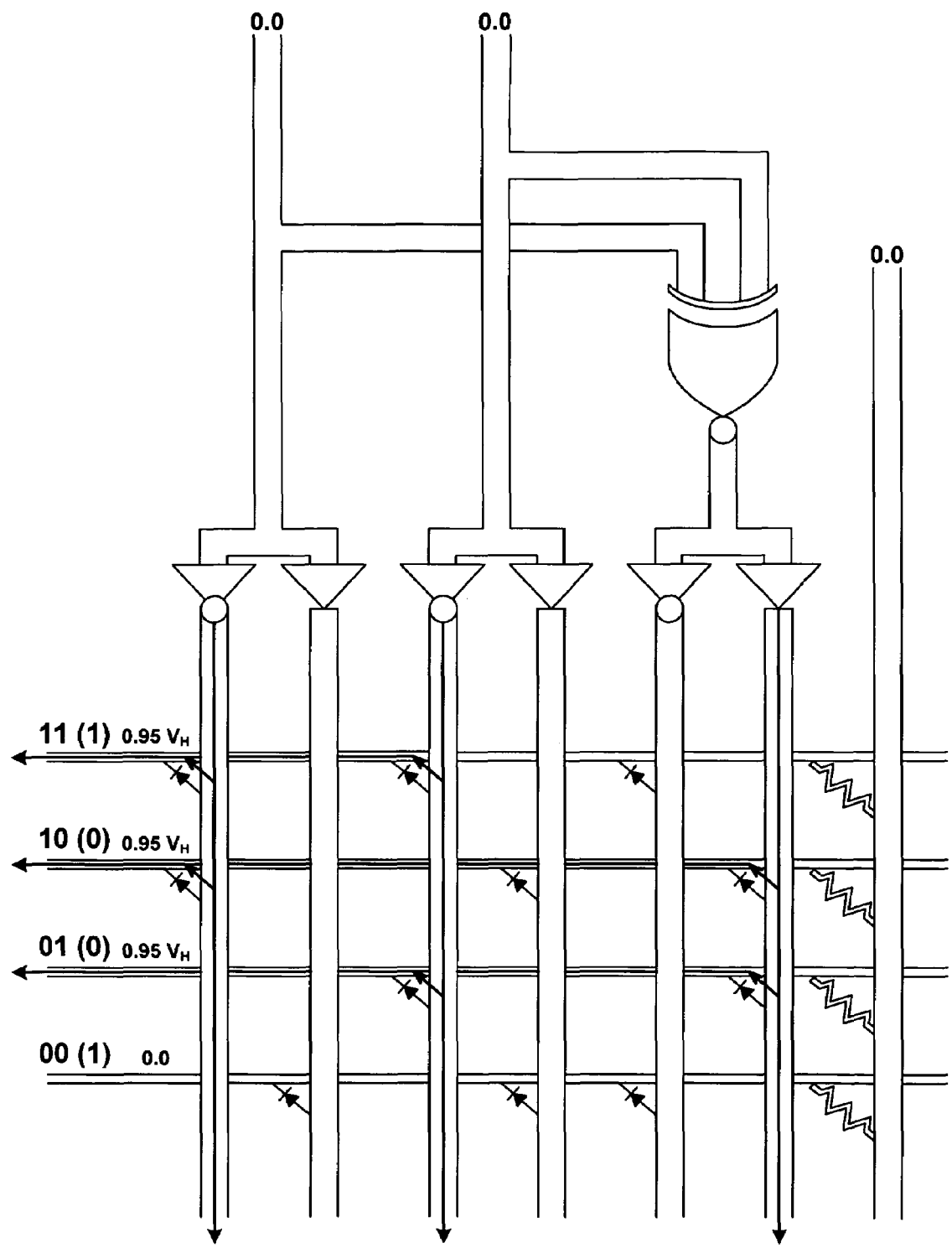
FIGS. 15A-D, analogous to FIGS. 12A-D, show voltage states of nanowires arising from four different, two-bit addresses input to the address signal lines.
Figure 15B:
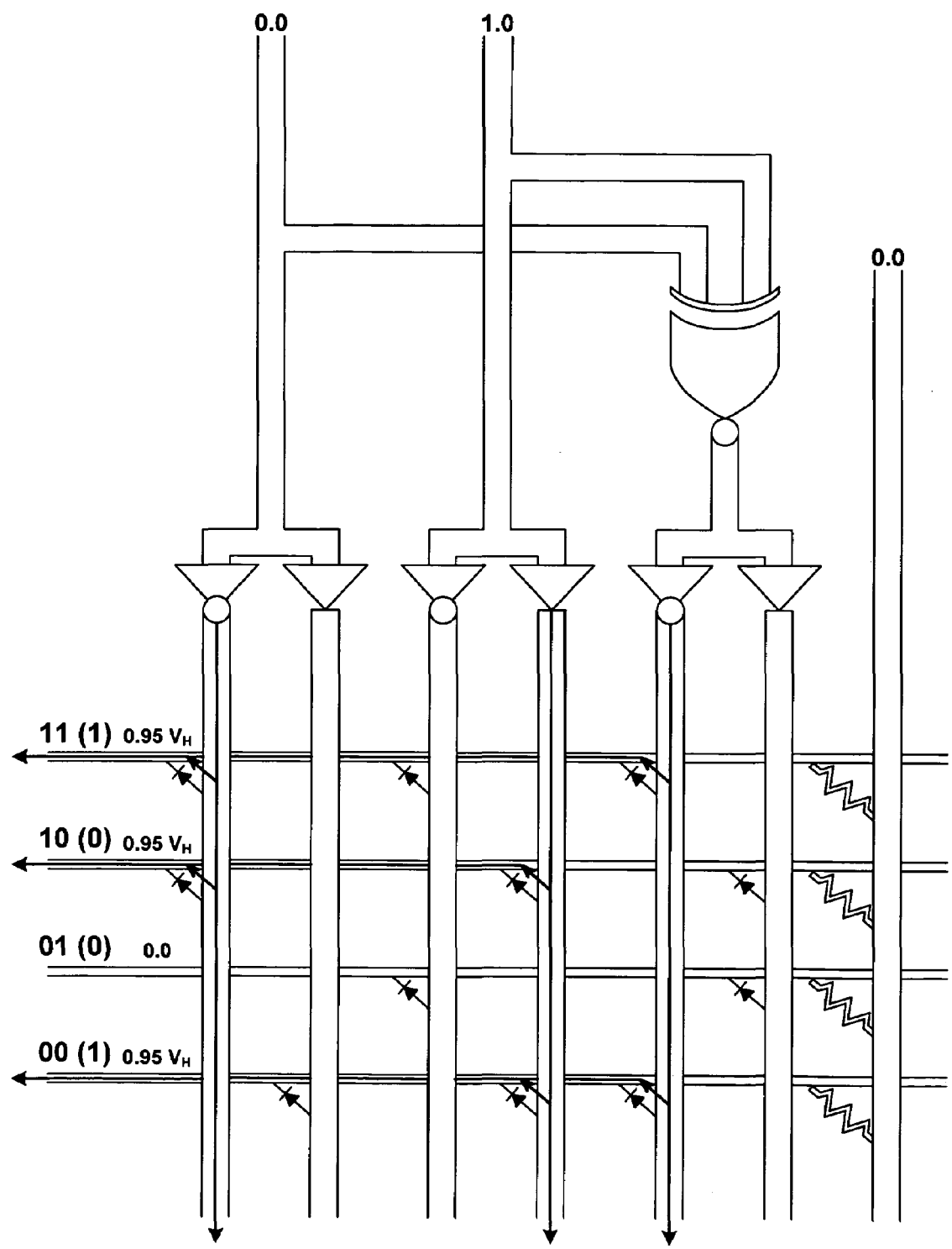
Figure 15C:
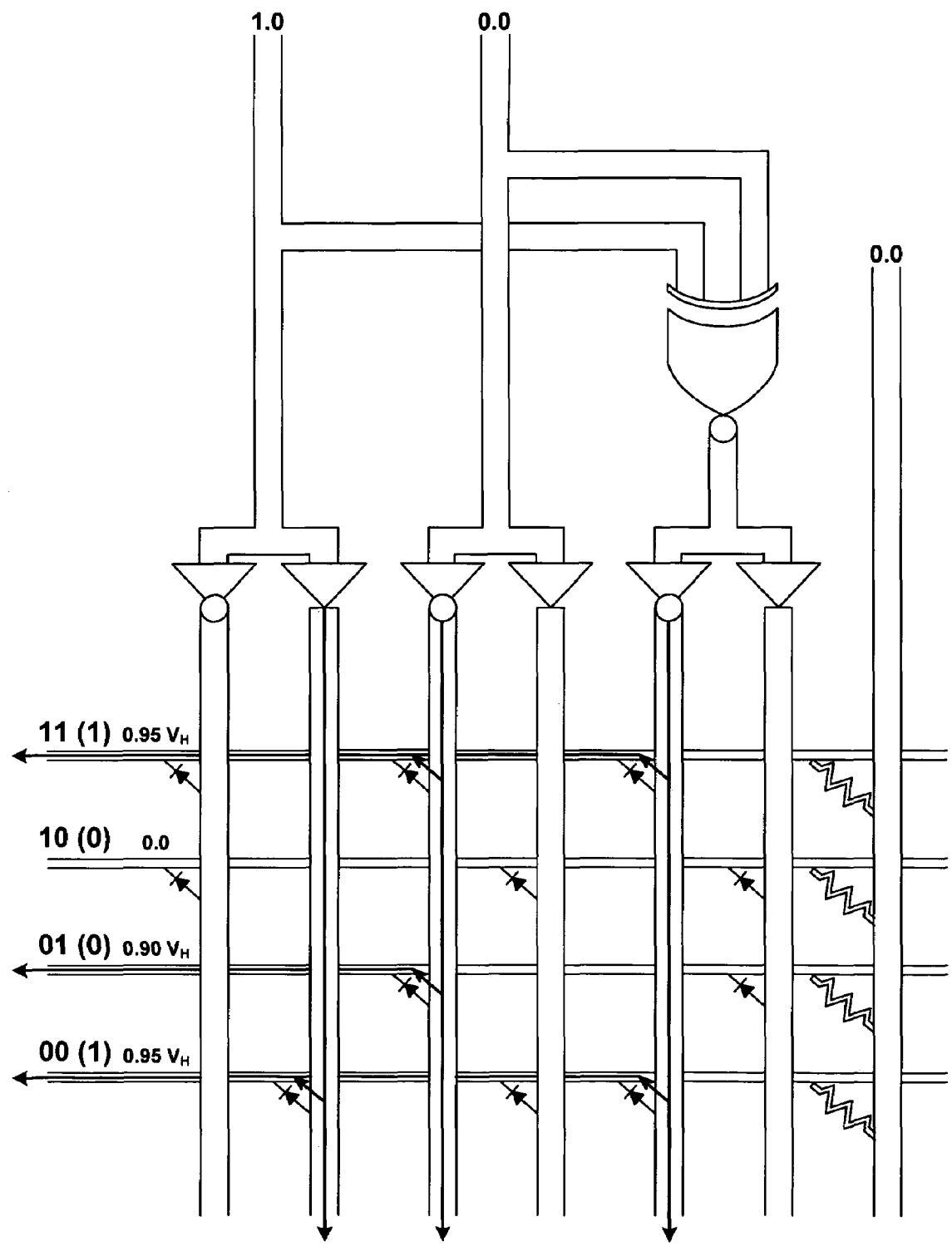
Figure 15D:
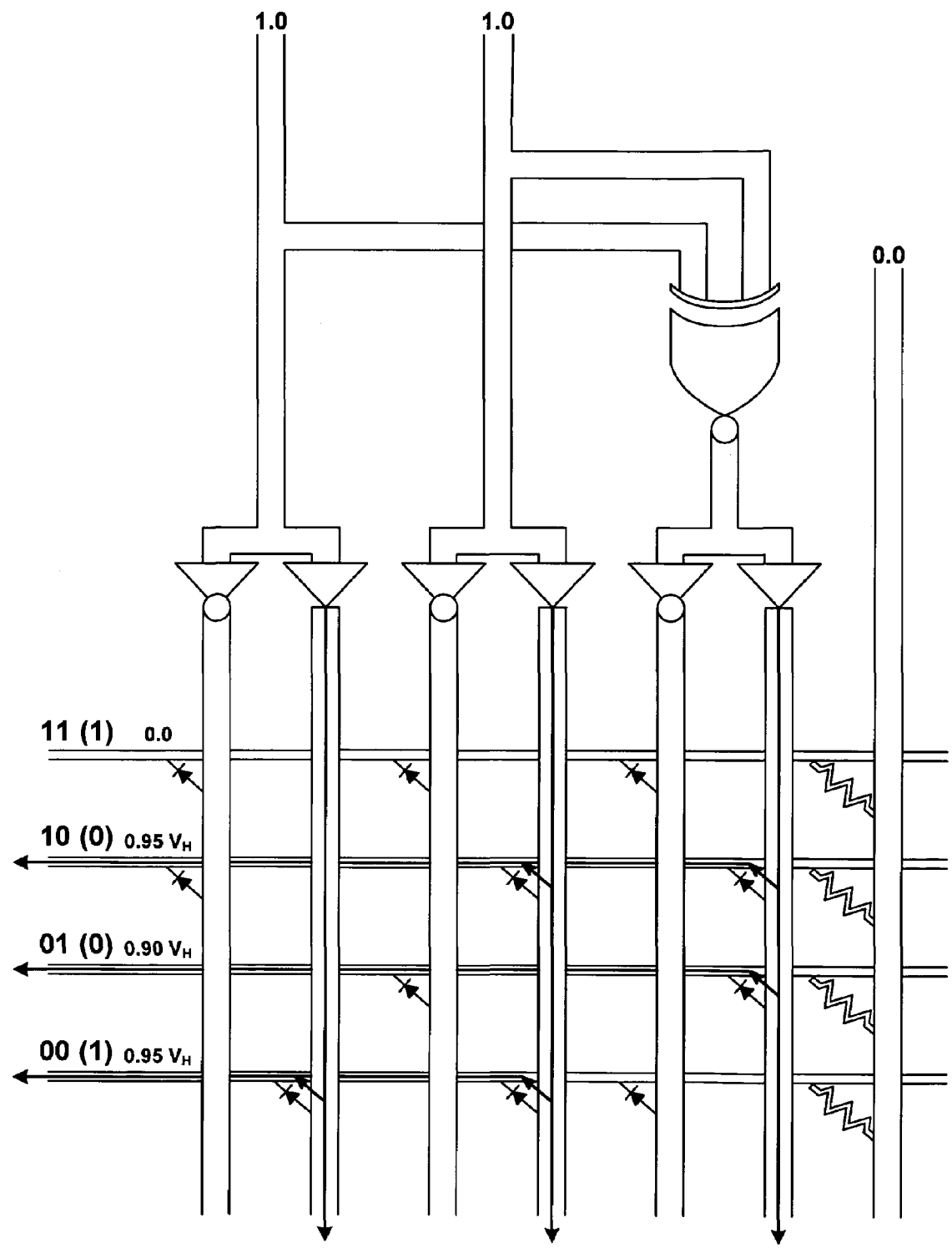

FIG. 14 shows the modified nanoscale interconnection interface shown in FIG. 11 with a single defective rectifying interconnect. The defective rectifying interconnect is indicated in FIG. 14 by the dashed circle 1402. The same rectifying connection defect in FIG. 14 is shown as being defective in FIG. 6. FIGS. 15A-D, analogous to FIGS. 12A-D, show voltage states of nanowires arising from four different, two-bit addresses input to the address signal lines. As can be appreciated by comparing the voltage states shown in FIGS. 15A-D to those shown in FIGS. 12A-D, the presence of the additional rectifying connections between the parity-check complementary signal-line pair (1112-1113 in FIG. 11) has significantly increased the robustness of a modified nanoscale interconnection interface in comparison to the interconnection interface illustrated in FIG. 3A. FIG. 16 shows a table indicating voltage states of nanowires resulting from address signals input to microelectronic address signal lines of a nanoscale interconnection interface, using the same illustration conventions as used in FIGS. 5, 8, 10, and 13, for the defective, modified nanoscale interconnection interface illustrated in FIGS. 14-15D. Comparison of FIGS. 16 and 13 shows that, despite the defective rectifying connection (1402 in FIG. 14), each nanowire remains uniquely addressable. In other words, unlike in the case of FIGS. 8 and 10, a single zero-voltage state appears in each column and row of FIG. 16. The only effect of the defective rectifying connection is lowering of the high voltage states 1602 and 1604 for nanowire "01" from 0.95 $V_H$ to 0.90 $V_H$. Thus, the single defective rectifying connection, in the case of the modified nanoscale interconnection interface, broadens the range of non-selected nanowire high voltage states, but does not result in a loss of addressability.

Figure 17:
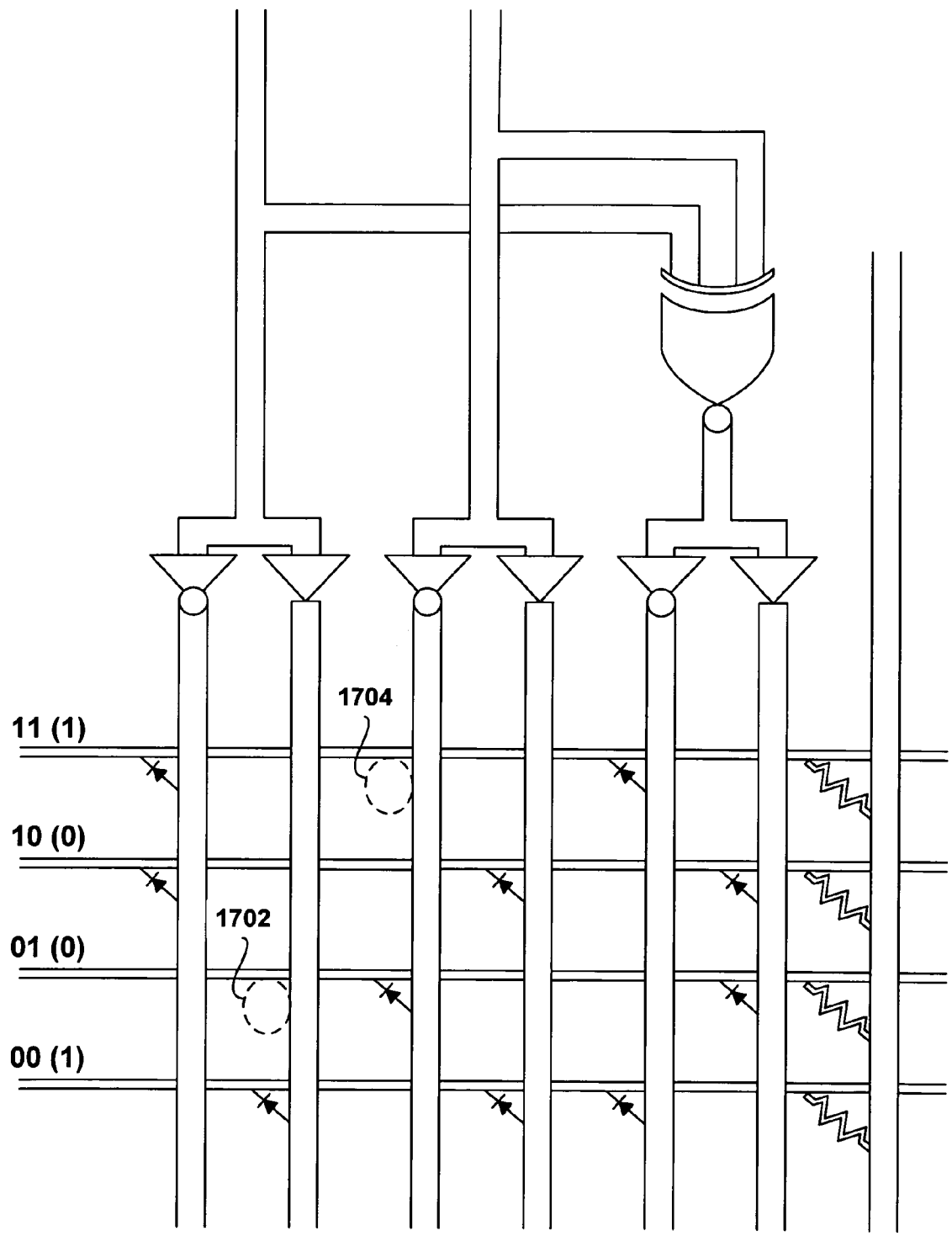
FIG. 17 shows the modified nanoscale interconnection interface first shown in FIG. 11 with two defective rectifying connections.

FIG. 17 shows the modified nanoscale interconnection interface first shown in FIG. 11 with two defective rectifying connections. The two defective rectifying connections are shown by dashed circles 1702 and 1704 in FIG. 17. FIG. 18 shows a table indicating voltage states of nanowires resulting from address signals input to microelectronic address signal lines of a nanoscale interconnection interface, using the same illustration conventions as used in FIGS. 5, 8, 10, 13, and 16, for the defective, modified nanoscale interconnection interface illustrated in FIG. 17. As can be seen in FIG. 18, all four nanowires remain uniquely addressable despite two defective rectifying connections.

Figure 19:
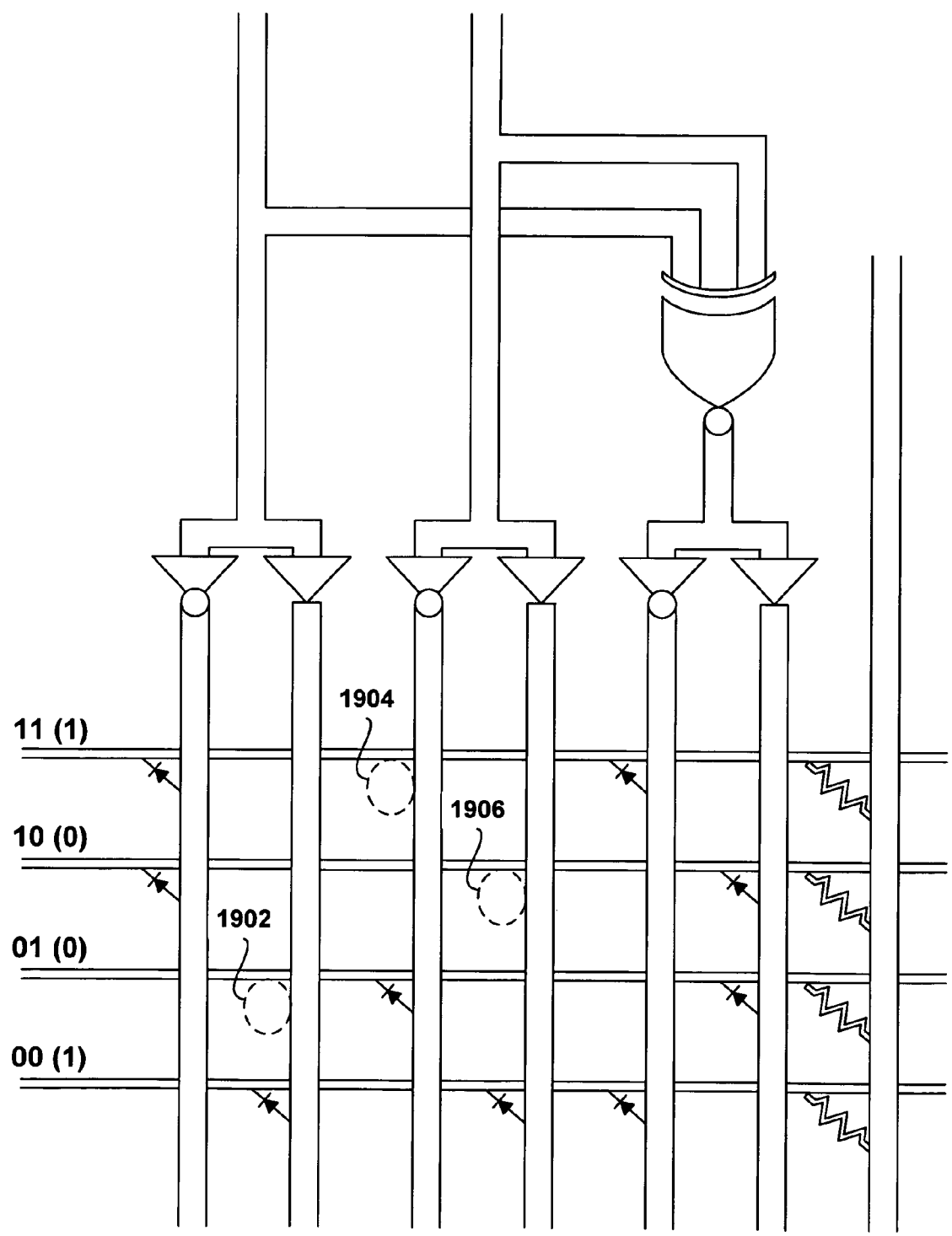
FIG. 19 shows a defective, modified nanoscale interconnection interface similar to that shown in FIG. 11, but having three defective rectifying connections.
Figure 21:
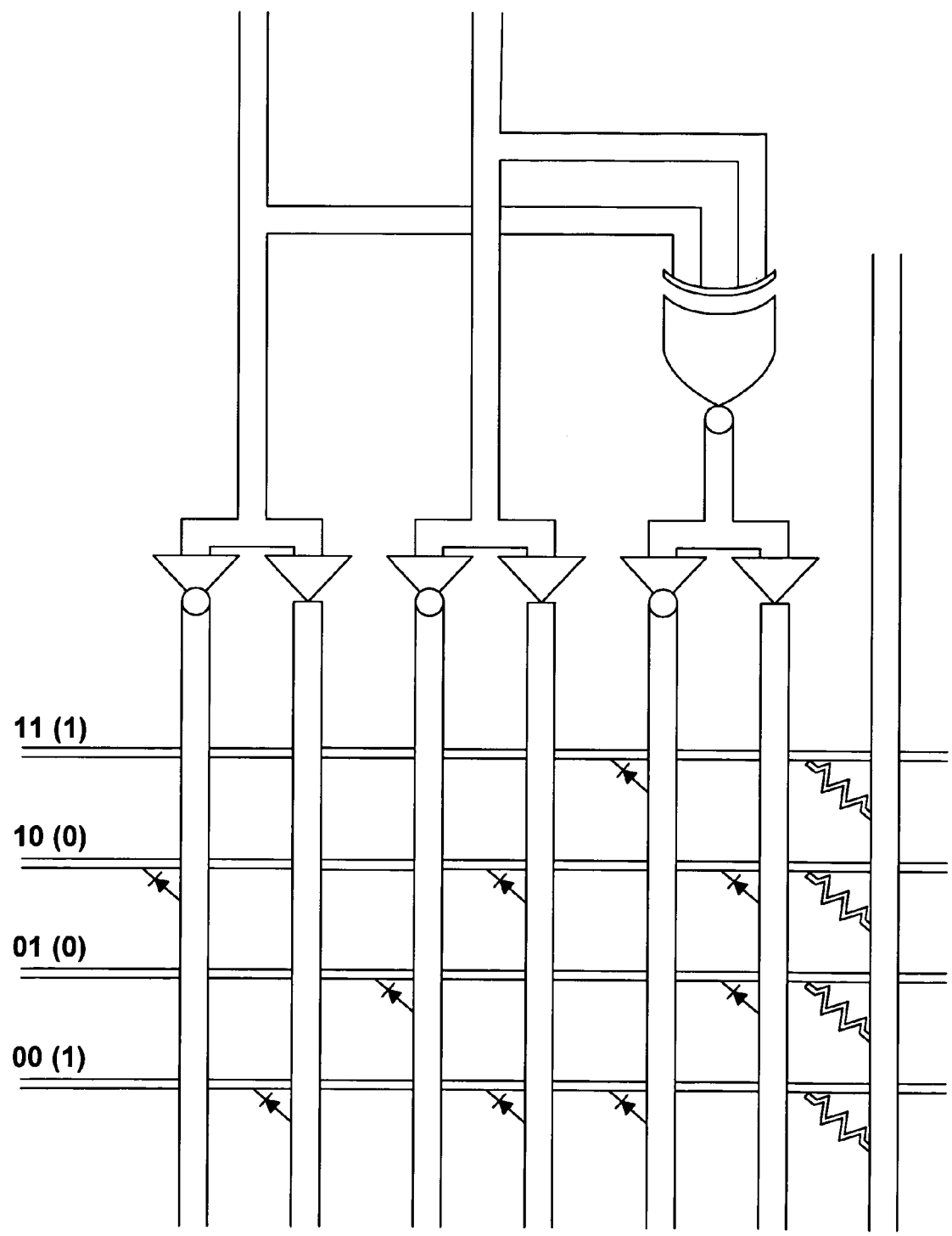

FIG. 19 shows a defective, modified nanoscale interconnection interface similar to that shown in FIG. 11, but having three defective rectifying connections. The defective rectifying connections are shown by dashed circles 1902, 1904, and 1906 in FIG. 19. FIG. 20 shows a table indicating voltage states of nanowires resulting from address signals input to microelectronic address signal lines of a nanoscale interconnection interface, using the same illustration conventions as used in FIGS. 5, 8, 10, 13, and 16, for the defective, modified nanoscale interconnection interface illustrated in FIG. 17. As can be easily observed in FIG. 20, all four nanowires remain uniquely addressable despite three defective rectifying connections. In fact, each nanowire can lose one out of three rectifying connections within the modified nanoscale interconnection interface and remain uniquely addressable. Unique addressability is lost only when two or more rectifying connections on a single nanowire are defective. FIGS. 21 and 22 illustrate loss of unique addressability in the modified nanoscale interconnection interface.

Figure 23A:
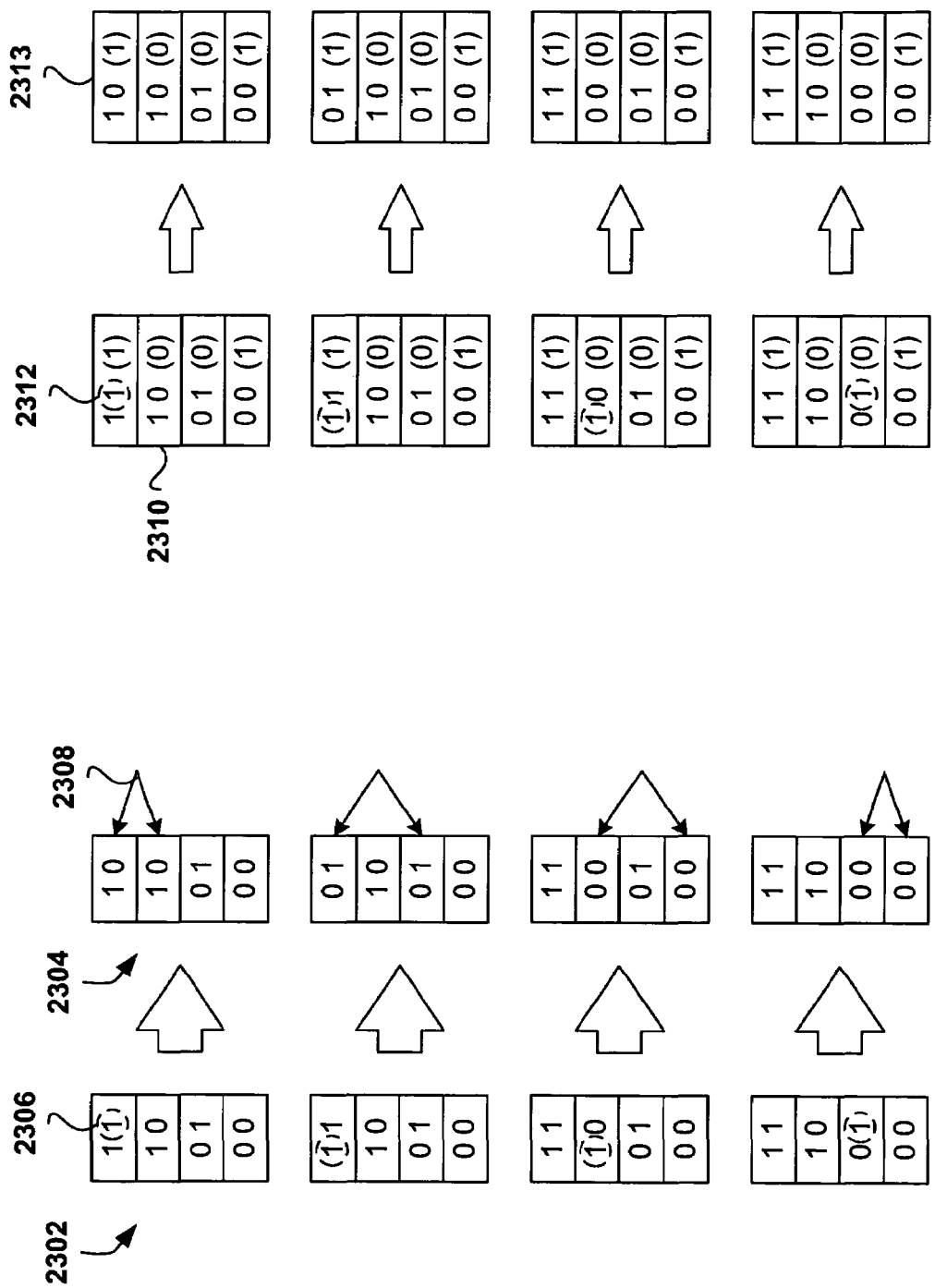
FIGS. 23A-B illustrate the comparative robustness of two-bit addresses and three-bit addresses in the nanoscale interconnection interfaces discussed with respect to FIGS. 3A-22.
Figure 23B:
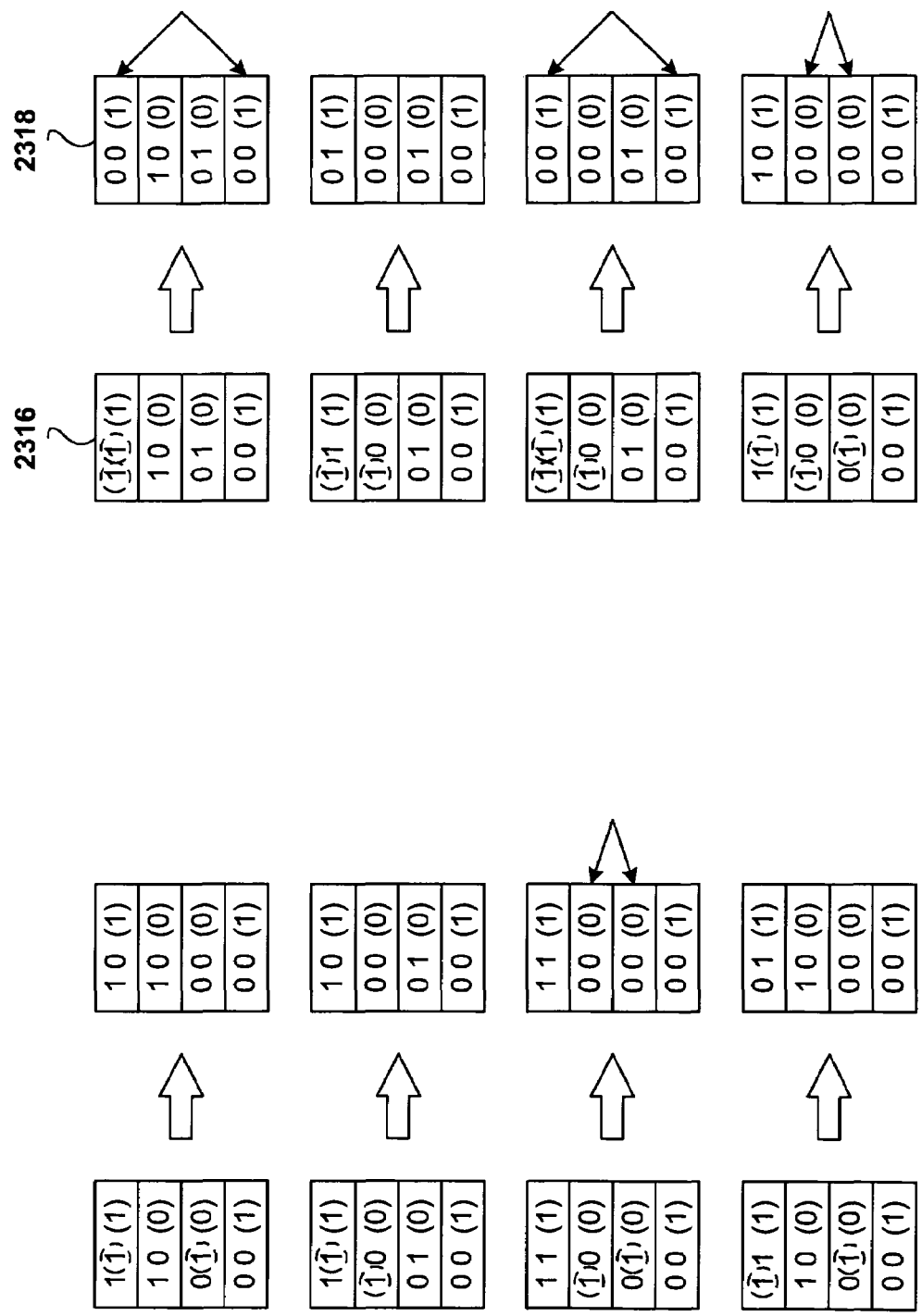

FIGS. 23A-B illustrate the comparative robustness of two-bit address spaces and three-bit address spaces in the nanoscale interconnection interfaces discussed with respect to FIGS. 3A-22. On the left-hand side of FIG. 23A, four different high-to-low address-bit transformations are shown for the two-bit address spaces. For example, the four-address, two-bit address space 2302 with four valid addresses is transformed into a two-bit address space with only three valid addresses 2304 when the lower bit 2306 of address "11" is, through a defective interconnection, converted from "1" to "0." In this case, the top two addresses collapse into a single address "10," as indicated by bifurcating arrows 2308. In all cases illustrated in the left-hand portion of FIG. 23A, a single transformation of an address bit from "1" to "0" or from "0" to "1" invariably results in a decrease in the number of valid or unique addresses. By contrast, as illustrated in the right-hand side of FIG. 23A and in FIG. 23B, in a sparsely occupied, three-bit address space that is occupied by only four valid addresses, transformation of a single address bit from "1" to "0" or from "0" to "1" leaves four valid addresses in the three-bit address space. If the address at 2312, for example, is changed from "1" to "0," the resulting address 2313 is still distinguishable from the other addresses. As shown in FIG. 23B, a decrease in the number of unique addresses occurs in the sparsely occupied, three-bit address space only when at least two bits within a single address are changed. For example, a two-bit transformation changes the sparsely occupied three-bit address space 2316 with four unique or valid addresses to a three-bit, sparsely occupied address space 2318 with only 3 valid or unique addresses.

Figure 24A:
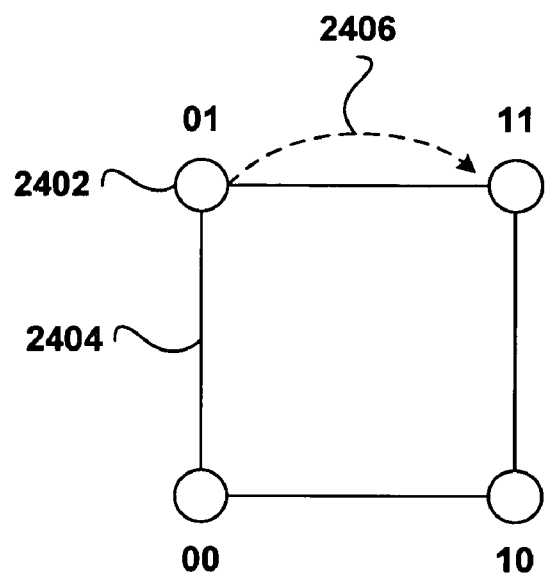
FIGS. 24A-B illustrate address-space topologies of the two-bit, fully occupied address space and a three-bit, sparsely occupied address space.
Figure 24B:
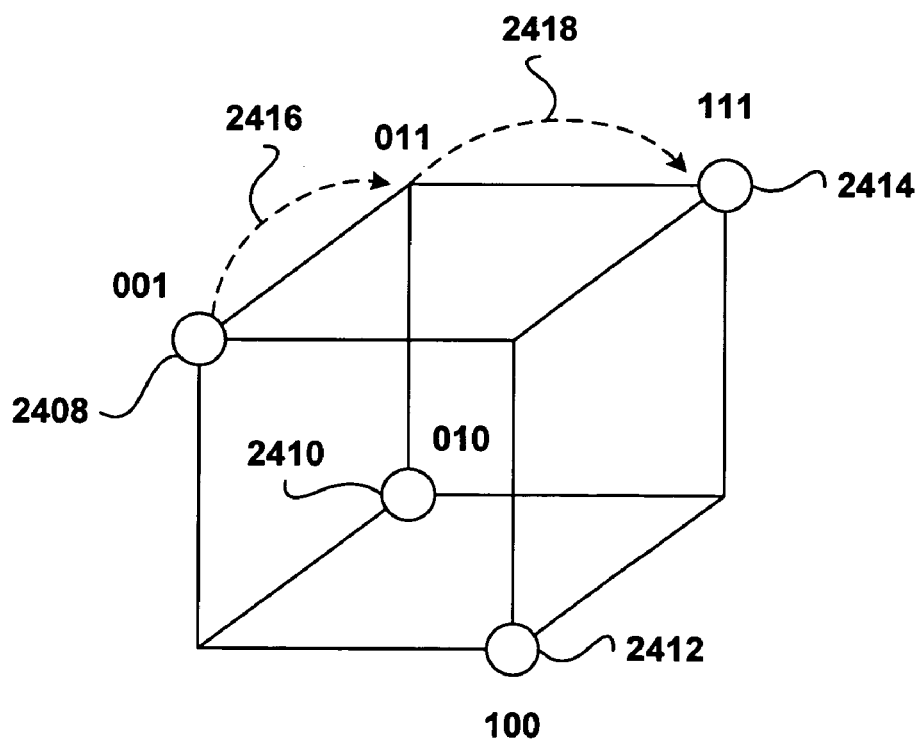

This robustness in addressability despite address-bit defects or conversions can be geometrically represented. FIGS. 24A-B illustrate address-space topologies of the fully occupied, two-bit address space and a sparsely occupied, three-bit address space. In FIG. 24A, each different two-bit address is represented by a disk or node. For example, the two-bit address "01" is represented by node 2402. Edges, such as edge 2404, interconnect nodes, the addresses for which can be interconverted by converting a single bit "1" to "0" or from "0" to "1." Thus, as shown by the dotted arrow 2406, a single bit conversion within a two-bit address in the two-bit, fully occupied address space produces another address within the two-bit, fully occupied address space. FIG. 24B illustrates a three-bit, sparsely occupied address space. In FIG. 24B, four of the eight addresses within the three-bit address space are occupied, or are valid. The four valid addresses are "001" 2408, "010" 2410, "100" 2412, and "111" 2414. Note that the occupied, or valid addresses, are arranged spatially as the vertices of a tetrahedron, and each valid address is separated from any other valid address by at least two edges. Thus, two address-bit conversions are required to produce a different, valid address from any given address, as indicated by the two dotted arrows 2416 and 2418 in FIG. 24B. The concepts illustrated geometrically in FIGS. 24A-B can be generalized to a sparsely occupied address space of any size with addresses arranged so that a transformation of more than one bit is needed to transform one valid address to another.

Graphical representations similar to those shown in FIG. 24A-B are commonly employed to represent the distances between codewords in linear block codes used for error-control coding. Linear block codes are discussed above in the subsection on error-control coding. Although error-control coding is employed for real-time transmission of data through imperfect communications media, and for storage and recovery of data from error-prone mass storage devices, the similarity between the problem spaces arising in ameliorating defective interconnections between nanoelectronic and microelectronic circuits and in data transmission and data storage inspired the rigorous approach of the present invention to designing redundant, parity-check address signal lines, in addition to direct address signal lines. These redundant signal lines complement the direct address signal lines, increasing the robustness of nanoscale interconnection interfaces in the manner that the single additional parity-check complementary signal-line pair, first illustrated in FIG. 11, markedly increased the defect tolerance of the nanoscale interconnection interface, shown in FIG. 11, with respect to the interconnection interface shown in FIG. 3A.

Figure 25:
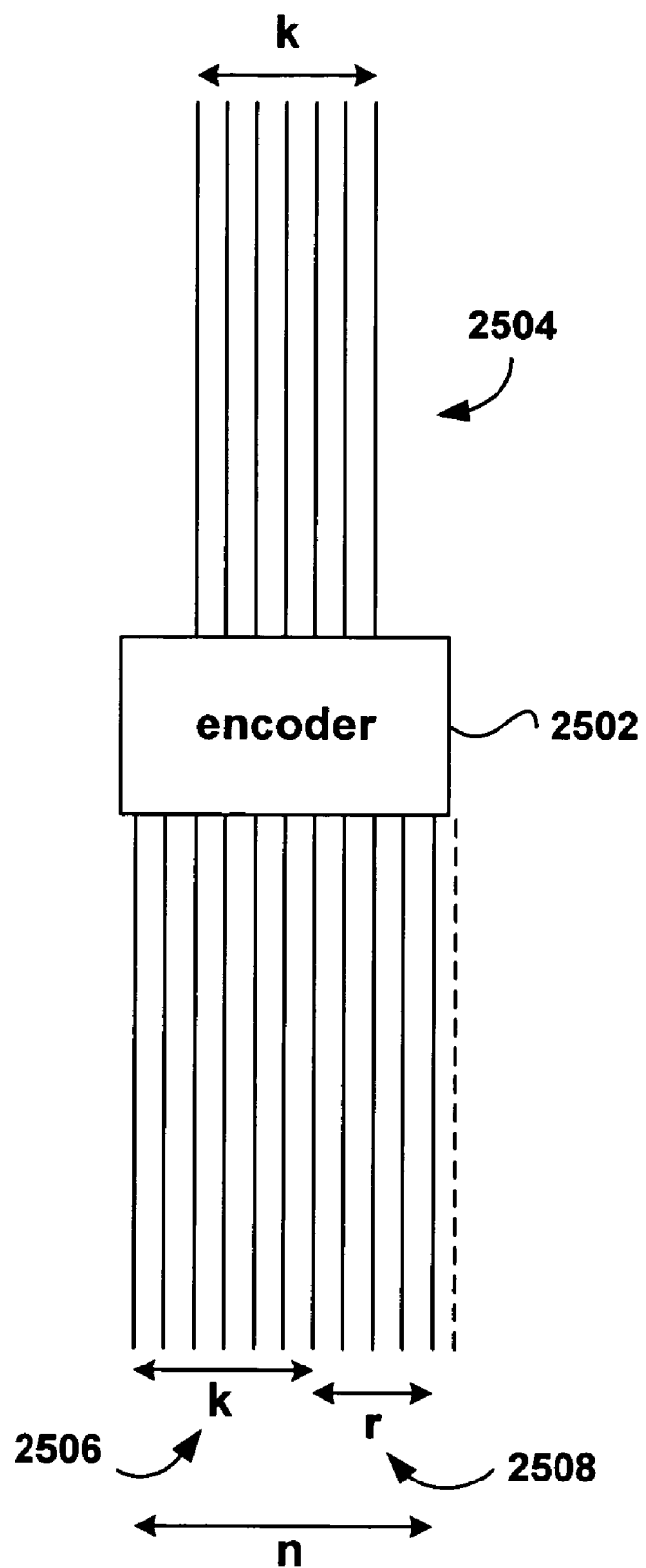
FIG. 25 illustrates a generalized technique for providing parity-check address signal lines via an encoder component in order to increase the defect tolerance and fault-tolerance of nanoscale interconnection interfaces that represents one embodiment of the present invention.

FIG. 25 illustrates a generalized technique for providing parity-check address signal lines via an encoder component in order to increase the defect-tolerance and fault-tolerance of nanoscale interconnection interfaces. The encoder 2502 receives k incoming address signal lines 2504. The encoder outputs the k address signal lines 2506 in addition to r additional parity-check signal lines 2508. Thus, the encoder receives k input address signal lines and outputs n coded address signal lines. The signals output through the r parity-check signal lines need to be derived from the signals input through the k input address signal lines in such a way as to allow for a robust, n-bit address space containing k well-distributed and valid addresses. This problem has already been solved by the linear block code error-control encoding techniques discussed above. The n output signal lines may be viewed as carrying n-bit codewords derived from k-bit messages, with the encoder 2502 functionally equivalent to a linear block code encoding engine.

Figure 26A:
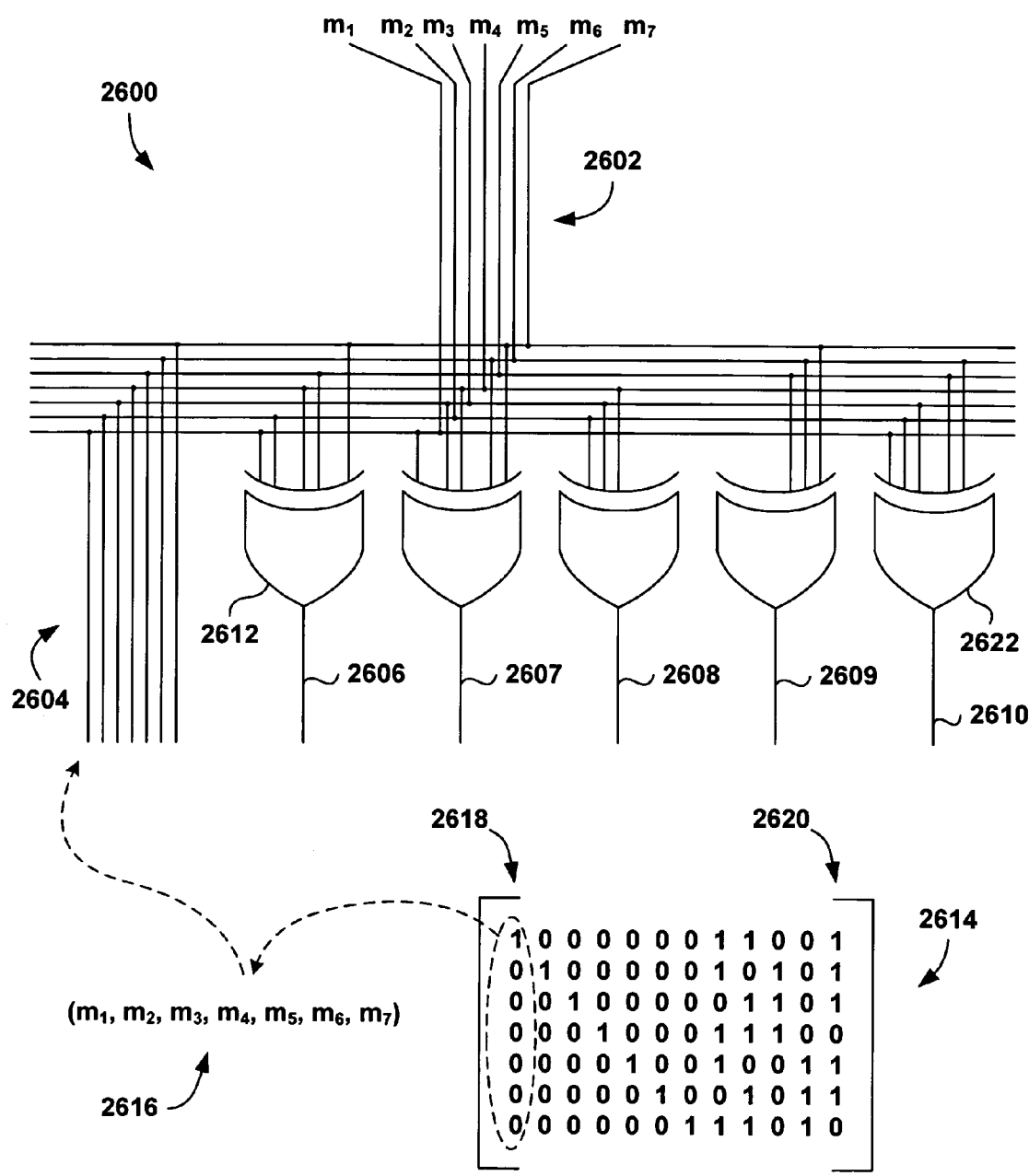

FIGS. 26A-B illustrate the derivation of an encoding circuit that adds parity-check address signal lines to an incoming set of address signal lines and derivation of a demultiplexer corresponding to the encoding circuit. In FIG. 26A, the encoder receives seven external input address signal lines $m_1$-$m_7$ 2602. The encoder circuit outputs seven unchanged signal lines 2604 corresponding to the input address signal lines 2602. In addition, the encoder circuit 2600 outputs five additional parity-check coded-address signal lines 2606-2610. Each additional parity-check signal line is derived from a subset of the input address signal lines $m_1$-$m_7$ 2602 through a multiple-input XOR component, such as XOR component 2612. The encoder circuit 2600 is specified by the generator matrix 2614 of a [12, 7, 4] shortened Hamming code. The product of the vector 2616, having each of the external input address signal lines as elements, and a column from the generator matrix specifies the interconnections between the input address signal lines $m_1$-$m_7$ and a single output coded address signal line. For example, multiplication of the input address signal line vector 2616 by the first column 2618 in the generator matrix 2614 results in the single signal line $m_1$. Thus, the first output coded address signal line should be interconnected only with the first external input address signal line $m_1$. In a general case, each computed set of interconnections would be input to a multi-input XOR component, but, when only a single input is specified, then it can be exported directly, as is the case with k inputs in systematic encoding. As another example, the interconnections of the last output coded address signal line 2610 with the input address signal lines $m_1$-$m_7$ is obtained by multiplying the vector 2616 by the last column 2620 in the generator matrix. This multiplication results in a vector containing the input address signal lines $m_1$, $m_2$, $m_3$, $m_5$, and $m_6$. Note that these five signal lines are input into the multiple-input XOR component 2622 that produces output signal line 2610. Thus, a large number of different possible encoders with different proportions of parity-check signal lines to input address signal lines can be straightforwardly obtained from the generator matrices of the many different possible linear block codes.

The demultiplexer, or nanoscale interconnection interface, can also be easily configured using the generator matrix 2614 used for designing the encoder. FIG. 26B illustrates derivation of a demultiplexer corresponding to the encoding circuit derived in FIG. 26A. A matrix A 2624 with 7 columns and 128 rows that includes each possible input address can be multiplied by the generator matrix G 2626, with 12 columns and 7 rows, to produce a matrix D 2628 of codewords with 12 columns and 128 rows. Each codeword, or row, of the matrix D corresponds to a coded address that designates a particular nanowire within a crossbar, access to the nanowires of which is provided by the demultiplexer. Thus, each row in the matrix D corresponds to a nanowire of the accessed nanowire crossbar, and column in the matrix D corresponds to an address signal line output from an encoder. For example, the first two rows of the matrix D correspond to crossbar nanowires 2630 and 2631, the first seven columns of matrix D correspond to the seven coded address signal lines (see also 2604 in FIG. 6A) corresponding to the input address signal lines to the encoder (2602 in FIG. 26A), and the final 5 columns of matrix D correspond to the five coded address signal lines 2606-2610 (see also FIG. 26A) output by the encoder. If an element of a codeword in a row of matrix D has the value "1," then the nanowire corresponding to the codeword is interconnected to the address signal line corresponding to the column of matrix D in which the element occurs. In other words, the "1" values in matrix D correspond to the pattern of interconnections between coded address signal lines and nanowires, while "0" values correspond to the pattern of overlapping, but not interconnected nanowires and address signal lines. In many embodiments, each address signal line shown in FIGS. 26A-B is implemented as a complementary pair, and so the "1" values in matrix D correspond to the pattern of interconnections between non-inverted address signal lines of complementary address-signal-line pairs, while the "0" values in matrix D correspond to the pattern of interconnections between the inverted, or complementary, address signal lines of the complementary address-signal-line pairs. The generator matrix for a linear block code can therefore be used to straightforwardly design encoders as well as corresponding demultiplexers, or nanoscale interconnection interfaces. The full A, G, and D matrices for the example of FIGS. 26A-B are provided, below:

Matrix A

| | | | | | | |
|---|---|---|---|---|---|---|
| 0 | 0 | 0 | 0 | 0 | 0 | 0 |
| 0 | 0 | 0 | 0 | 0 | 0 | 1 |
| 0 | 0 | 0 | 0 | 0 | 1 | 0 |
| 0 | 0 | 0 | 0 | 0 | 1 | 1 |
| 0 | 0 | 0 | 0 | 1 | 0 | 0 |
| 0 | 0 | 0 | 0 | 1 | 0 | 1 |
| 0 | 0 | 0 | 0 | 1 | 1 | 0 |
| 0 | 0 | 0 | 0 | 1 | 1 | 1 |
| 0 | 0 | 0 | 1 | 0 | 0 | 0 |
| 0 | 0 | 0 | 1 | 0 | 0 | 1 |
| 0 | 0 | 0 | 1 | 0 | 1 | 0 |
| 0 | 0 | 0 | 1 | 0 | 1 | 1 |
| 0 | 0 | 0 | 1 | 1 | 0 | 0 |
| 0 | 0 | 0 | 1 | 1 | 0 | 1 |
| 0 | 0 | 0 | 1 | 1 | 1 | 0 |
| 0 | 0 | 0 | 1 | 1 | 1 | 1 |
| 0 | 0 | 1 | 0 | 0 | 0 | 0 |
| 0 | 0 | 1 | 0 | 0 | 0 | 1 |
| 0 | 0 | 1 | 0 | 0 | 1 | 0 |
| 0 | 0 | 1 | 0 | 0 | 1 | 1 |
| 0 | 0 | 1 | 0 | 1 | 0 | 0 |
| 0 | 0 | 1 | 0 | 1 | 0 | 1 |
| 0 | 0 | 1 | 0 | 1 | 1 | 0 |
| 0 | 0 | 1 | 0 | 1 | 1 | 1 |
| 0 | 0 | 1 | 1 | 0 | 0 | 0 |
| 0 | 0 | 1 | 1 | 0 | 0 | 1 |
| 0 | 0 | 1 | 1 | 0 | 1 | 0 |
| 0 | 0 | 1 | 1 | 0 | 1 | 1 |
| 0 | 0 | 1 | 1 | 1 | 0 | 0 |
| 0 | 0 | 1 | 1 | 1 | 0 | 1 |
| 0 | 0 | 1 | 1 | 1 | 1 | 0 |
| 0 | 0 | 1 | 1 | 1 | 1 | 1 |
| 0 | 1 | 0 | 0 | 0 | 0 | 0 |
| 0 | 1 | 0 | 0 | 0 | 0 | 1 |
| 0 | 1 | 0 | 0 | 0 | 1 | 0 |
| 0 | 1 | 0 | 0 | 0 | 1 | 1 |
| 0 | 1 | 0 | 0 | 1 | 0 | 0 |
| 0 | 1 | 0 | 0 | 1 | 0 | 1 |
| 0 | 1 | 0 | 0 | 1 | 1 | 0 |
| 0 | 1 | 0 | 0 | 1 | 1 | 1 |
| 0 | 1 | 0 | 1 | 0 | 0 | 0 |
| 0 | 1 | 0 | 1 | 0 | 0 | 1 |
| 0 | 1 | 0 | 1 | 0 | 1 | 0 |
| 0 | 1 | 0 | 1 | 0 | 1 | 1 |
| 0 | 1 | 0 | 1 | 1 | 0 | 0 |
| 0 | 1 | 0 | 1 | 1 | 0 | 1 |
| 0 | 1 | 0 | 1 | 1 | 1 | 0 |
| 0 | 1 | 0 | 1 | 1 | 1 | 1 |
| 0 | 1 | 1 | 0 | 0 | 0 | 0 |
| 0 | 1 | 1 | 0 | 0 | 0 | 1 |
| 0 | 1 | 1 | 0 | 0 | 1 | 0 |
| 0 | 1 | 1 | 0 | 0 | 1 | 1 |
| 0 | 1 | 1 | 0 | 1 | 0 | 0 |
| 0 | 1 | 1 | 0 | 1 | 0 | 1 |
| 0 | 1 | 1 | 0 | 1 | 1 | 0 |

Matrix A (continued)

| | | | | | | |
|---|---|---|---|---|---|---|
| 0 | 1 | 1 | 0 | 1 | 1 | 1 |
| 0 | 1 | 1 | 1 | 0 | 0 | 0 |
| 0 | 1 | 1 | 1 | 0 | 0 | 1 |
| 0 | 1 | 1 | 1 | 0 | 1 | 0 |
| 0 | 1 | 1 | 1 | 0 | 1 | 1 |
| 0 | 1 | 1 | 1 | 1 | 0 | 0 |
| 0 | 1 | 1 | 1 | 1 | 0 | 1 |
| 0 | 1 | 1 | 1 | 1 | 1 | 0 |
| 0 | 1 | 1 | 1 | 1 | 1 | 1 |
| 1 | 0 | 0 | 0 | 0 | 0 | 0 |
| 1 | 0 | 0 | 0 | 0 | 0 | 1 |
| 1 | 0 | 0 | 0 | 0 | 1 | 0 |
| 1 | 0 | 0 | 0 | 0 | 1 | 1 |
| 1 | 0 | 0 | 0 | 1 | 0 | 0 |
| 1 | 0 | 0 | 0 | 1 | 0 | 1 |
| 1 | 0 | 0 | 0 | 1 | 1 | 0 |
| 1 | 0 | 0 | 0 | 1 | 1 | 1 |
| 1 | 0 | 0 | 1 | 0 | 0 | 0 |
| 1 | 0 | 0 | 1 | 0 | 0 | 1 |
| 1 | 0 | 0 | 1 | 0 | 1 | 0 |
| 1 | 0 | 0 | 1 | 0 | 1 | 1 |
| 1 | 0 | 0 | 1 | 1 | 0 | 0 |
| 1 | 0 | 0 | 1 | 1 | 0 | 1 |
| 1 | 0 | 0 | 1 | 1 | 1 | 0 |
| 1 | 0 | 0 | 1 | 1 | 1 | 1 |
| 1 | 0 | 1 | 0 | 0 | 0 | 0 |
| 1 | 0 | 1 | 0 | 0 | 0 | 1 |
| 1 | 0 | 1 | 0 | 0 | 1 | 0 |
| 1 | 0 | 1 | 0 | 0 | 1 | 1 |
| 1 | 0 | 1 | 0 | 1 | 0 | 0 |
| 1 | 0 | 1 | 0 | 1 | 0 | 1 |
| 1 | 0 | 1 | 0 | 1 | 1 | 0 |
| 1 | 0 | 1 | 0 | 1 | 1 | 1 |
| 1 | 0 | 1 | 1 | 0 | 0 | 0 |
| 1 | 0 | 1 | 1 | 0 | 0 | 1 |
| 1 | 0 | 1 | 1 | 0 | 1 | 0 |
| 1 | 0 | 1 | 1 | 0 | 1 | 1 |
| 1 | 0 | 1 | 1 | 1 | 0 | 0 |
| 1 | 0 | 1 | 1 | 1 | 0 | 1 |
| 1 | 0 | 1 | 1 | 1 | 1 | 0 |
| 1 | 0 | 1 | 1 | 1 | 1 | 1 |
| 1 | 1 | 0 | 0 | 0 | 0 | 0 |
| 1 | 1 | 0 | 0 | 0 | 0 | 1 |
| 1 | 1 | 0 | 0 | 0 | 1 | 0 |
| 1 | 1 | 0 | 0 | 0 | 1 | 1 |
| 1 | 1 | 0 | 0 | 1 | 0 | 0 |
| 1 | 1 | 0 | 0 | 1 | 0 | 1 |
| 1 | 1 | 0 | 0 | 1 | 1 | 0 |
| 1 | 1 | 0 | 0 | 1 | 1 | 1 |
| 1 | 1 | 0 | 1 | 0 | 0 | 0 |
| 1 | 1 | 0 | 1 | 0 | 0 | 1 |
| 1 | 1 | 0 | 1 | 0 | 1 | 0 |
| 1 | 1 | 0 | 1 | 0 | 1 | 1 |
| 1 | 1 | 0 | 1 | 1 | 0 | 0 |
| 1 | 1 | 0 | 1 | 1 | 0 | 1 |
| 1 | 1 | 0 | 1 | 1 | 1 | 0 |
| 1 | 1 | 0 | 1 | 1 | 1 | 1 |
| 1 | 1 | 1 | 0 | 0 | 0 | 0 |
| 1 | 1 | 1 | 0 | 0 | 0 | 1 |
| 1 | 1 | 1 | 0 | 0 | 1 | 0 |
| 1 | 1 | 1 | 0 | 0 | 1 | 1 |
| 1 | 1 | 1 | 0 | 1 | 0 | 0 |
| 1 | 1 | 1 | 0 | 1 | 0 | 1 |
| 1 | 1 | 1 | 0 | 1 | 1 | 0 |
| 1 | 1 | 1 | 0 | 1 | 1 | 1 |
| 1 | 1 | 1 | 1 | 0 | 0 | 0 |
| 1 | 1 | 1 | 1 | 0 | 0 | 1 |
| 1 | 1 | 1 | 1 | 0 | 1 | 0 |
| 1 | 1 | 1 | 1 | 0 | 1 | 1 |
| 1 | 1 | 1 | 1 | 1 | 0 | 0 |
| 1 | 1 | 1 | 1 | 1 | 0 | 1 |
| 1 | 1 | 1 | 1 | 1 | 1 | 0 |
| 1 | 1 | 1 | 1 | 1 | 1 | 1 |

Matrix G

| | | | | | | | | | | | |
|---|---|---|---|---|---|---|---|---|---|---|---|
| 1 | 0 | 0 | 0 | 0 | 0 | 0 | 1 | 1 | 0 | 0 | 1 |
| 0 | 1 | 0 | 0 | 0 | 0 | 0 | 1 | 0 | 1 | 0 | 1 |
| 0 | 0 | 1 | 0 | 0 | 0 | 0 | 0 | 1 | 1 | 0 | 1 |
| 0 | 0 | 0 | 1 | 0 | 0 | 0 | 1 | 1 | 1 | 0 | 0 |
| 0 | 0 | 0 | 0 | 1 | 0 | 0 | 1 | 0 | 0 | 1 | 1 |
| 0 | 0 | 0 | 0 | 0 | 1 | 0 | 0 | 1 | 0 | 1 | 1 |
| 0 | 0 | 0 | 0 | 0 | 0 | 1 | 1 | 1 | 0 | 1 | 0 |

Matrix D

| | | | | | | | | | | | |
|---|---|---|---|---|---|---|---|---|---|---|---|
| 0 | 0 | 0 | 0 | 0 | 0 | 0 | 0 | 0 | 0 | 0 | 0 |
| 0 | 0 | 0 | 0 | 0 | 0 | 1 | 1 | 1 | 0 | 1 | 0 |
| 0 | 0 | 0 | 0 | 0 | 1 | 0 | 0 | 1 | 0 | 1 | 1 |
| 0 | 0 | 0 | 0 | 1 | 1 | 1 | 0 | 0 | 0 | 0 | 1 |
| 0 | 0 | 0 | 0 | 1 | 0 | 0 | 1 | 0 | 0 | 1 | 1 |
| 0 | 0 | 0 | 0 | 1 | 0 | 1 | 0 | 1 | 0 | 0 | 1 |
| 0 | 0 | 0 | 0 | 1 | 1 | 0 | 1 | 1 | 0 | 0 | 0 |
| 0 | 0 | 0 | 0 | 1 | 1 | 1 | 0 | 0 | 0 | 1 | 0 |
| 0 | 0 | 0 | 1 | 0 | 0 | 1 | 1 | 1 | 0 | 0 | 0 |
| 0 | 0 | 0 | 1 | 0 | 0 | 1 | 0 | 0 | 1 | 1 | 0 |
| 0 | 0 | 0 | 1 | 0 | 1 | 0 | 1 | 0 | 1 | 1 | 1 |
| 0 | 0 | 0 | 1 | 0 | 1 | 1 | 1 | 0 | 1 | 0 | 1 |
| 0 | 0 | 0 | 1 | 1 | 0 | 0 | 1 | 1 | 1 | 1 | 1 |
| 0 | 0 | 0 | 1 | 1 | 0 | 1 | 1 | 0 | 1 | 0 | 1 |
| 0 | 0 | 0 | 1 | 1 | 1 | 0 | 0 | 1 | 1 | 1 | 0 |
| 0 | 0 | 0 | 1 | 1 | 1 | 1 | 1 | 1 | 1 | 1 | 0 |
| 0 | 0 | 1 | 0 | 0 | 0 | 0 | 1 | 1 | 0 | 1 | 1 |
| 0 | 0 | 1 | 0 | 0 | 0 | 1 | 1 | 0 | 1 | 1 | 1 |
| 0 | 0 | 1 | 0 | 0 | 1 | 0 | 0 | 1 | 1 | 1 | 0 |
| 0 | 0 | 1 | 0 | 0 | 1 | 1 | 1 | 1 | 0 | 0 | 0 |
| 0 | 0 | 1 | 0 | 1 | 0 | 1 | 1 | 1 | 1 | 1 | 0 |
| 0 | 0 | 1 | 0 | 1 | 0 | 1 | 0 | 0 | 1 | 0 | 0 |
| 0 | 0 | 1 | 0 | 1 | 1 | 0 | 1 | 0 | 1 | 0 | 1 |
| 0 | 0 | 1 | 0 | 1 | 1 | 1 | 1 | 1 | 1 | 1 | 1 |
| 0 | 0 | 1 | 1 | 0 | 0 | 1 | 0 | 0 | 0 | 1 | 1 |
| 0 | 0 | 1 | 1 | 0 | 0 | 1 | 0 | 1 | 0 | 1 | 1 |
| 0 | 0 | 1 | 1 | 0 | 1 | 0 | 1 | 1 | 0 | 1 | 0 |
| 0 | 0 | 1 | 1 | 0 | 1 | 1 | 0 | 0 | 0 | 0 | 0 |
| 0 | 0 | 1 | 1 | 1 | 0 | 0 | 0 | 0 | 1 | 0 | 0 |
| 0 | 0 | 1 | 1 | 1 | 0 | 1 | 1 | 0 | 0 | 0 | 0 |
| 0 | 0 | 1 | 1 | 1 | 1 | 0 | 1 | 0 | 0 | 1 | 0 |
| 0 | 0 | 1 | 1 | 1 | 1 | 1 | 0 | 1 | 0 | 1 | 1 |
| 0 | 1 | 0 | 0 | 0 | 0 | 1 | 0 | 1 | 1 | 1 | 1 |
| 0 | 1 | 0 | 0 | 0 | 0 | 1 | 0 | 1 | 1 | 1 | 0 |
| 0 | 1 | 0 | 0 | 0 | 1 | 0 | 1 | 1 | 1 | 1 | 0 |
| 0 | 1 | 0 | 0 | 0 | 1 | 1 | 0 | 0 | 1 | 0 | 0 |
| 0 | 1 | 0 | 0 | 1 | 0 | 0 | 0 | 1 | 1 | 0 | 0 |
| 0 | 1 | 0 | 0 | 1 | 0 | 1 | 1 | 1 | 0 | 0 | 0 |
| 0 | 1 | 0 | 0 | 1 | 1 | 0 | 0 | 1 | 1 | 0 | 1 |
| 0 | 1 | 0 | 0 | 1 | 1 | 1 | 1 | 0 | 1 | 1 | 1 |
| 0 | 1 | 0 | 1 | 0 | 0 | 0 | 0 | 0 | 1 | 0 | 1 |
| 0 | 1 | 0 | 1 | 0 | 0 | 1 | 1 | 0 | 0 | 1 | 1 |
| 0 | 1 | 0 | 1 | 0 | 1 | 0 | 0 | 0 | 1 | 0 | 0 |
| 0 | 1 | 0 | 1 | 0 | 1 | 1 | 1 | 0 | 0 | 1 | 0 |
| 0 | 1 | 0 | 1 | 1 | 0 | 1 | 0 | 0 | 0 | 0 | 1 |
| 0 | 1 | 0 | 1 | 1 | 1 | 0 | 1 | 0 | 1 | 0 | 1 |
| 0 | 1 | 0 | 1 | 1 | 1 | 1 | 0 | 1 | 0 | 1 | 1 |
| 0 | 1 | 1 | 0 | 0 | 0 | 1 | 0 | 1 | 0 | 0 | 0 |
| 0 | 1 | 1 | 0 | 0 | 1 | 0 | 0 | 0 | 1 | 1 | 0 |
| 0 | 1 | 1 | 0 | 0 | 1 | 0 | 1 | 0 | 0 | 1 | 1 |
| 0 | 1 | 1 | 0 | 1 | 0 | 1 | 0 | 0 | 1 | 0 | 1 |
| 0 | 1 | 1 | 0 | 1 | 0 | 0 | 1 | 0 | 1 | 1 | 1 |
| 0 | 1 | 1 | 0 | 1 | 0 | 1 | 0 | 0 | 0 | 0 | 0 |
| 0 | 1 | 1 | 0 | 1 | 1 | 1 | 1 | 0 | 1 | 0 | 0 |
| 0 | 1 | 1 | 1 | 0 | 0 | 0 | 0 | 1 | 0 | 1 | 0 |
| 0 | 1 | 1 | 1 | 0 | 0 | 1 | 1 | 1 | 1 | 1 | 0 |
| 0 | 1 | 1 | 1 | 1 | 0 | 0 | 1 | 0 | 0 | 1 | 1 |
| 0 | 1 | 1 | 1 | 1 | 0 | 1 | 0 | 1 | 0 | 1 | 1 |

-continued

Matrix D

| | | | | | | | | | | | |
|---|---|---|---|---|---|---|---|---|---|---|---|
| 0 | 1 | 1 | 1 | 1 | 1 | 0 | 1 | 1 | 1 | 0 | 0 |
| 0 | 1 | 1 | 1 | 1 | 1 | 1 | 0 | 0 | 1 | 1 | 0 |
| 1 | 0 | 0 | 0 | 0 | 0 | 0 | 1 | 1 | 0 | 0 | 1 |
| 1 | 0 | 0 | 0 | 0 | 0 | 1 | 0 | 0 | 0 | 1 | 1 |
| 1 | 0 | 0 | 0 | 0 | 1 | 0 | 1 | 0 | 0 | 1 | 0 |
| 1 | 0 | 0 | 0 | 0 | 1 | 1 | 0 | 1 | 0 | 0 | 0 |
| 1 | 0 | 0 | 0 | 1 | 0 | 0 | 0 | 1 | 0 | 1 | 0 |
| 1 | 0 | 0 | 0 | 1 | 0 | 1 | 1 | 0 | 0 | 0 | 0 |
| 1 | 0 | 0 | 0 | 1 | 1 | 0 | 0 | 0 | 0 | 0 | 1 |
| 1 | 0 | 0 | 0 | 1 | 1 | 1 | 1 | 0 | 1 | 0 | 1 |
| 1 | 0 | 0 | 1 | 0 | 0 | 0 | 0 | 0 | 1 | 0 | 1 |
| 1 | 0 | 0 | 1 | 0 | 0 | 1 | 1 | 1 | 1 | 1 | 1 |
| 1 | 0 | 0 | 1 | 0 | 1 | 0 | 0 | 1 | 1 | 1 | 0 |
| 1 | 0 | 0 | 1 | 0 | 1 | 1 | 0 | 1 | 0 | 0 | 1 |
| 1 | 0 | 0 | 1 | 1 | 0 | 0 | 1 | 0 | 1 | 1 | 0 |
| 1 | 0 | 0 | 1 | 1 | 0 | 1 | 0 | 1 | 1 | 0 | 0 |
| 1 | 0 | 0 | 1 | 1 | 1 | 0 | 1 | 1 | 1 | 0 | 1 |
| 1 | 0 | 0 | 1 | 1 | 1 | 1 | 0 | 0 | 1 | 1 | 0 |
| 1 | 0 | 1 | 0 | 0 | 0 | 0 | 1 | 0 | 1 | 0 | 0 |
| 1 | 0 | 1 | 0 | 0 | 0 | 1 | 0 | 1 | 1 | 1 | 0 |
| 1 | 0 | 1 | 0 | 0 | 1 | 0 | 1 | 1 | 1 | 1 | 1 |
| 1 | 0 | 1 | 0 | 0 | 1 | 1 | 0 | 0 | 1 | 0 | 1 |
| 1 | 0 | 1 | 0 | 1 | 0 | 0 | 0 | 0 | 1 | 1 | 0 |
| 1 | 0 | 1 | 0 | 1 | 0 | 1 | 1 | 1 | 1 | 0 | 1 |
| 1 | 0 | 1 | 0 | 1 | 1 | 0 | 0 | 1 | 1 | 0 | 0 |
| 1 | 0 | 1 | 0 | 1 | 1 | 1 | 1 | 0 | 1 | 1 | 0 |
| 1 | 0 | 1 | 1 | 0 | 0 | 0 | 1 | 0 | 0 | 0 | 0 |
| 1 | 0 | 1 | 1 | 0 | 0 | 1 | 1 | 0 | 0 | 1 | 1 |
| 1 | 0 | 1 | 1 | 0 | 1 | 1 | 1 | 1 | 0 | 0 | 1 |
| 1 | 0 | 1 | 1 | 1 | 0 | 0 | 1 | 0 | 0 | 1 | 1 |
| 1 | 0 | 1 | 1 | 1 | 0 | 1 | 0 | 0 | 0 | 0 | 1 |
| 1 | 0 | 1 | 1 | 1 | 1 | 0 | 1 | 0 | 0 | 0 | 0 |
| 1 | 0 | 1 | 1 | 1 | 1 | 1 | 0 | 1 | 0 | 1 | 0 |
| 1 | 1 | 0 | 0 | 0 | 0 | 0 | 0 | 1 | 1 | 0 | 0 |
| 1 | 1 | 0 | 0 | 0 | 0 | 1 | 1 | 0 | 1 | 1 | 0 |
| 1 | 1 | 0 | 0 | 0 | 1 | 0 | 0 | 0 | 1 | 1 | 1 |
| 1 | 1 | 0 | 0 | 0 | 1 | 1 | 1 | 1 | 1 | 0 | 1 |
| 1 | 1 | 0 | 0 | 1 | 0 | 0 | 1 | 1 | 1 | 1 | 1 |
| 1 | 1 | 0 | 0 | 1 | 0 | 1 | 0 | 0 | 1 | 0 | 1 |
| 1 | 1 | 0 | 0 | 1 | 1 | 0 | 1 | 0 | 1 | 0 | 0 |
| 1 | 1 | 0 | 0 | 1 | 1 | 1 | 0 | 1 | 1 | 1 | 0 |
| 1 | 1 | 0 | 1 | 0 | 0 | 0 | 1 | 0 | 0 | 0 | 0 |
| 1 | 1 | 0 | 1 | 0 | 0 | 1 | 0 | 1 | 0 | 1 | 0 |
| 1 | 1 | 0 | 1 | 0 | 1 | 0 | 1 | 1 | 0 | 1 | 1 |
| 1 | 1 | 0 | 1 | 0 | 1 | 1 | 0 | 0 | 0 | 0 | 1 |
| 1 | 1 | 0 | 1 | 1 | 0 | 0 | 0 | 0 | 0 | 1 | 1 |
| 1 | 1 | 0 | 1 | 1 | 0 | 1 | 1 | 1 | 0 | 0 | 1 |
| 1 | 1 | 0 | 1 | 1 | 1 | 0 | 0 | 1 | 0 | 0 | 0 |
| 1 | 1 | 0 | 1 | 1 | 1 | 1 | 0 | 0 | 1 | 0 | 0 |
| 1 | 1 | 1 | 0 | 0 | 0 | 0 | 0 | 0 | 0 | 0 | 1 |
| 1 | 1 | 1 | 0 | 0 | 0 | 1 | 1 | 1 | 0 | 1 | 1 |
| 1 | 1 | 1 | 0 | 0 | 1 | 0 | 0 | 1 | 0 | 1 | 0 |
| 1 | 1 | 1 | 0 | 0 | 1 | 1 | 0 | 0 | 0 | 0 | 0 |
| 1 | 1 | 1 | 0 | 1 | 0 | 0 | 1 | 0 | 0 | 0 | 0 |
| 1 | 1 | 1 | 0 | 1 | 0 | 1 | 1 | 0 | 0 | 0 | 1 |
| 1 | 1 | 1 | 0 | 1 | 1 | 0 | 0 | 0 | 1 | 1 | 0 |
| 1 | 1 | 1 | 1 | 0 | 0 | 1 | 1 | 1 | 0 | 1 | 1 |
| 1 | 1 | 1 | 1 | 0 | 1 | 0 | 0 | 1 | 1 | 0 | 1 |
| 1 | 1 | 1 | 1 | 0 | 1 | 1 | 0 | 1 | 0 | 1 | 0 |
| 1 | 1 | 1 | 1 | 1 | 0 | 0 | 0 | 1 | 1 | 1 | 0 |
| 1 | 1 | 1 | 1 | 1 | 0 | 1 | 0 | 0 | 1 | 0 | 0 |
| 1 | 1 | 1 | 1 | 1 | 1 | 0 | 0 | 0 | 1 | 0 | 1 |
| 1 | 1 | 1 | 1 | 1 | 1 | 1 | 1 | 1 | 1 | 1 | 1 |

Although linear block codes provide conveniences in the above application, combinatoric, random, and other types of codes, including linear codes, systematic codes, linear, systematic codes, and non-linear, non-systematic codes may also be employed in order to produce increased fault-tolerance, increased defect-tolerance, and increased ON and OFF state voltage or current separation. Techniques fabricating randomly interconnected address signal lines and addressed nanowires have been disclosed, for example, in U.S. Pat. No. 6,256,767. Using these techniques to interconnect a larger number of coded-address signal lines than the number of input address signal lines, where the voltage or current states of the supplemental address signal lines are derived by Boolean logic from the input address signal lines, produces an address space corresponding to a random, fixed length code, with very good expected minimum Hamming distances between addresses. However, a table-driven encoder needs to be used in order to encode input addresses into the coded address space. Encoders somewhat more complex than those used for the above-described linear-block-code-determined address spaces can be used to encode input addresses into coded addresses corresponding to a combinatoric code. As discussed above, combinatoric codes also provide minimum Hamming distances of at least 2, and even better average Hamming distances between codewords, and therefore may provide a reasonably high degree of fault tolerance and ON/OFF state voltage or current separation.

Method for Determining Nanoscale Electronic Interconnection Topologies

As discussed above, the mathematical techniques employed for linear block encoding and decoding can be used for constructing encoders and demultiplexers for interfacing microelectronic address signal lines to nanoelectronic circuits. However, there are many different possible linear block codes, having a variety of different ratios of supplemental (e.g. parity-check) symbols to information symbols. A designer of nanoscale interconnection interfaces needs to therefore consider various tradeoffs that arise when the number of supplemental address signal lines is increased to provide greater and greater levels of fault tolerance. On one hand, increasing the supplemental address signal lines increases the ability to uniquely address nanowires in the presence of nanowire-to-address-signal-line connection defects. However, increasing the number of supplemental address signal lines increases the cost of manufacture and increases the complexity, size, and cost of the encoders. Therefore, a designer or manufacturer of devices that include both nanoelectronic circuits and microelectronic circuits needs to select linear block codes, or other specification means, appropriate for the expected or observed connection defect probability in the devices, balancing the cost of supplemental address signal lines with the degree of increased fault-tolerance and defect tolerance obtained by adding the supplemental address signal lines.

One way to consider and quantify the costs and advantages associated with adding supplemental address signal lines is to determine a yield for the overall electronic circuit defined as the number of addressable memory bits per unit of chip area. The microelectronic circuits, at least in initial designs, make up the greatest part of a mixed nanoscale and microscale electronic circuit. When the area of the nanoelectronic circuitry is small compared to the total area of the mixed circuit, then the area of the mixed circuit is proportional to n, the number of address signal lines and supplemental address signal lines. The expected number of addressable bits per unit area is then given by the expression:

$$B_{C(k,s)} = \frac{k}{k+r}(P_{C(k,r)})^2$$

where the parenthesized subexpression $P_{C(k,r)}$, referred to below as $P_{OK}$, is the probability that a single nanowire is addressable when a code C(k,r) with k information bits and r supplemental bits is used.

Another way to consider the costs and benefits of supplemental address signal lines is to calculate the probability that a particular nanowire is addressable, despite the occurrence of interconnection defects. Consider two different nanowire addresses, c and d, generated as codewords in a linear-block code, as discussed above. The two addresses c and d will collide, due to defective connections, when address d is defective in all positions in which its address bits differ from those of address C. The probability of such address collisions is $p^{dist(c,d)}$, where p is the probability of a defective nanowire junction. Assuming that defects are statistically independent, the overall probability that address c is not disabled by any other address is given by the following expression:

$$P_{OK2} = \prod_{d \in C \setminus \{c\}} (1 - p^{dist(c,d)}) = \prod_{i=1}^{n} (1-p^i)^{W_C(i)}$$

where $W_C(i)$ denotes the number of codewords of Hamming weight i in the linear-block code C. The weight profiles of linear block codes are the number of codewords having each possible Hamming weight in the code. Table 1, below, provides the weight profiles for a number of codes and dominating sets (see below), obtained by enumeration:

Next, one can compute the probability of a nanowire not being disabled. Let e be the characteristic vector of an error pattern, where an element of e has the value "1" if there is a defective connection corresponding to the position of the element for a nanowire. The set of locations where $e_i$ has the value "1" is called the support of e. The error-pattern vector dominates an n-vector c if the support of e includes the support of c. An error pattern e on address zero disables address c if and only if e dominates C. If D(C) denotes the set D(C)={e|e dominates c for some c ∈C}, then the probability that e acting on address zero disables some other address is equal to Prob(e∈D(C)). The probability that address zero is disabled because it disables some other address is then given by:

$$P_{OK1} = 1 - Prob(e \in D(C)) = 1 - \sum_{i=1}^{n} W_{D(C)}(i) p^i (1-p)^{n-1}$$

Using the weight profiles in the above expressions $P_{OK1}$ and $P_{OK2}$, the overall probability of a nanowire remaining enabled is provided by the following expression:

$$P_{OK} = P_{OK1} P_{OK2}$$

Figure 27:
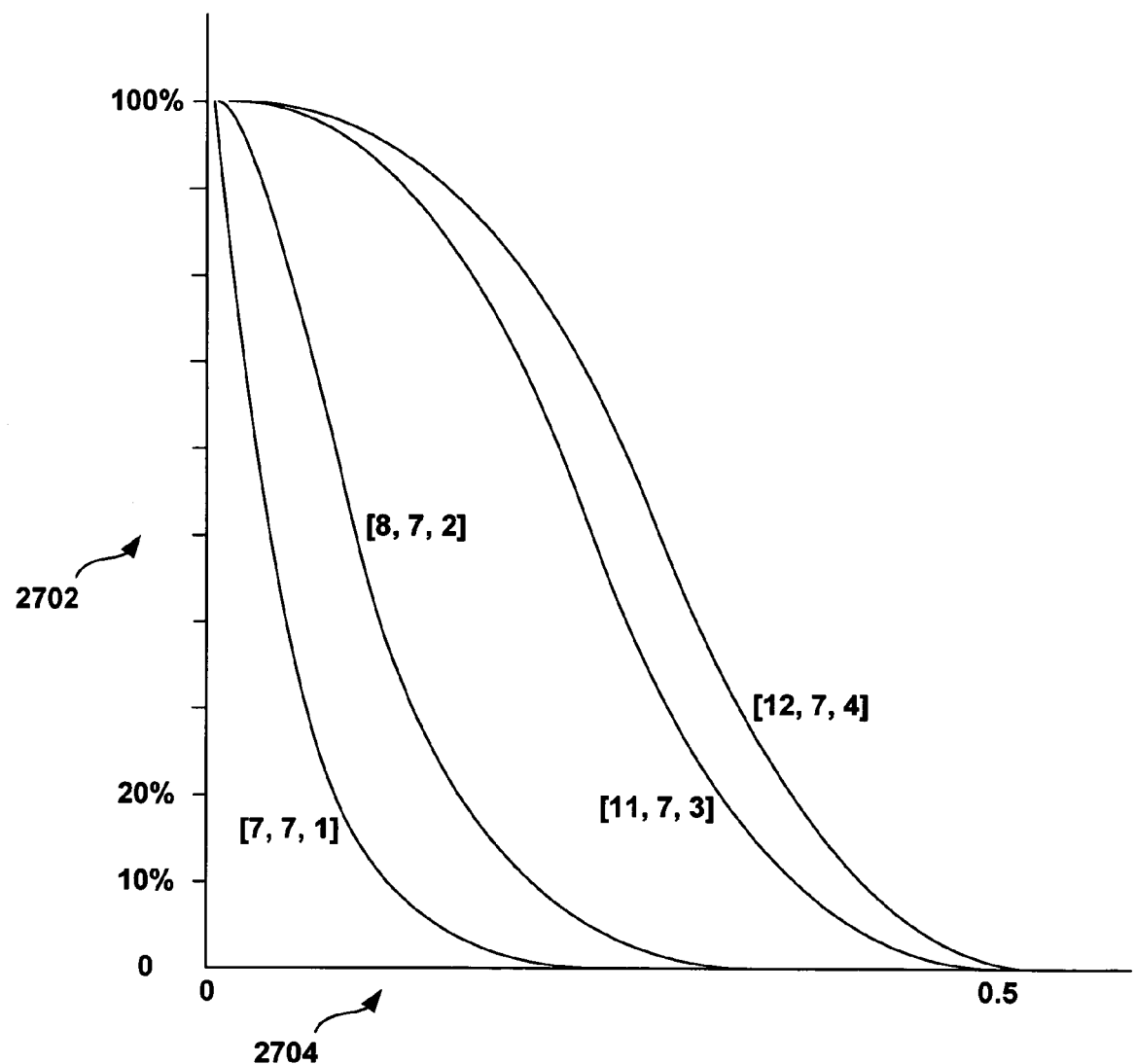
FIG. 27 shows a plot of the normalized expected number of addressable bits per unit area plotted against the defect rate for a 16K-bit cross-point memory using no supplemental address signal lines and using a number of different linear-block codes for specifying different numbers of supplemental address signal lines.

FIG. 27 shows plots of an expected addressable percentage of nanowires versus a probability of open connections for a nanoscale interconnection interface having no supplemental address signal lines and nanoscale interconnection interfaces designed using various linear block codes to specify different numbers of supplemental address signal lines. In FIG. 27, the vertical axis 2702 represents the expected percentage of addressable nanowires, and the horizontal axis 2704 represents the fractions of interconnections between a nanowire and an address signal line that are defective, or open. Note that, as the number of coded address signal lines increases, the expected percentage of addressable nanowires also increases.

Figure 28:
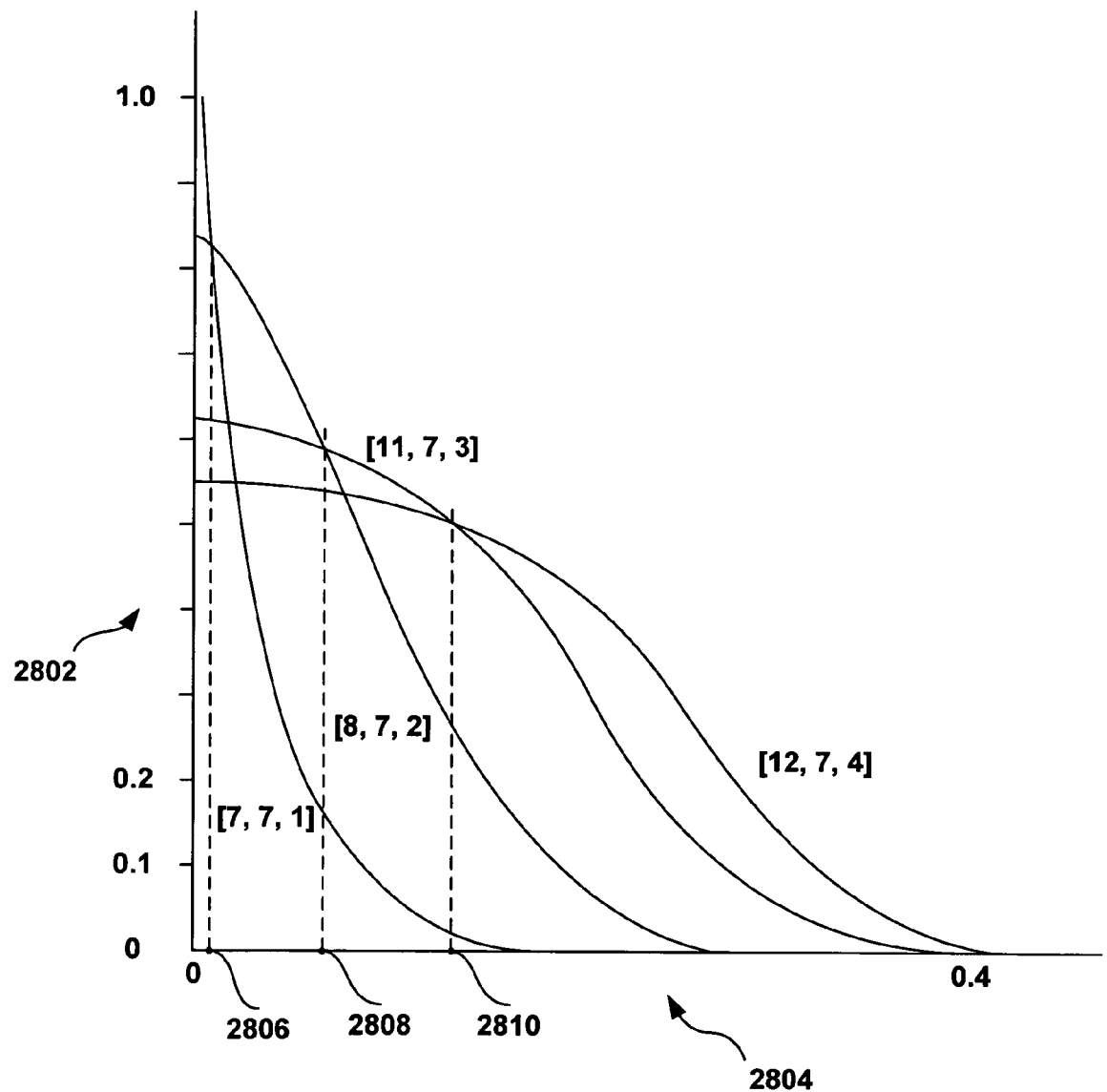
FIG. 28 shows plots of an expected addressable percentage of nanowires versus a probability of open connections for a nanoscale interconnection interface having no supplemental address signal lines and nanoscale interconnection interfaces designed using various linear block codes to specify different numbers of supplemental address signal lines.

FIG. 28 shows a plot of the normalized expected number of addressable bits per unit area plotted against the defect rate for a 16K-bit cross-point memory using no supplemental address signal lines and using a number of different linear-block codes for specifying different numbers of supplemental address signal lines. In FIG. 28, the normalized expected number of addressable bits per unit area ranges from 0 to 1.0 along the vertical axis 2802. The defect ratio, expressed as the fraction of defects in the demultiplexer, in this case, the fraction of open connections, is plotted along the horizontal axis 2804, ranging from 0 to 0.4. The curves in FIG. 28 are labeled with the linear-block code specification for the linear block code used to construct the encoders and demultiplexers. At extremely low fractions of defective connections, below point 2806 of the horizontal axis, the uncoded, or no-supplemental-address-signal-lines implementation, specified as [7,7,1], provides the highest number of addressable bits per area. Between the defective connection fraction specified by points 2806 and 2808, a [8,7,2] linear block code having a single supplemental address signal line produces the highest number of addressable bits per chip area. Between defective connection fractions specified by points 2808 and 2810, a [11,7,3] linear

| [n, k]| | [7, 7] | | [8, 7] | | [11, 7] | | [12, 7] | |
|---|---|---|---|---|---|---|---|---|
| I | $W_C(i)$ | $W_{D(C)}(i)$ | $W_C(i)$ | $W_{D(C)}(i)$ | $W_C(i)$ | $W_{D(C)}(i)$ | $W_C(I)$ | $W_{D(C)}(i)$ |
| 0 | 1 | 1 | 1 | 1 | 1 | 1 | 1 | 1 |
| 1 | 7 | 7 | 0 | 0 | 0 | 0 | 0 | 0 |
| 2 | 21 | 21 | 28 | 28 | 0 | 0 | 0 | 0 |
| 3 | 35 | 35 | 0 | 56 | 13 | 13 | 0 | 0 |
| 4 | 35 | 35 | 70 | 70 | 26 | 130 | 39 | 39 |
| 5 | 21 | 21 | 0 | 56 | 24 | 462 | 0 | 312 |
| 6 | 7 | 7 | 28 | 28 | 24 | 462 | 48 | 924 |
| 7 | 1 | 1 | 0 | 8 | 26 | 330 | 0 | 792 |
| 8 | 0 | 0 | 1 | 1 | 13 | 165 | 39 | 495 |
| 9 | 0 | 0 | 0 | 0 | 0 | 55 | 0 | 220 |
| 10 | 0 | 0 | 0 | 0 | 0 | 11 | 0 | 66 |
| 11 | 0 | 0 | 0 | 0 | 1 | 1 | 0 | 12 |
| 12 | 0 | 0 | 0 | 0 | 0 | 0 | 1 | 1 | block code providing four supplemental address signal lines provides the highest number of addressable bits per area, and above the defective connection fraction specified by point 2810, a [12,7,4] linear block code providing five supplemental address signal lines and a minimum Hamming distance of four provides the greatest expected number of addressable bits per unit area. Thus, different linear-block codes may be used to specify different numbers and encodings of supplemental address signal lines depending on the expected fraction of defective nanowire-to-address-signal-line connections. One may intentionally choose a larger set of supplemental codes if this dramatically lowers the cost of manufacturing the nanoscale multiplexers, by allowing a larger defect fraction to be tolerated Both yield and expected percentage of addressable nanowire calculations can be employed, along with cost functions, to compute the manufacturing costs of adding supplemental address signal lines to determine the optimal design for encoders and demultiplexers, or nanoscale interconnection interfaces. The above described methods are but a few of the possible approaches to quantifying the tradeoffs in advantages and disadvantages between different interconnection topologies, numbers of supplemental signal lines, different types of address coding, and other such variations and considerations. These methods are not necessarily constrained to select only one of a number of possible methodologies and topologies, but may also select various combinations of methodologies and topologies that confer greater advantages than can be obtained from a single method and topology.

Figure 29A:
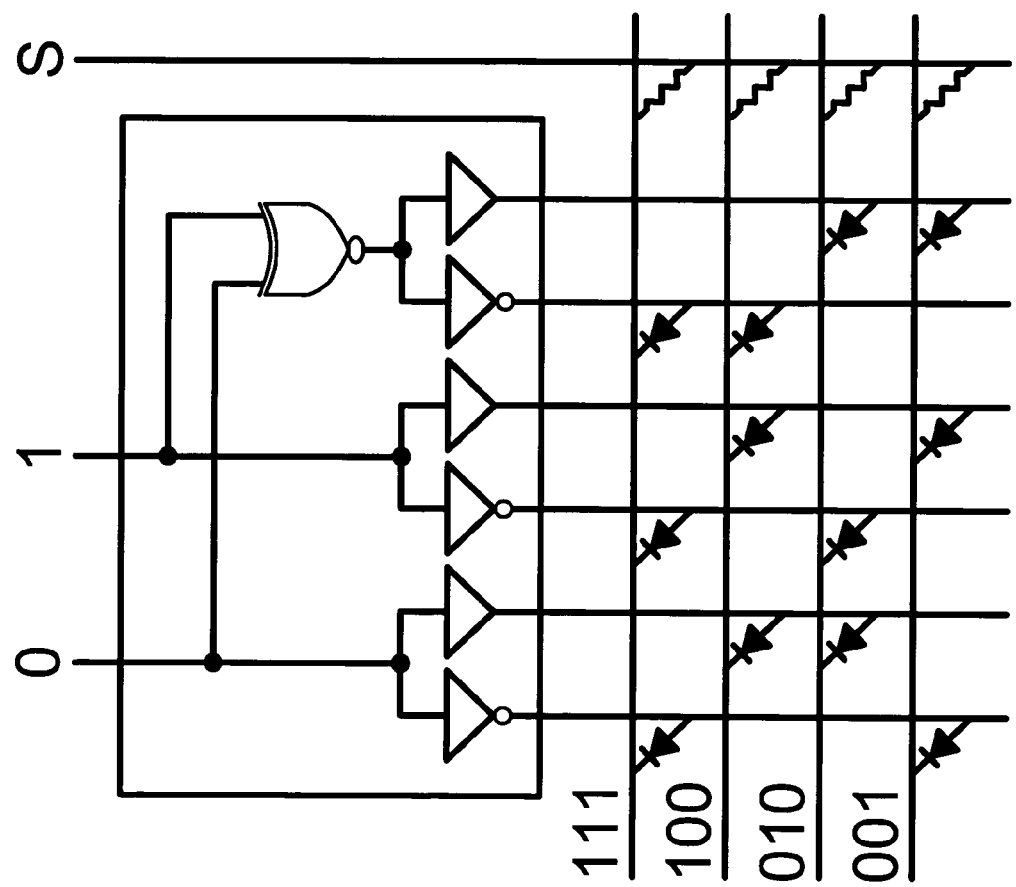
FIGS. 29A-B illustrate diode-based and equivalent transistor-based demultiplexers, similar to demultiplexers illustrated in previous figures.
Figure 29B:
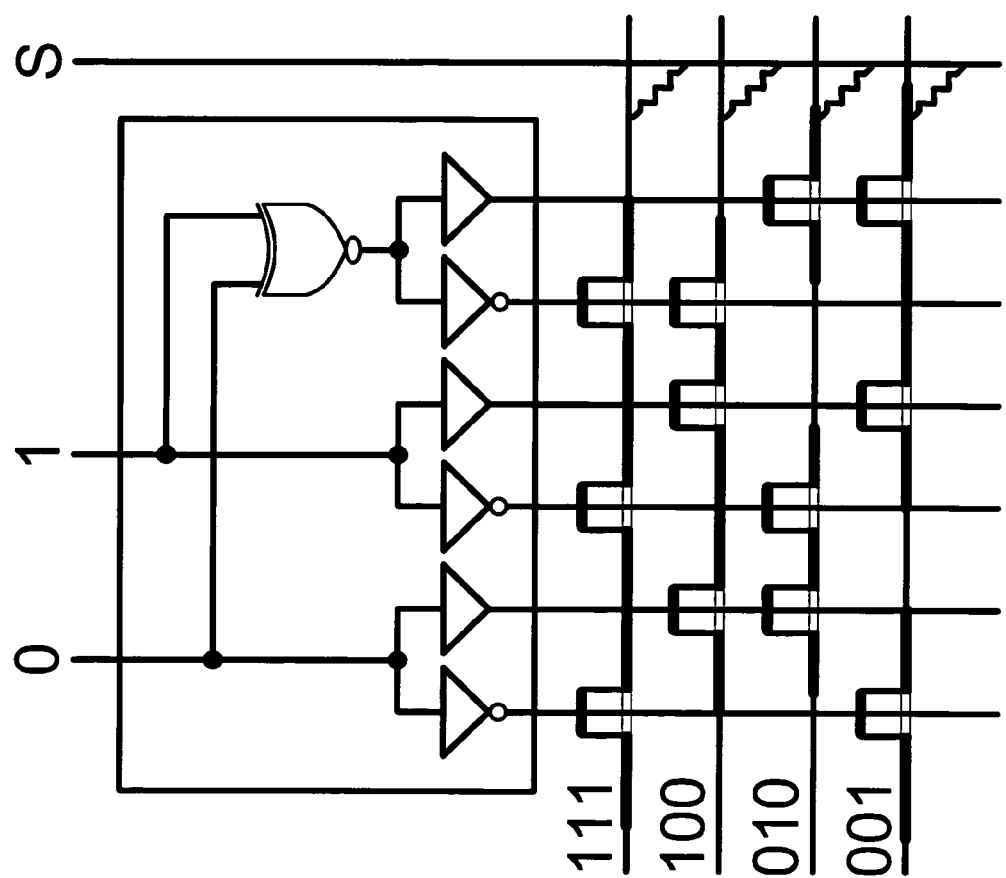

The technique of adding supplemental address signal lines to a minimal set of signal lines in order to ameliorate the occurrence of defective connections within a nanoscale interconnection interface has almost limitless variations and applications. For example, while resistor-based and diode-based interconnections are discussed above, the techniques of the present invention may also be applied to transistor-based interconnections, where, due to manufacturing imperfections and deficiencies, transistors may leak appreciable current in OFF states. In transistor-based interconnections, the fault tolerance, defect-tolerance, and ON/OFF state separation characteristics supplied by supplemental address signal lines are useful to produce good yields of nanoscale devices. FIGS. 29A-B illustrate diode-based and equivalent transitor-based demultiplexers, similar to demultiplexers illustrated in previous figures. Note that, in transistor-based circuits, the coded address signal lines gate the addressed signal lines, rather than supply current or voltage directly to the addressed signal lines.

Resistor-Logic Demultiplexers

Although diode-based demultiplexer circuits provide reasonable voltage margins and have other desirable characteristics for use in interconnecting microscale and sub-microscale circuitry with nanoscale circuitry, as discussed above, diode-based demultiplexers present certain problems, including having a limited current density, having a forward-biased voltage drop that is large in comparison with the logic voltages used for logic 0 and logic 1 states, and needing semiconductor signal lines, rather than lower-resistance metal signal lines. Because of these problems, and additional practical problems associated with manufacturing nanoscale diode components, resistor-based demultiplexers may prove, in many applications, to be desirable alternatives to diode-based demultiplexers.

Figure 30B:
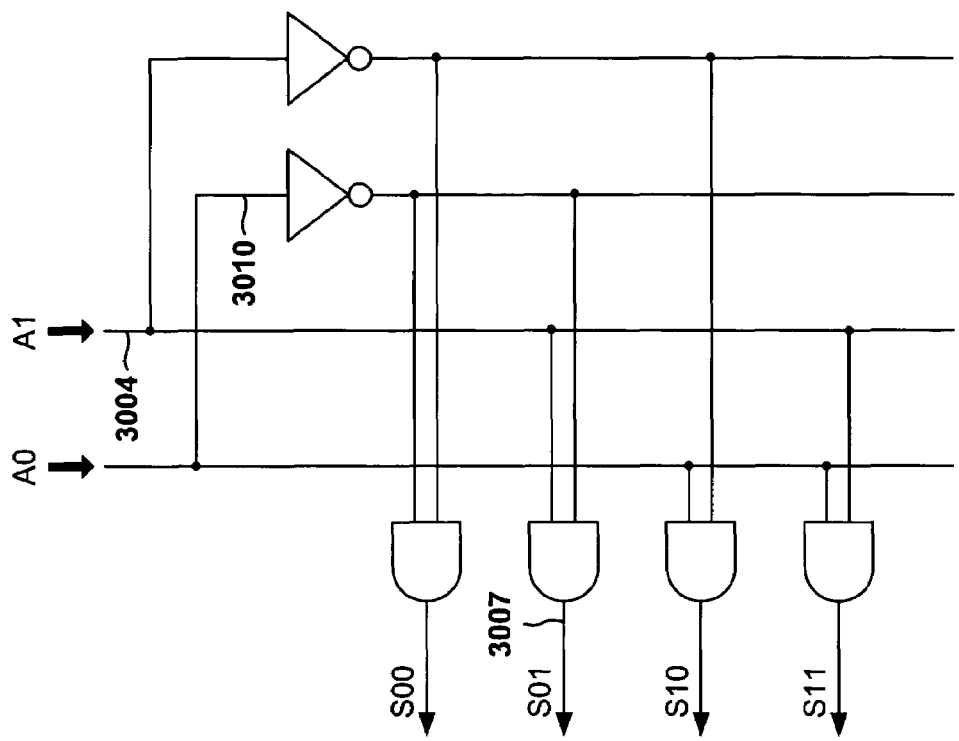
FIGS. 30A-B illustrate a simple resistor-based demultiplexer with microscale or sub-microscale input address lines interfacing to nanoscale signal lines.
Figure 30A:
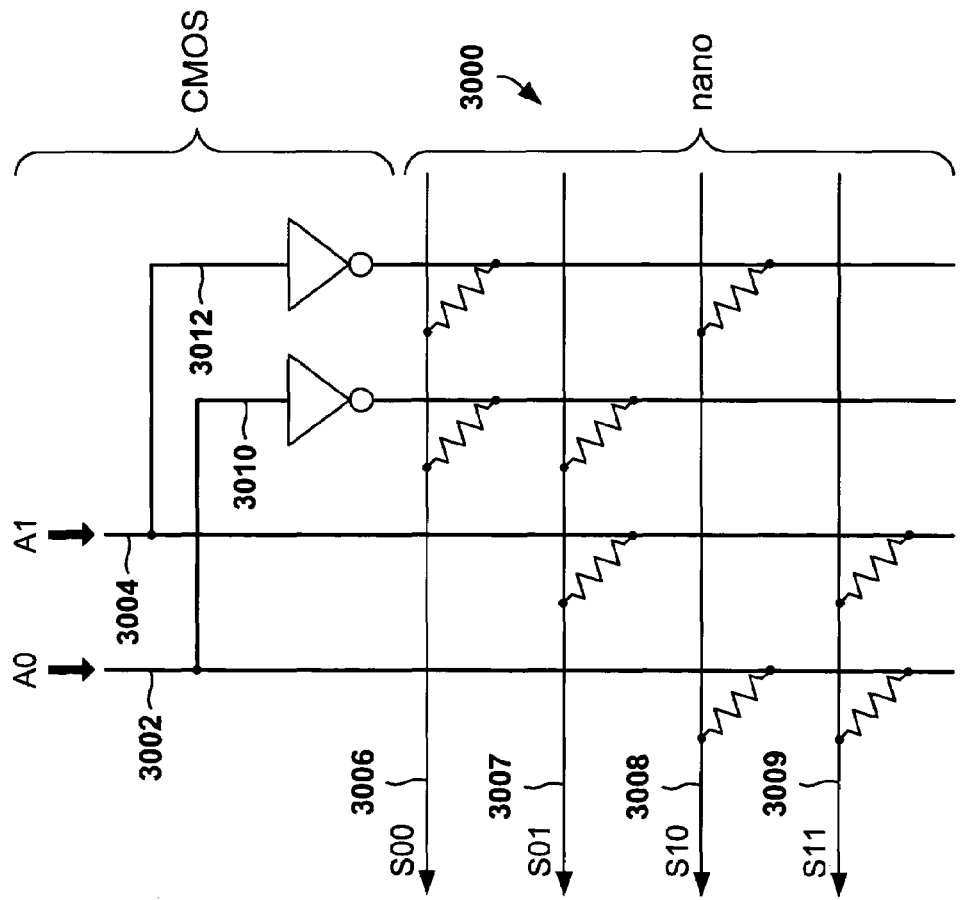

FIGS. 30A-B illustrate a simple resistor-based demultiplexer with microscale or sub-microscale input address lines interfacing to nanoscale signal lines. In FIG. 30A, two microscale or sub-microscale address lines A0 3002 and A1 3004 input to a crossbar demultiplexer 3000 comprise a two-bit input address which selects one of four nanoscale output signal lines: S00 3006, S01 3007, S10 3008, and S11 3009. The input address "01" (A0=0, A1=1), for example, selects nanoscale output signal line S01 3007 with a high-voltage, logic-state-1 output signal, and deselects the remaining nanoscale output signal lines with lower-voltage, logic-0 output signals. Both the input signal lines A0 3002 and A1 3004, and their complements $\neg$A0 3010 and $\neg$A1 3012, form the vertical microscale or sub-microscale signal lines in the crossbar demultiplexer 3000. When the address "01" is input to the address lines 3002 and 3004, vertical signal lines A1 3004 and $\neg$A0 3010 are high, while vertical signal lines A0 3002 and $\neg$A1 3012 are low. Each nanoscale output signal line 3006-3009 is interconnected through nanoscale resistive connectors with two of the four vertical microscale or sub-microscale signal lines 3002, 3004, 3010, and 3012. When the address "01" is input to the address lines 3002 and 3004, only output signal line S01 3007 is interconnected with the two high-voltage vertical signal lines A1 and $\neg$A0, so that only nanoscale output signal line S01 3007 has a voltage state approaching the high-voltage state applied to input address line A1 to represent input binary signal "01." The remaining nanoscale output signal lines S00, S10, and S11 have either intermediate voltage states or a ground voltage-state.

FIG. 30B shows a schematic representation of the resistor-based demultiplexer shown in FIG. 30A. The two nanoscale resistive connections, or nanoscale resistor connections, of each output signal line to two vertical address signal lines can be considered to be logical inputs to an AND gate producing an output signal line logic state. Output signal line S01 3007 is in a relatively high-voltage state when address lines A1 3004 and $\neg$A0 3010 are both high, as obtained when the binary address "01" is input to address lines A0 and A1, and is otherwise in an intermediate or low voltage state.

Figure 31A:
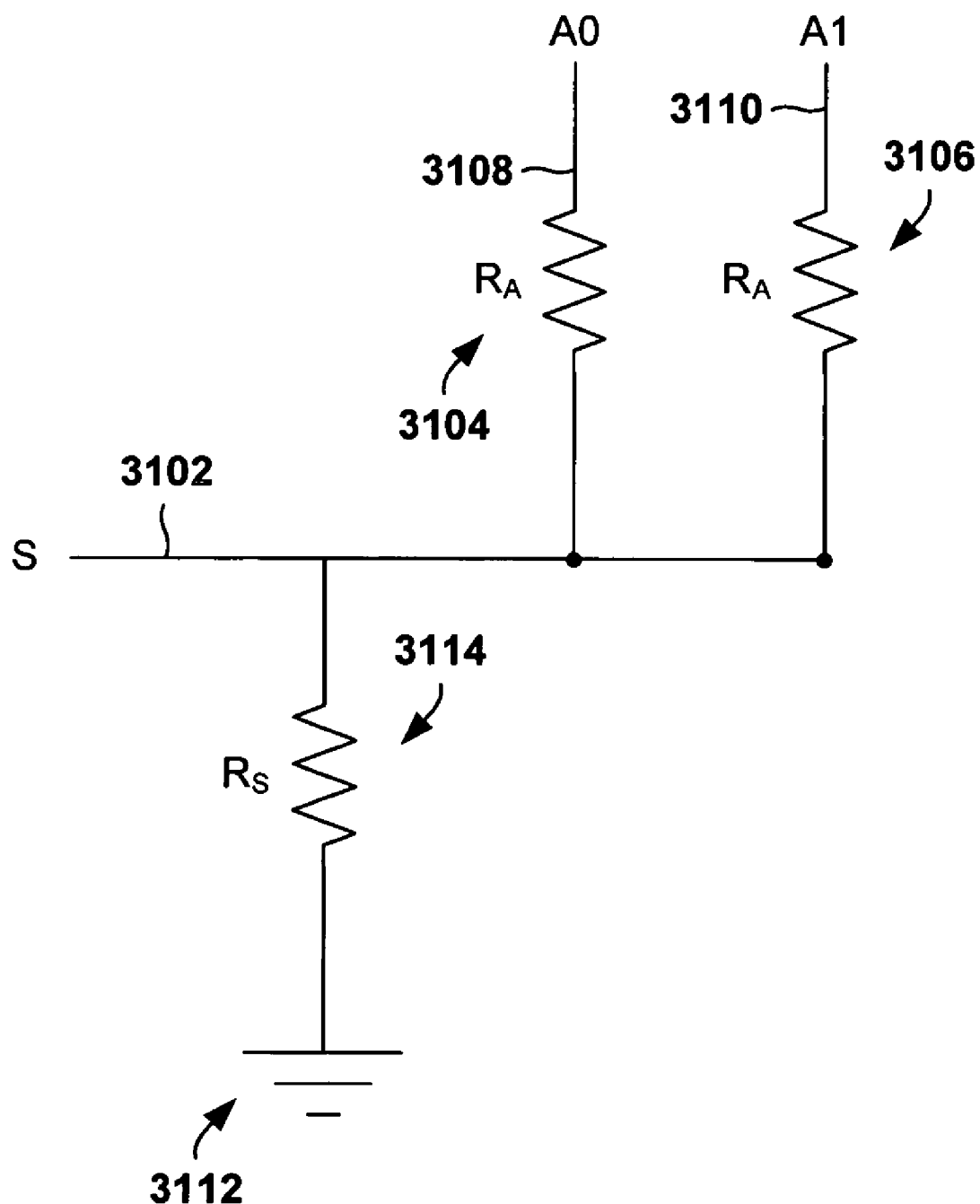
FIGS. 31A-D illustrate the various voltage states that appear on the nanoscale output signal lines of the resistor-based demultiplexer shown in FIG. 30A.

FIGS. 31A-D illustrate the various voltage states that appear on the nanoscale output signal lines of the resistor-based demultiplexer shown in FIG. 30A. In FIG. 31A, an output signal line 3102 is interconnected through resistor components 3104 and 3106 to input address lines A0 3108 and A1 3110. The nanoscale output signal line S 3102 is also interconnected to ground 3112 through an additional resistance 3114. The resistors 3104 and 3106 are shown, in FIGS. 31A-D, having a same resistance $R_A$, which corresponds to the resistance of the resistor components shown explicitly in FIG. 30A as well as the resistance of the address lines and nanoscale output signal line. The resistor 3114 is shown in FIGS. 31A-D to have a resistance $R_S$, representing the additional resistances presented by additional nanowires and components in the logic circuit that includes the resistor-based demultiplexer. In general, $R_S$ can be assumed to be significantly greater than $R_A$.

Figure 31B:
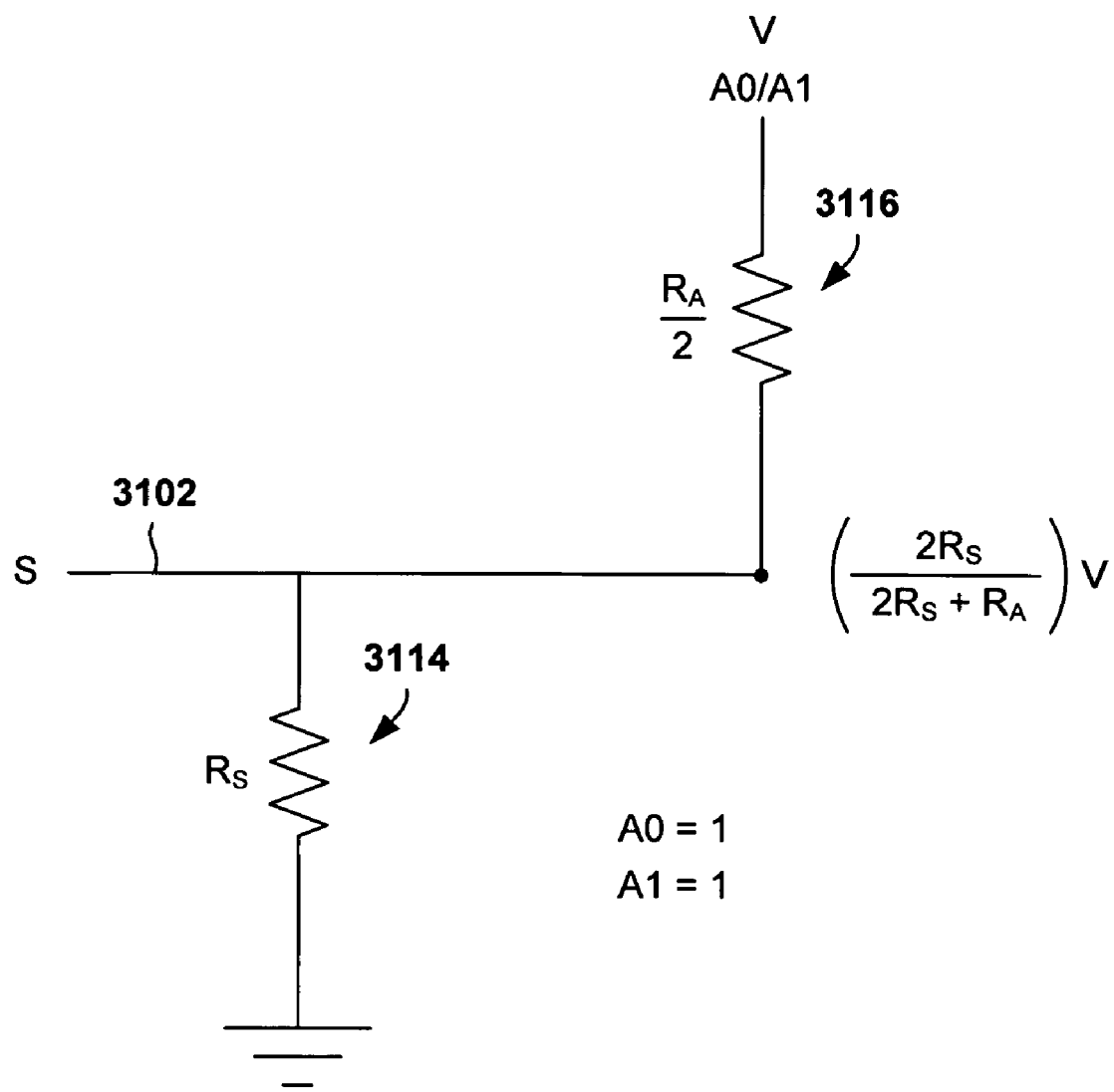

FIG. 31B shows the voltage state obtained on the nanoscale output signal line S 3102 when the output signal line is connected through two resistive connectors to two high-voltage address lines, at voltage $V_{in}$ as occurs when the nanoscale output signal line S is selected by an input binary address. In this case, the resistive elements connecting output signal line S to the two address signal lines are in parallel, and are equivalent to a single input address signal line at high voltage V interconnected to the output signal line S 3102 through a single resistor 3116 with resistance $$\frac{R_A}{2}.$$

The nanoscale output signal line S 3102 therefore represents a voltage divider between resistor 3116 and resistor 3114, and has voltage $$\frac{2R_S}{2R_S + R_A}.$$

When $R_S \gg R_A$, the nanoscale output signal line 3102 has a voltage state close to the input voltage V.

Figure 31C:
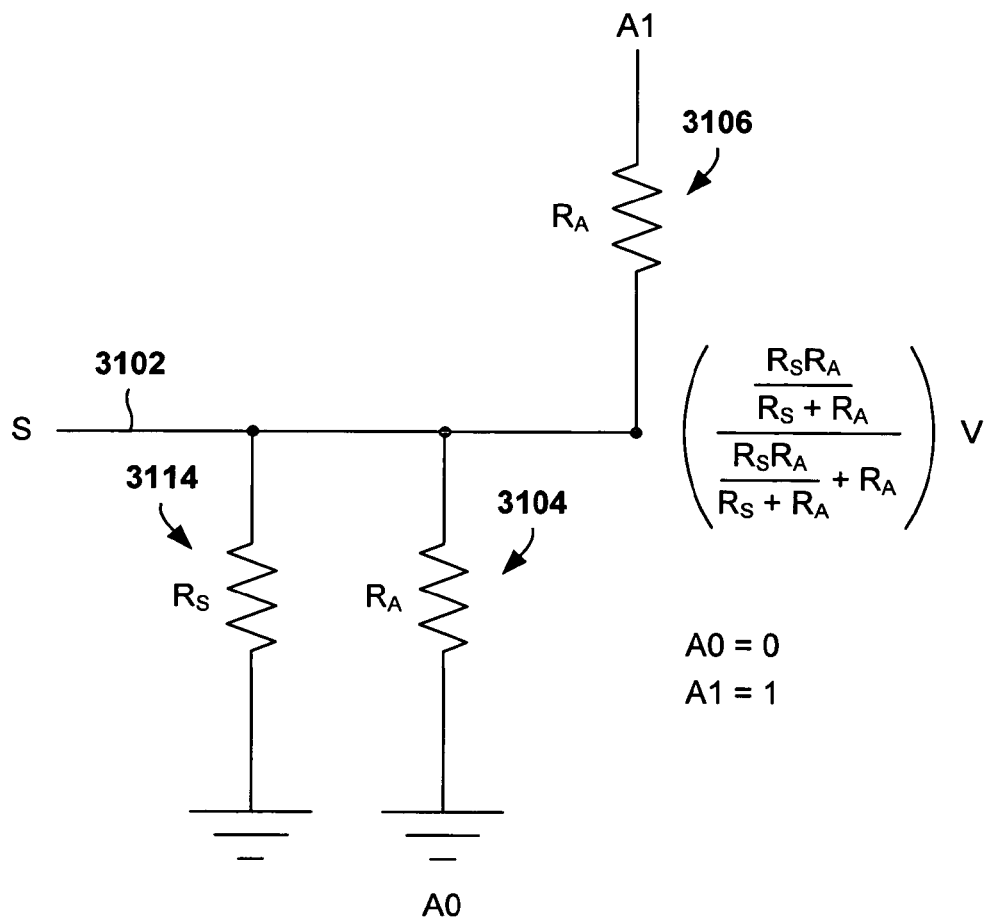

FIG. 31C shows the voltage state of the output signal line S 3102 when one address line is high, and the other address line is low, or grounded. In this case, the nanoscale output signal line S 3102 is a voltage divider between resistor 3106 with resistance $R_A$ and the two parallel resistors 3114 and 3104 with resistances $R_A$ and $R_S$. The voltage on the nanoscale output scale signal line 3102 is therefore:

$$\frac{\frac{R_S R_A}{R_S + R_A}}{\frac{R_S R_A}{R_S + R_A} + R_A}$$

The ratio of the voltage obtained when one address line is high and the other address line is low, as shown in FIG. 31C, divided by the voltage obtained when both address lines are high, as shown in FIG. 31B, is exactly 0.5. Therefore, when $R_S \gg R_A$, the voltage on nanoscale output signal line S 3102 when one address line is high and the other address line is low, as shown in FIG. 31C, is approximately $$\frac{V_{in}}{2}.$$

Figure 31D:
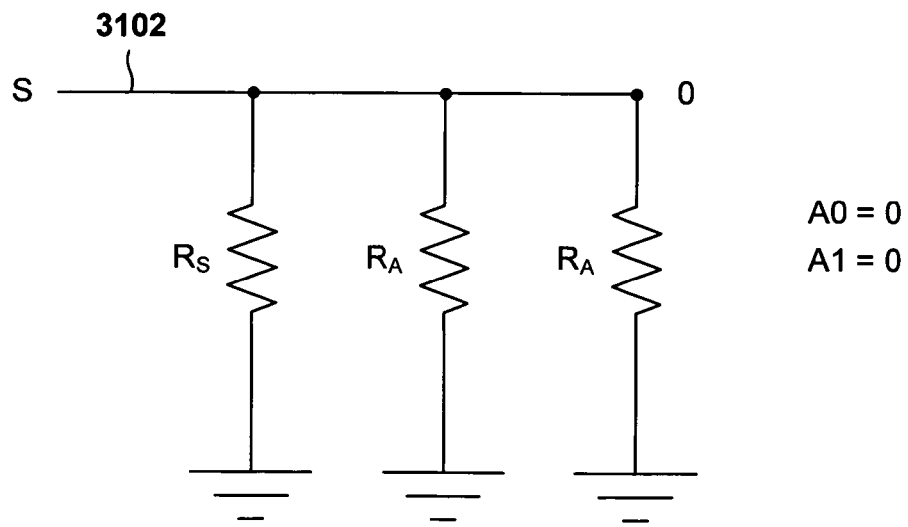

Finally, as shown in FIG. 31D, the voltage on output signal line S 3102 is 0, or ground, when both address signal lines are low.

FIG. 32 shows a table that summarizes the voltage states possible on a nanoscale output signal line S for the resistor-based demultiplexer shown in FIG. 30A when any particular two-bit address is input. When the address of the nanoscale output signal line S equals the input address, and the nanoscale output signal line is therefore selected by the demultiplexer, the output signal line is connected through two parallel resistors to the high-voltage source, and has a voltage state $V_{in}$ approximately equal to the high-voltage source, as shown in the last row 3202 of the table 3200 shown in FIG. 32. For a given input address, two of the non-selected output signal lines are connected through one resistor to a high-voltage source and through a second resistor to ground, resulting in an intermediate voltage state approximately equal to $$\frac{V_{in}}{2},$$

as shown in rows 3204 and 3206 of table 3200. Finally, one of the non-selected signal lines has a voltage of 0, as shown in row 3208 of table 3200, for any given input address.

Figure 33:
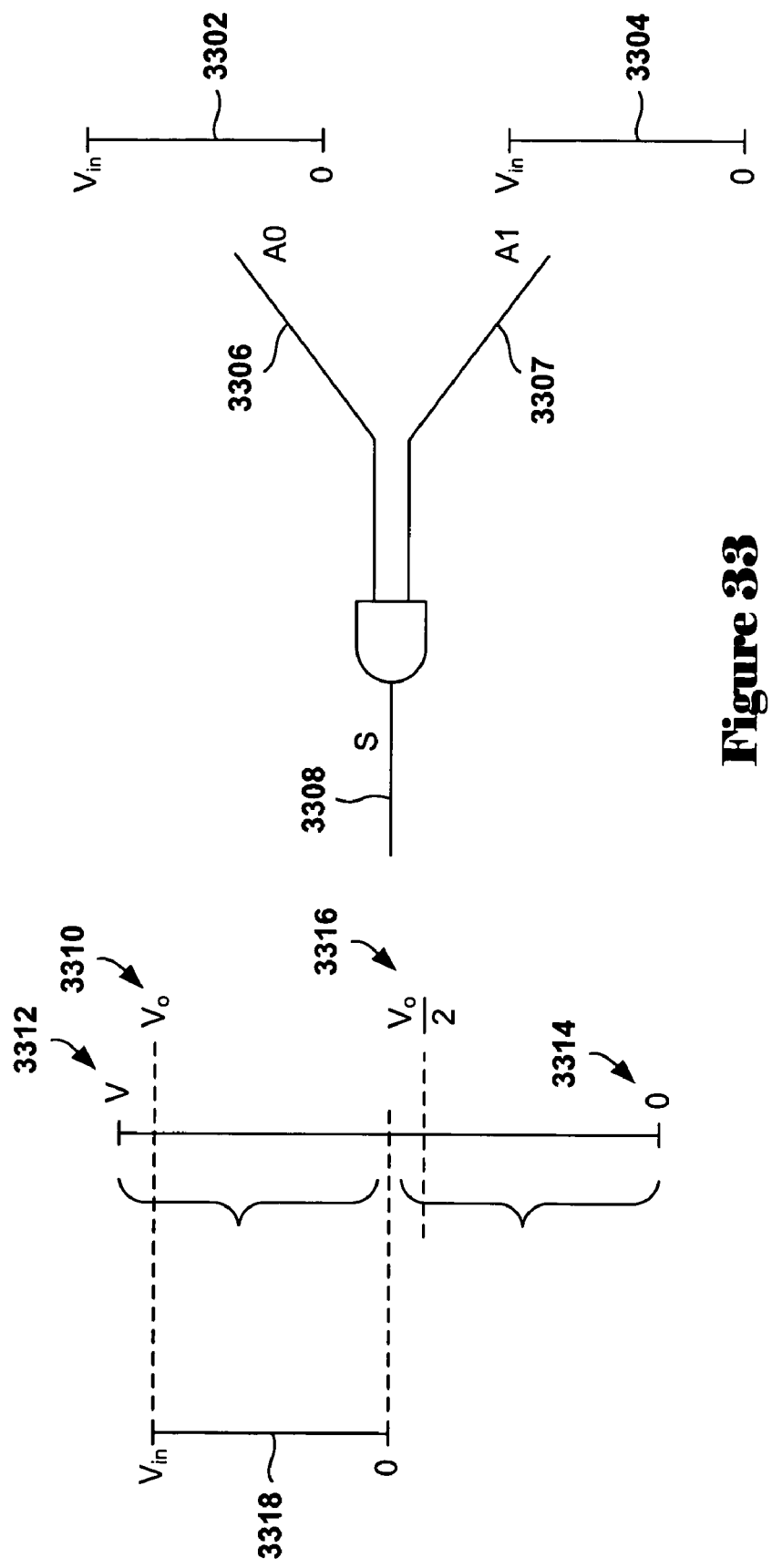
FIG. 33 summarizes the input and output voltage margins for a resistor-based demultiplexer, such as that shown in FIG. 30A.

FIG. 33 summarizes the input and output voltage margins for a resistor-based demultiplexer, such as that shown in FIG. 30A. The voltage margin, or difference between the high-voltage state corresponding to logic state "1" and the low-voltage state, or ground state, representing logic state "0," are represented in FIG. 33 by vertical lines, such as vertical line 3302. As shown in FIG. 33, the voltage margins 3302 and 3304 for the input signal lines A0 and A1 are identical, and represent the full logic-voltage margin available in the circuit. The voltage margin ranges from 0 to $V_{in}$. However, as discussed above with reference to FIGS. 31A-D, and as shown in FIG. 32, the output voltage on the output signal line 3308, $V_0$, 3310, is somewhat smaller than the input high-voltage $V_{in}$ 3312. Moreover, both the ground state 3314 and the voltage $$\frac{V_o}{2}$$

3316 correspond to logic state "0," the logic state corresponding to one or both of the input signals being low. Therefore, the new voltage margin 3318 produced by the resistor-based ANDing of inputs A0 3306 and A1 3307 is significantly smaller than the input voltage margins 3302 and 3304. In fact, the output voltage margin 3318 is somewhat less than ½ the input voltage margins. The resistor-based AND operation therefore compresses the input voltage margin by a factor, or compression ratio, somewhat greater than 2.

Figure 34A:
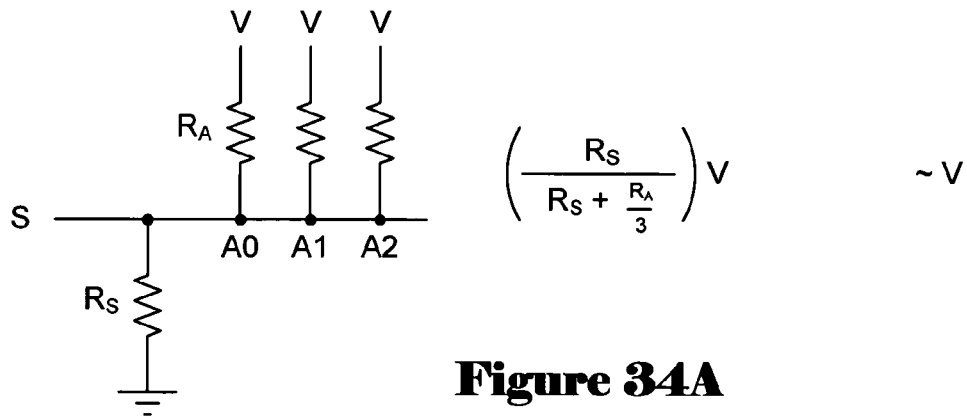
FIGS. 34A-D illustrate the output signal line voltages obtained in a 3-address-line demultiplexer, using the same illustration conventions as used in FIGS. 31A-D.
Figure 34B:
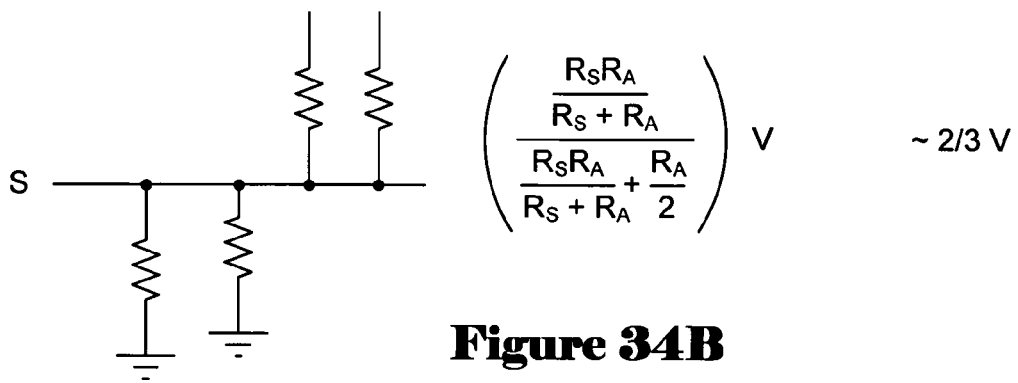
Figure 34C:
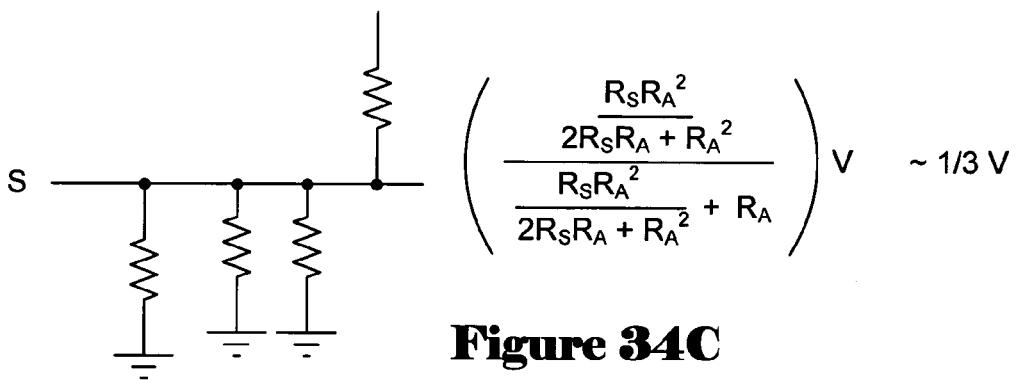
Figure 34D:
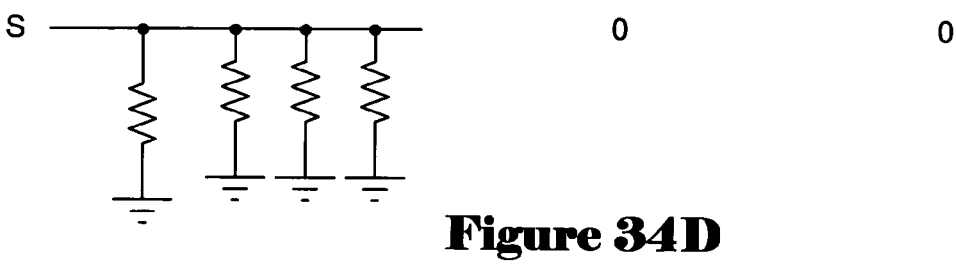
Figure 35:
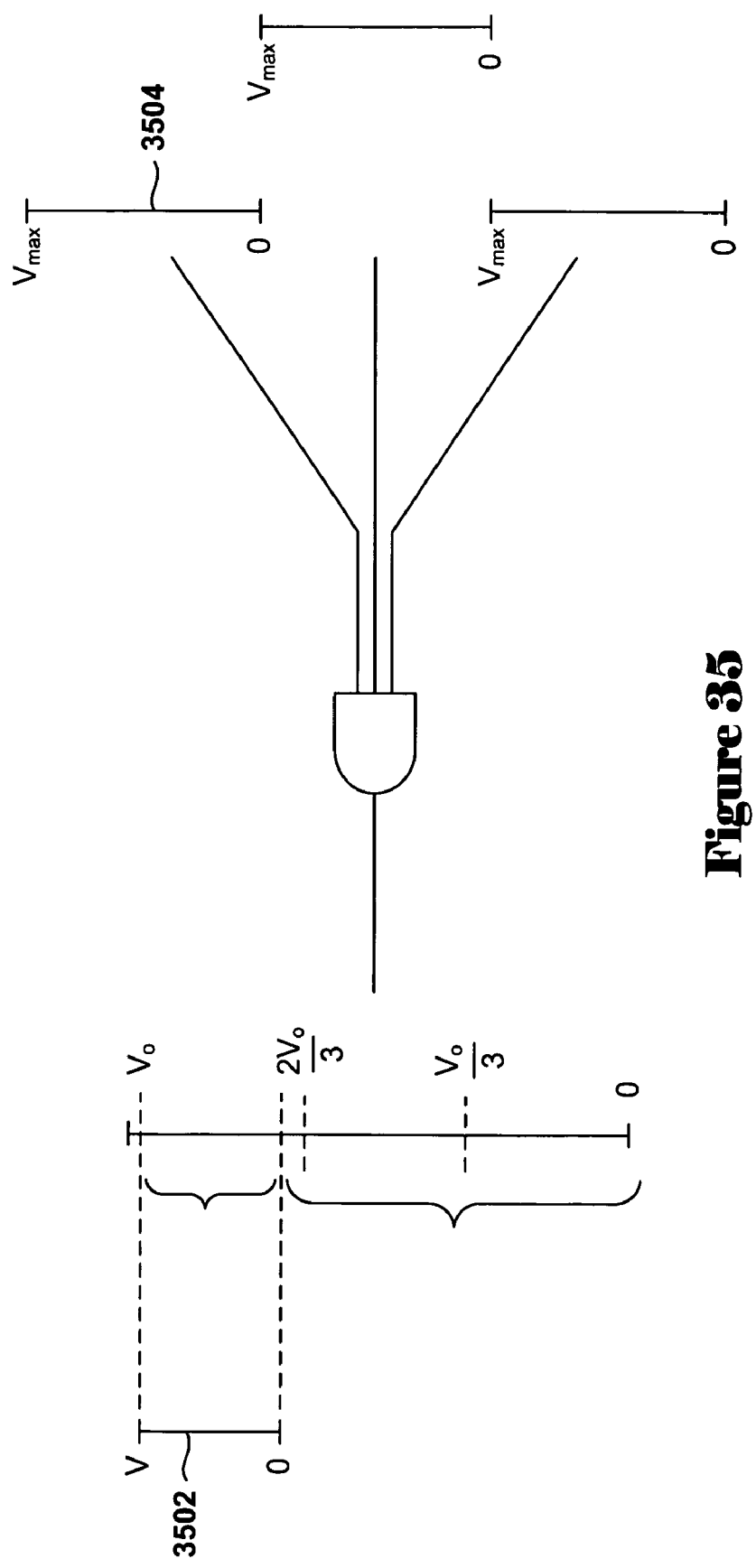
FIG. 35 shows the input and output voltage margins of a 3-address-line demultiplexer using the same illustration conventions as used in FIG. 33.

FIGS. 34A-D illustrate the output signal line voltages obtained in a 3-address-line demultiplexer, using the same illustration conventions as used in FIGS. 31A-D. In the case of a 3-address-line demultiplexer, the voltage output to a signal line is approximately equal to the input voltage $V_{in}$ when the output signal line is selected, as shown in FIG. 34A, and is otherwise one of $$\frac{2V_{in}}{3}, \frac{V_{in}}{3},$$

and 0, depending on the input address and the address of the output signal line. FIG. 35 shows the input and output voltage margins of a 3-address-line demultiplexer using the same illustration conventions as used in FIG. 33. As shown in FIG. 35, the output voltage margin 3502 is approximately one-third that of the input voltage margin 3504 or, in other words, is compressed by a factor somewhat greater than 3.0. It turns out that, for n input address lines, the output voltage margin ranges from 0 to $$\frac{V_{in}}{n}.$$

Figure 36:
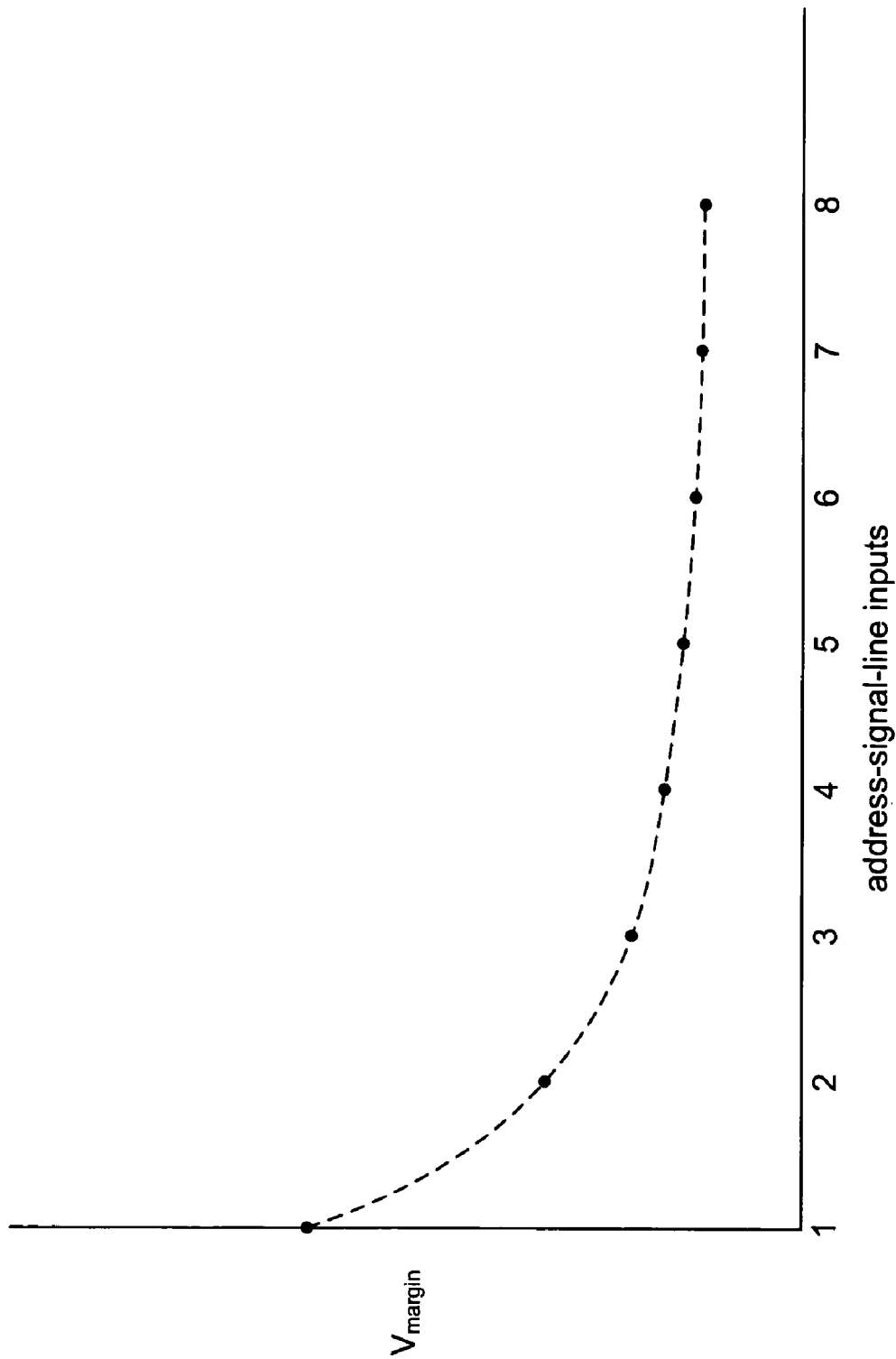
FIG. 36 shows a plot of the decrease in voltage margin with increasing number of address-signal-line inputs for resistor-based demultiplexers of the type shown in FIG. 30A.

FIG. 36 shows a plot of the decrease in voltage margin with increasing number of address-signal-line inputs for resistor-based demultiplexers of the type shown in FIG. 30A.

Figures 37A, 37B:
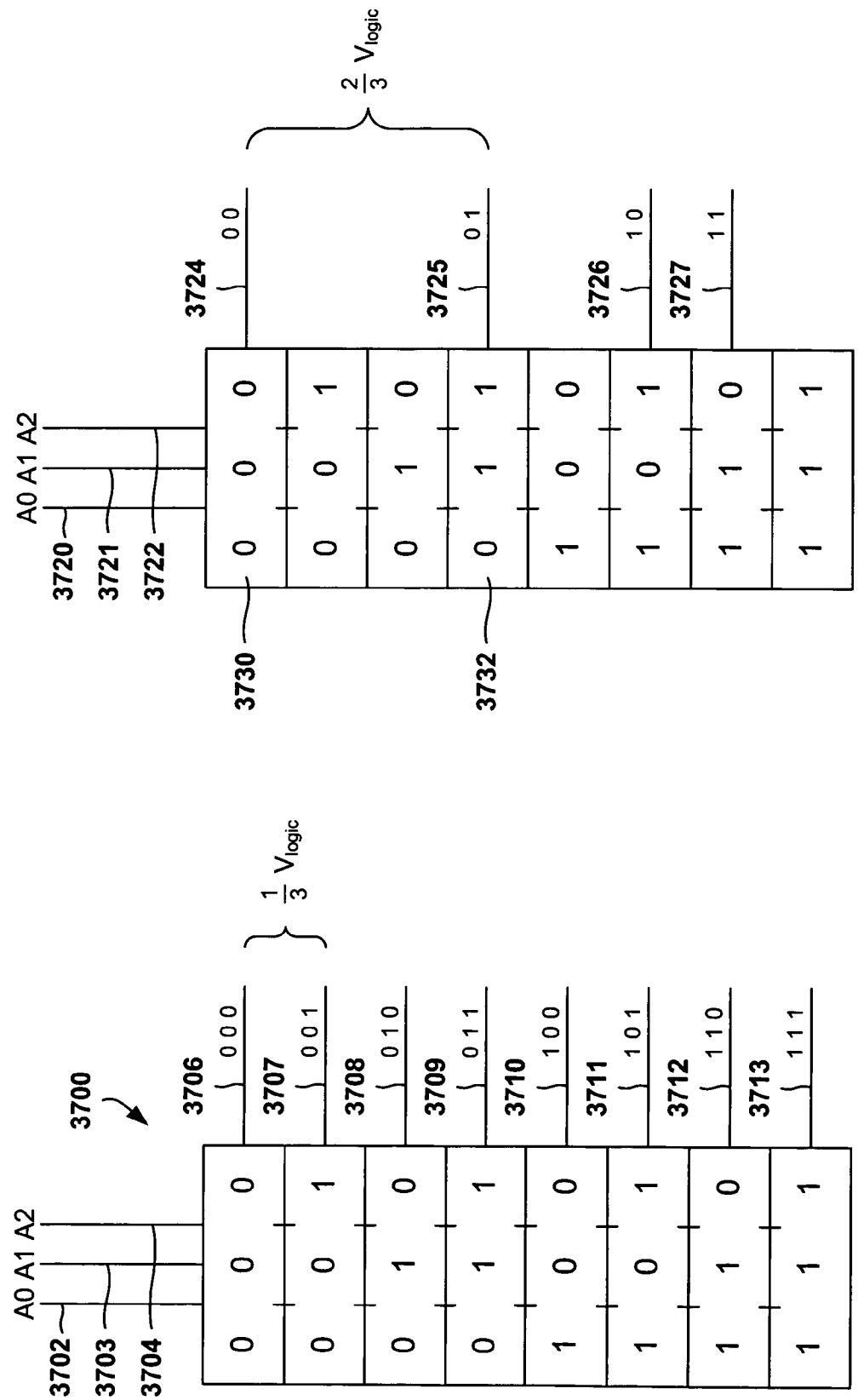
FIGS. 37A-B illustrate one approach to ameliorating the voltage margin compression produced by a resistor-based demultiplexer, discussed above with reference to FIGS. 30A-36, that represents one embodiment of the present invention.

FIGS. 37A-B illustrate one approach to ameliorating the voltage margin compression produced by a resistor-based demultiplexer, discussed above with reference to FIGS. 30A-36, that represents one embodiment of the present invention. FIG. 37A shows a block-diagram-like representation of a 3-address-line resistor-based demultiplexer 3700. The resistor-based demultiplexer 3700 is shown with three external input address lines 3702-3704 and eight output signal lines 3706-3713, each labeled with, and selected by, a different 3-bit binary address. There is a single output signal line corresponding to each of the $2^3$ possible 3-bit addresses. A resistor-based demultiplexer, of the type shown in FIG. 30A, selects one output signal line, for a given 3-bit input signal, by placing the selected output signal line at nearly the high-voltage, logic "1" voltage input to the address signal lines $V_{in}$. All other, non-selected signal lines have voltage states intermediate between the high-voltage state and ground. The minimum separation in voltage states resulting from input of a given 3-bit address is obtained between two output signal lines when the 3-bit addresses of two output signal lines differ by a single bit. For example, as shown in FIG. 37A, regardless of the address input to address lines 3702-3704, the voltage states of output signal lines 3706 and 3707 differ by $$\frac{V_{in}}{3}.$$

Output signal lines with 3-bit addresses that differ by two bits differ in voltage states by $$\frac{2V_{in}}{3},$$

and output signal lines with 3-bit addresses that differ by three bits differ in voltage by nearly the full voltage margin of the input logic voltage $V_{in}$.

To increase the output voltage margin, fewer signal lines than the maximum number of signal lines that can be addressed by the number of input address lines can be configured for output, with their addresses carefully chosen to differ by a maximum possible number of bits. For example, the resistor-based demultiplexer shown diagrammatically in FIG. 37B includes, like the demultiplexer shown in FIG. 37A, three external input address signal lines 3720-3722. However, the demultiplexer shown in FIG. 37B includes only four output signal lines 3724-3727. The addresses of the output signal lines have been carefully chosen, from among the $2^3$ possible 3-bit addresses, to differ by two bits from one another. For example, the 3-bit external address of signal line 3724, "000" 3730, differs from the 3-bit address "011" 3732 of signal line 3725 by two bits. The four output signal lines 3724-3727 can each be assigned a unique, internal two-bit address, as shown in FIG. 37B, comprising the first two bits of the 3-bit external internal address corresponding to the output signal lines. Thus, the two-bit internal addresses of the four output signal lines 3724-3727 are "00," "01," "10," and "11," respectively. Because the 3-bit external address of each of the output signal lines differs from the external addresses of all other output signal lines by two bits, the voltage state of a given output signal line differs from that of any other output signal line by $$\frac{2V_{in}}{3}.$$

Therefore, by using more address signal lines than needed to provide unique addresses for the four output signal lines, or, in other words, by employing supplemental external address signal lines, and by choosing external addresses for the output signal lines well spaced from one another, the output voltage margin is doubled with respect to the output voltage margin of the demultiplexer shown in FIG. 37A.

Figure 38:
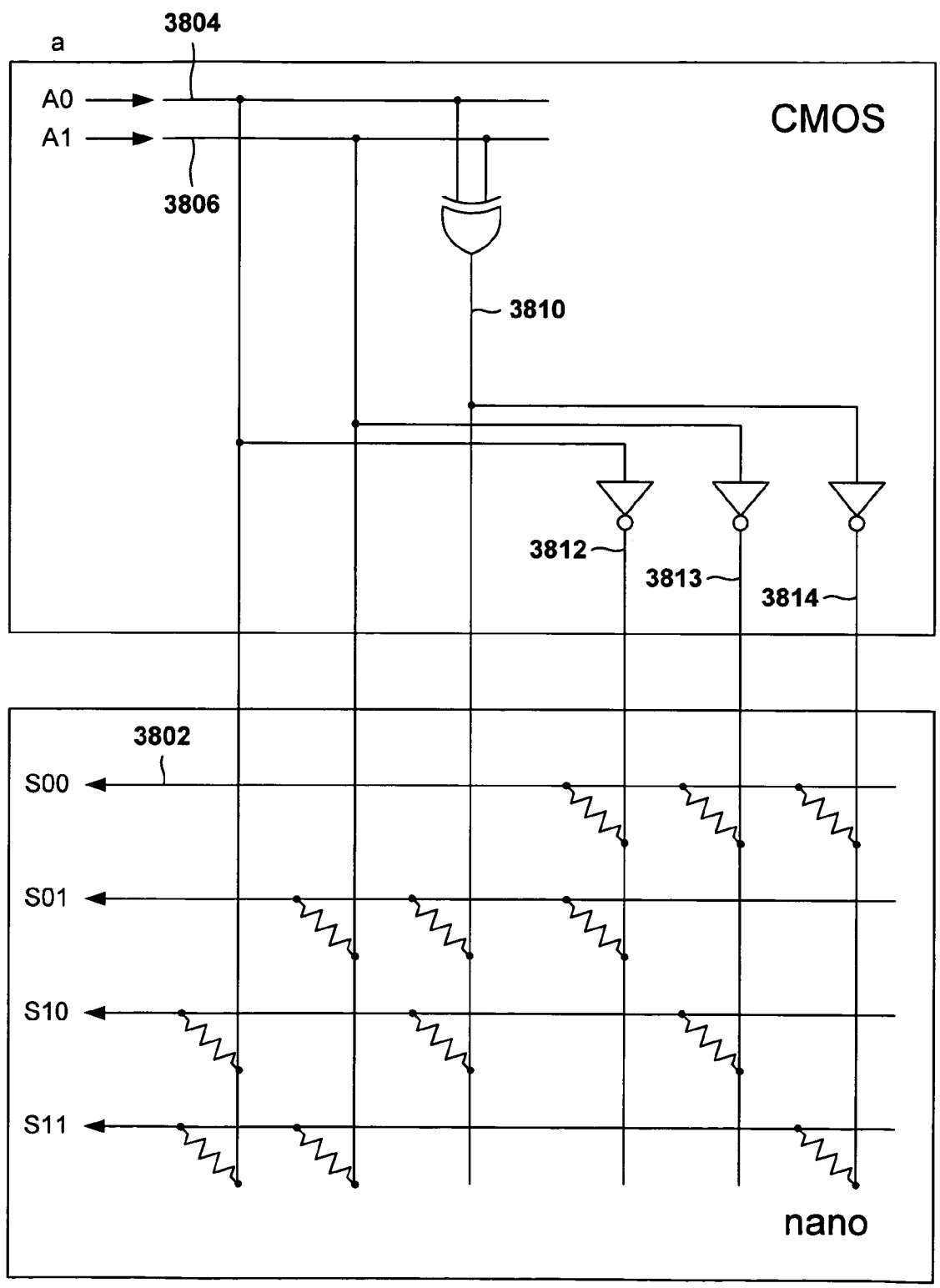
FIG. 38 shows a resistor-based implementation of the demultiplexer described with reference to FIG. 37B, representing one embodiment of the present invention.

FIG. 38 shows a resistor-based implementation of the demultiplexer described with reference to FIG. 37B, representing one embodiment of the present invention. In the implementation shown in FIG. 38, each input address signal line, such as input address signal line S00 3802, is interconnected through three resistor components to three of six vertical crossbar signal lines, or internal address signal lines, corresponding to the two input address lines A0 3804 and A1 3806 and the exclusive OR of the two input address lines 3810, and their complements 3812-3814. The signal line carrying the exclusive OR of the two input address lines 3810 and its complement can be considered to be supplemental, internal address lines. Thus, the $2^2$ external addresses needed for accessing each of the $2^2$ output signal lines are mapped into a $2^3$-address internal address space, so that the internal, output-signal-line addresses differ from one another by two bits, rather than by a single bit, as happens when the output signal line addresses densely cover the input address space.

In summary, supplemental address lines are employed to provide a larger address space than needed to uniquely address each signal line. This can be done by employing supplemental external address lines, and using only a well-distributed set of external addresses to access the signal lines, or, in other words, by mapping a larger-than-needed external address space to a smaller, internal address space with a one-to-one mapping between internal addresses and signal lines. Alternatively, this can be done by employing supplemental internal address lines, to map an external address space with a one-to-one mapping between external addresses and signal lines to a larger, internal address space with well distributed addresses for each signal line.

As discussed in a previous section, above, binary linear codes ("BLC") consisting of $2^k$ length-n bit strings with a minimum Hamming distance d between code words, referred to as [n,k,d] codes, can be used to generate $2^k$ sparse addresses within a $2^n$ address space. The n-bit address µ for each of $2^k$ output signal lines can be generated from the k-bit address a of the output signal line by the linear transformation $$\mu = a \cdot G$$

where G is a k by n generator matrix.

Figure 39:
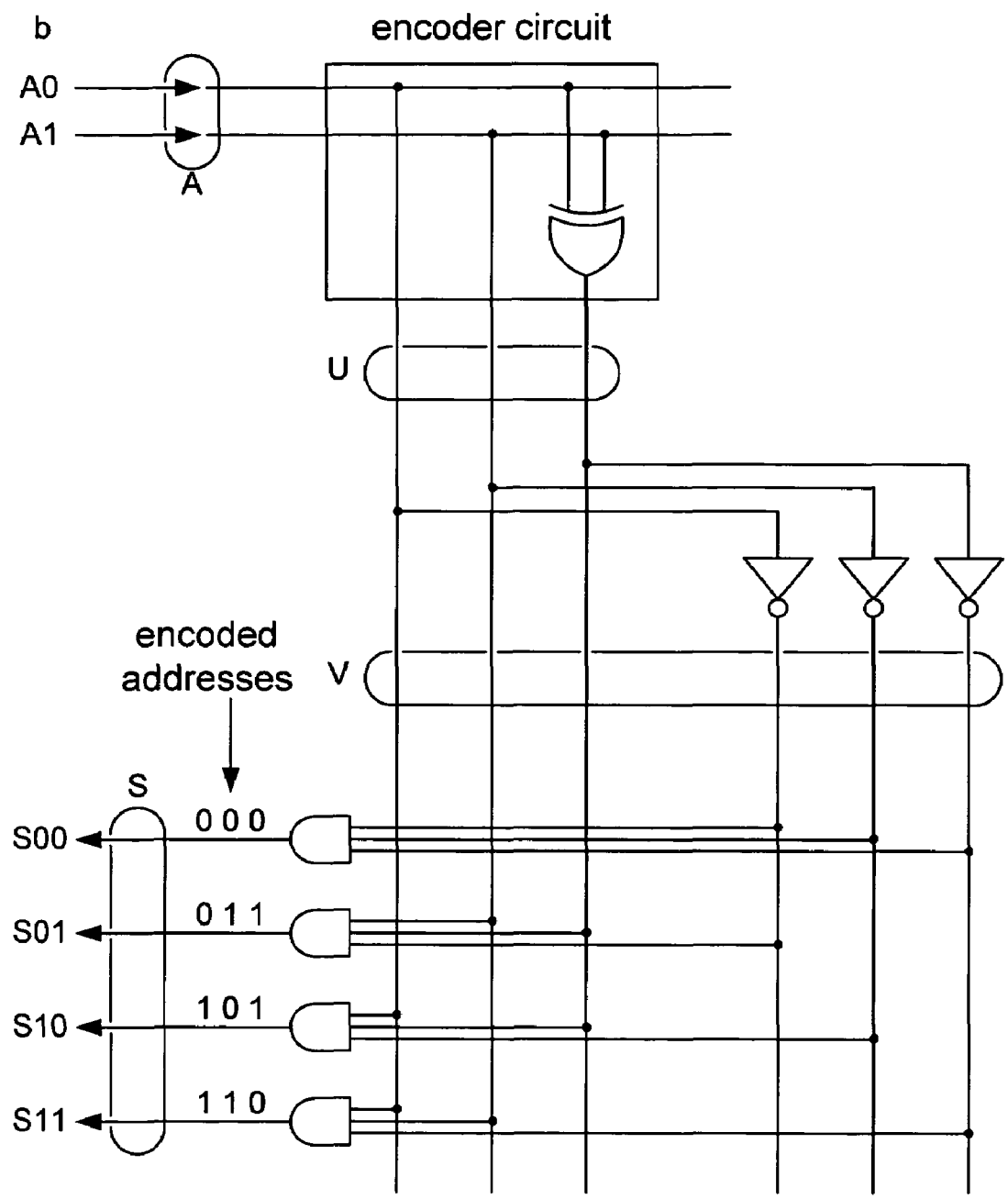
FIG. 39 indicates correspondences between vectors A, U, V, and S to collections of signal lines in the implementation of the 3-address-line, 4-output-signal-line demultiplexers, representing one embodiment of the present invention, shown in FIG. 38.

For example, the generator matrix $$\begin{bmatrix} 1 & 0 & 1 \\ 0 & 1 & 1 \end{bmatrix}$$

is used to generate the 3-bit addresses for the four output signal lines of the 3-address-line, 4-output-signal-line demultiplexer shown in FIGS. 37B and 38. The generally densely packed, k-bit output signal line addresses ranging from 0 to $2^k-1$ can be considered together to form a vector S, and the corresponding n-bit internal addresses used within the demultiplexer to select the output signal lines can be considered to together comprise a vector V generated by matrix multiplication of each address in S by the appropriate generator G. The input signal lines can be considered to form a vector A, and the output signal lines from an encoder circuit can be considered to form a vector U. FIG. 39 indicates correspondences between vectors A, U, V, and S to collections of signal lines in the implementation of the 3-address-line, 4-output-signal-line demultiplexers, representing one embodiment of the present invention, shown in FIGS. 37B and 38.

Figure 40A:
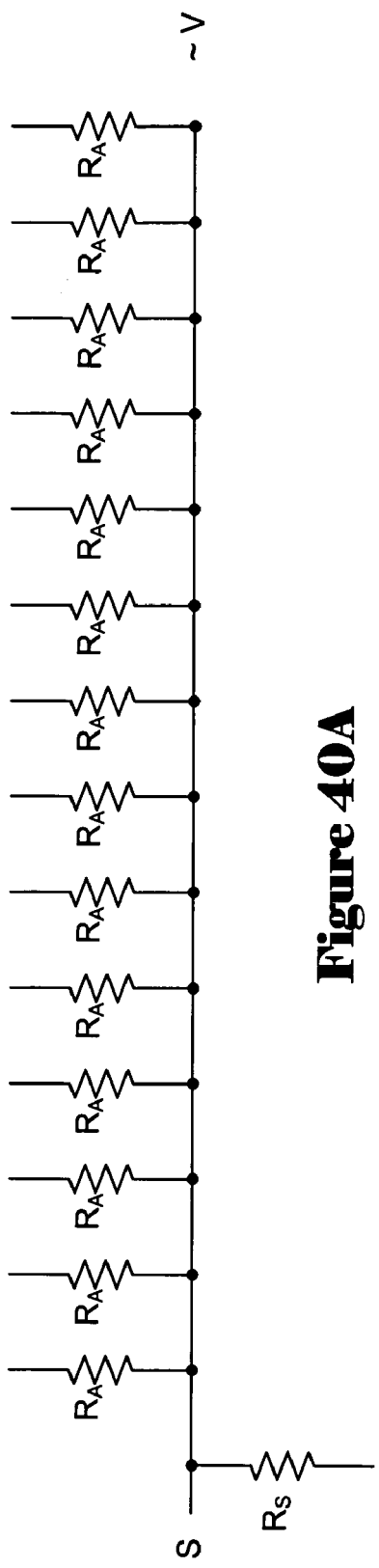
FIGS. 40A-B illustrate difference in voltage states of an output signal line depending on the number of bits by which the n-bit address of the output signal line differs from an input n-bit address in various embodiments of the present invention.
Figure 40B:
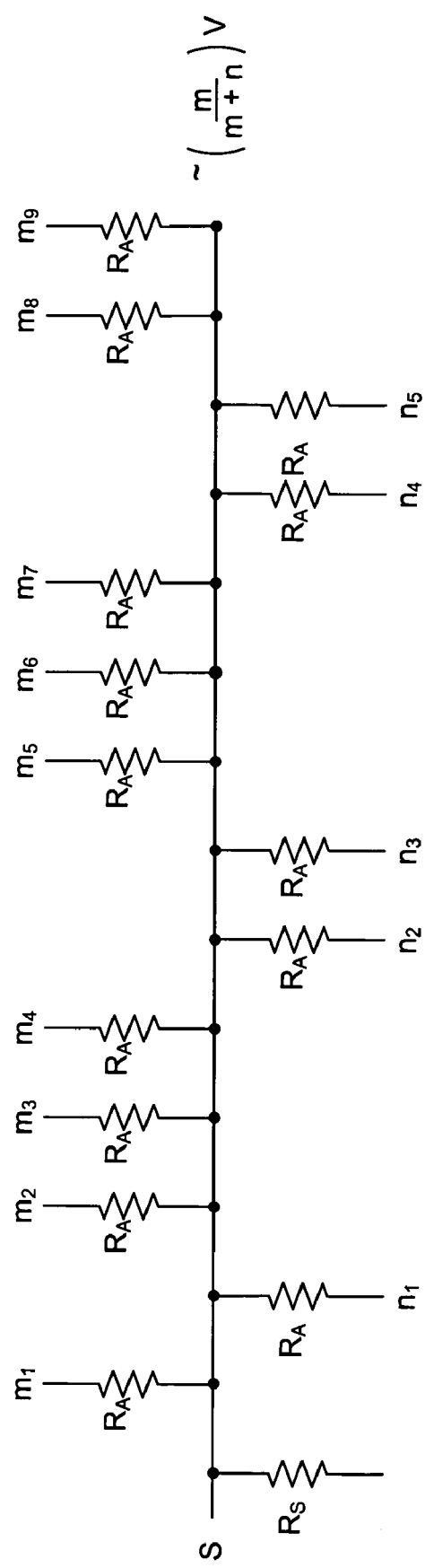

FIGS. 40A-B illustrate difference in voltage states of an output signal line depending on the number of bits by which the n-bit address of the output signal line differs from an input n-bit address in various embodiments of the present invention. As shown in FIG. 40A, when the n-bit address of the output signal line exactly matches an input n-bit address, regardless of the number n of bits in the address, or corresponding number of address signal lines, the output signal line has a voltage state nearly equally to the input voltage $V_{in}$ corresponding to logic state "1." However, when the n-bit address of the output signal line differs by r bits from the input n-bit address, as shown in FIG. 40B, then the voltage state of the output signal line is approximately equal to $$\frac{m}{m+r} V$$

where r=number of non-matching bits; and
m=number of matching bits.

Therefore, when choosing a BLC in order to generate internal n-bit addresses, greater Hamming distances d produce larger voltage margins.

Figure 41:
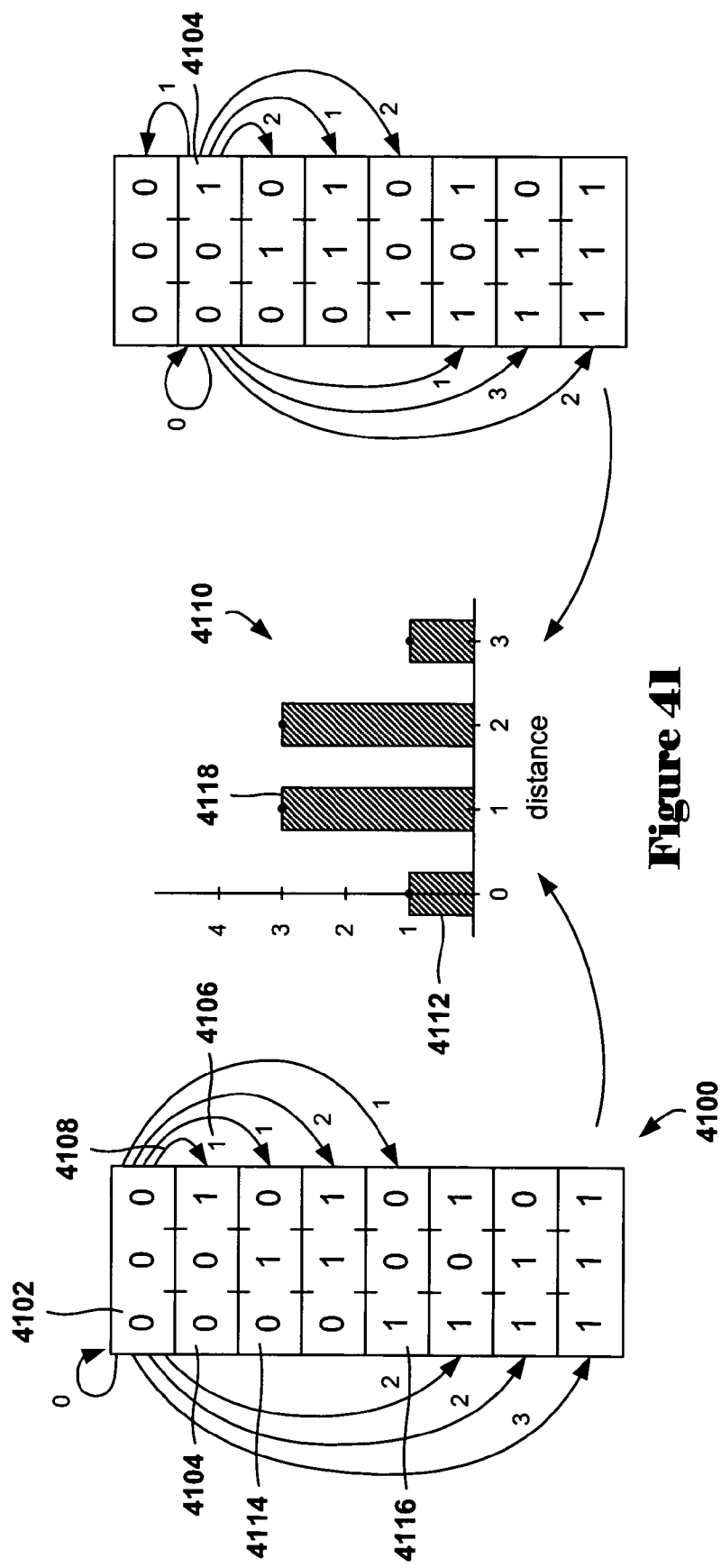
FIG. 41 illustrates an address-distance distribution for an address space for various embodiments of the present invention.

FIG. 41 illustrates an address-distance distribution for an address space for various embodiments of the present invention. In FIG. 41, the [3,3,1] code corresponding to a densely packed, 3-bit address space, is employed to illustrate an address-difference distribution. In FIG. 41, the address "000" 4102 is chosen as a reference address within the address space. The distances, in bits, between the reference address 4102 and each other address within the address space are then computed. The distance is simply the number of bit positions that differ between two addresses. Thus, for example, the distance between the reference address "000" 4102 and the address "001" 4104 is one, since the two addresses differ only by the last bit position. This distance is indicated by the symbol 1 4106 associated with the curved arrow 4108 between the reference address 4102 and address "001" 4104. The number of addresses at each different possible distance from the reference address is plotted as a bar graph 4110. There is one address at a distance 0 from the reference address, namely the reference address itself, and therefore there is a bar 4112 of height 1 plotted at distance 0. Similarly, there are three addresses 4104, 4114, and 4116 at a distance of 1 from the reference address, and therefore a bar of height 3 4118 is placed at distance 1 in the bar graph 4110. The remaining distances of 2 and 3 are similarly plotted. The bar graph thus represents a distribution of the address differences within the [3,3,1] address space 4100. BLCs have the property that, regardless of which address is selected as the reference address, the same, identical address-difference distribution is generated. As an example, the second address 4104 is chosen as the reference address on the right-hand side of FIG. 41, and the distance calculations generate the exact same address-difference distribution shown in the bar graph 4110.

Figure 42:
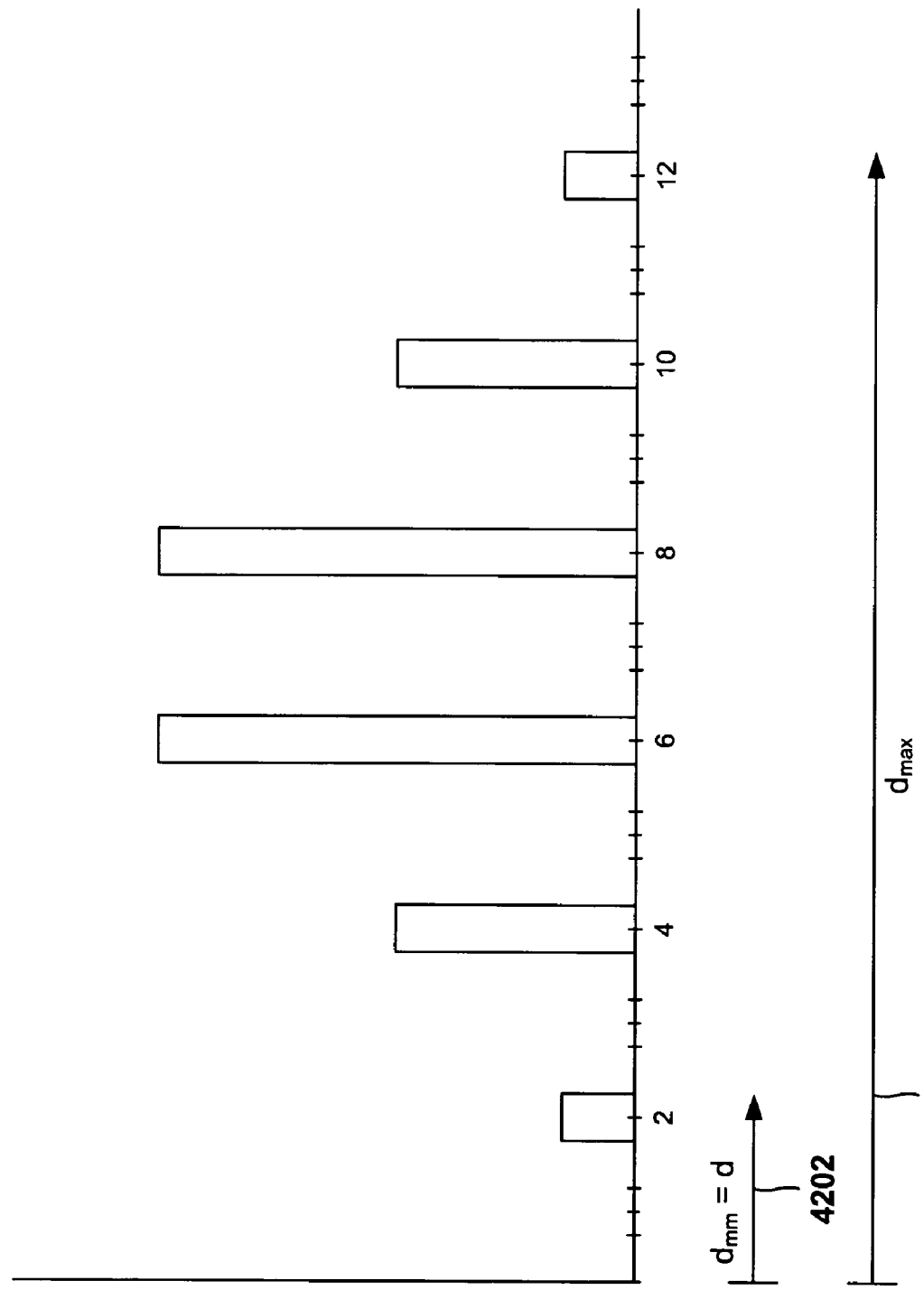
FIG. 42 shows a hypothetical address-difference distribution, for various embodiments of the present invention, represented as a bar graph.

As discussed above, with reference to FIGS. 40A-B, the minimum difference in voltage states between output signal lines in a resistor-based demultiplexer using supplemental address lines and n-bit addresses generated according to a BLC is equal to the number of bits by which the two addresses of the two output signal lines most closely separated in voltage differ, divided by the total number n address bits, times the input voltage $V_{in}$. The number of bits by which the most closely separated output signal lines differ is therefore d, the Hamming distance for the BLC. The maximum voltage-state separation between output signal lines can be determined as the breadth of the address-difference distribution. FIG. 42 shows a hypothetical address-difference distribution, for various embodiments of the present invention, represented as a bar graph. The minimum voltage separation between output signal lines, $d_{min}$, is shown in FIG. 42 as the Hamming distance d 4202, and the maximum voltage difference between output signal lines, $d_{max}$, is the width 4204 of the distribution, or greatest address-difference in the distribution. The compression ratio of voltage margin resulting from operation of a resistor-based demultiplexer is $$\frac{d_{max}}{d_{min}}.$$

Thus, as $d_{min}$ decreases with respect to $d_{max}$, the compression ratio increases, leading to increasing compression of the input voltage margin into smaller and smaller output voltage margins. For this reason, address-difference distributions with narrow widths and a large $d_{min}$ are more desirable than address-difference distributions with larger widths. A metric, referred to as the splay S, can be computed for an address-distribution as follows:

$$S = \frac{d_{max} - d_{min}}{d_{max}}$$

The splay S ranges from 0 to 1, with BLCs having address distributions with smaller splays preferred over BLCs having address distributions with larger splays.

Figure 43:
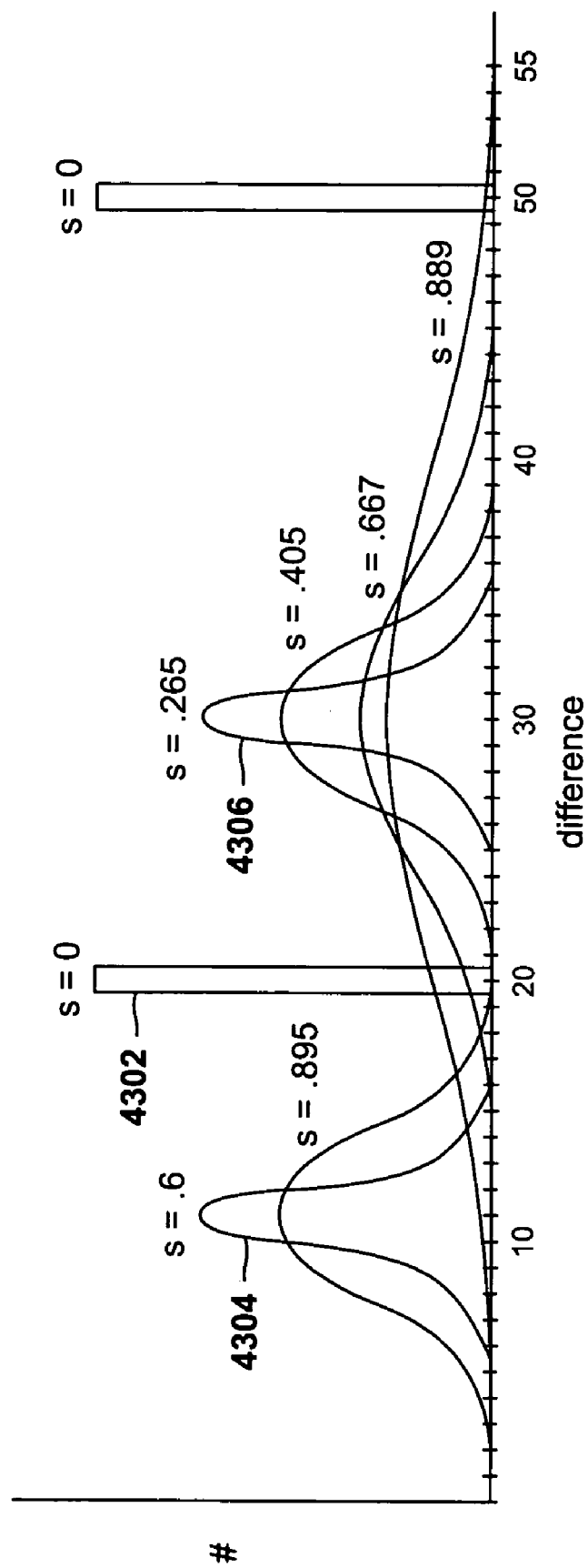
FIG. 43 shows a number of different, hypothetical address-difference distributions for various embodiments of the present invention plotted as continuous curves along a difference axis, similar to the distribution plots shown in FIGS. 41 and 42.

FIG. 43 shows a number of different, hypothetical address-difference distributions for various embodiments of the present invention plotted as continuous curves along a difference axis, similar to the distribution plots shown in FIGS. 41 and 42. Each address-difference distribution is associated, in FIG. 43, with the calculated splay S. The narrower the address-difference distribution, the lower the value of S. When the address-difference distribution is maximally narrow, and represented by a single column or spike, such as spike 4302, the computed splay S=0, regardless of the Hamming distance d for the corresponding BLC. Otherwise, as the average address-difference for the BLC increases, the calculated splay S decreases. For example, in FIG. 43, address-difference distributions 4304 and 4306 have the same width and shape, but address-difference distribution 4506 has a greater average address difference. It can be seen in FIG. 43 that the address-difference distribution with a greater average address difference has a lower calculated splay S. As discussed above, the greater the average address difference, the greater the voltage separation between output signal lines. Therefore, BLCs with address-difference distributions producing smaller calculated splay values S are more desirable for designing resistor-based demultiplexers. By slightly modifying the splay metric, a splay metric S' which is always reciprocally related to the desirability of a corresponding BLC can be obtained as follows:

$$S' = \frac{d_{max} - (d + C)}{d_{max}}$$

where c is a constant. The modified splay metric S' approaches, but never equals 0. For spike address-difference distributions, the greater the address difference, the lower the computed S' value.

FIGS. 44A-D illustrate a second metric reflective of the desirability of particular BLCs for use in designing resistor-based demultiplexers according to various embodiments of the present invention. Although the splay metrics reflect the desirability of a BLC with respect to the distances between output signal line addresses, the splay metrics S and S' do not reflect the desirability of BLCs with respect to other BLC characteristics. For example, the number n address signal lines needed to address the $2^k$ output signal lines according to a BLC [n,k,d] reflects the demultiplexing efficiency of a demultiplexer. Clearly, if the number of address signal lines n is equal to or exceeds the number of output signal lines $2^k$, then the demultiplexer does not carry out a demultiplexing function. In general, the larger the ratio of output signal lines to address lines, the more efficiently the demultiplexer demultiplexes n-bit input addresses. Therefore, a second efficiency metric R can be defined as follows:

$$R = \frac{k}{n}$$

Figure 44A:
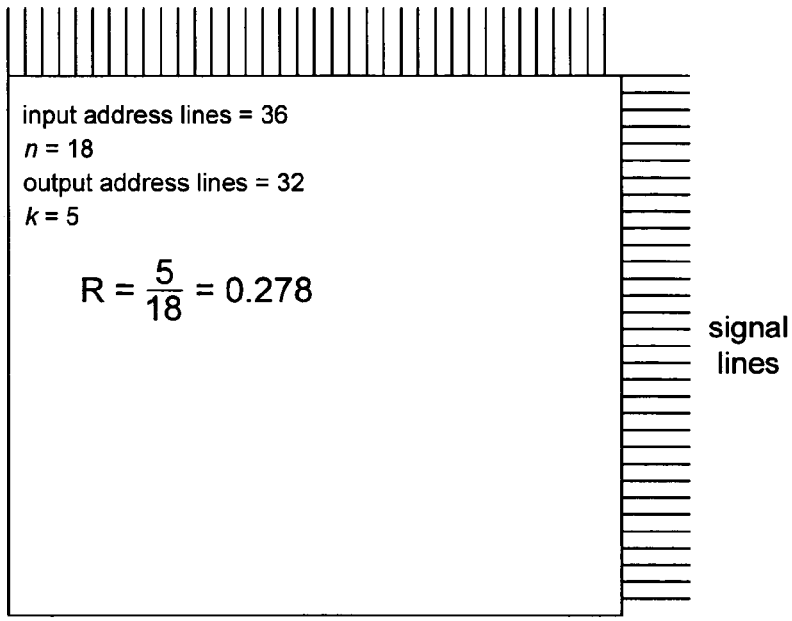
FIGS. 44A-D illustrate a second metric reflective of the desirability of particular BLCs for use in designing resistor-based demultiplexers according to various embodiments of the present invention.
Figure 44D:
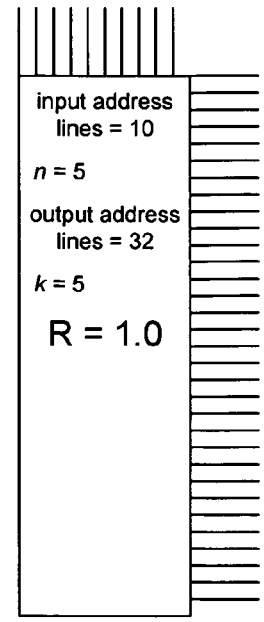
Figure 44B:
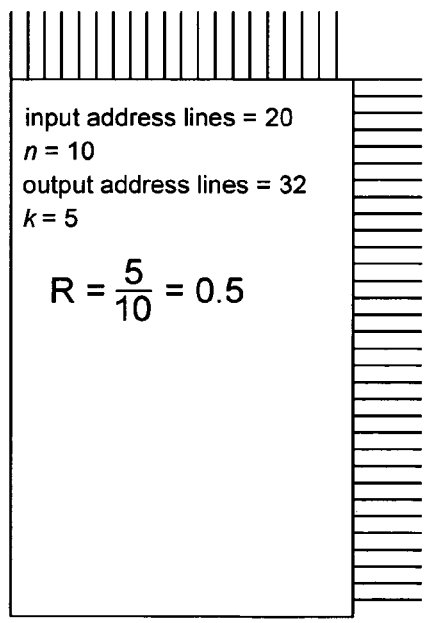
Figure 44C:
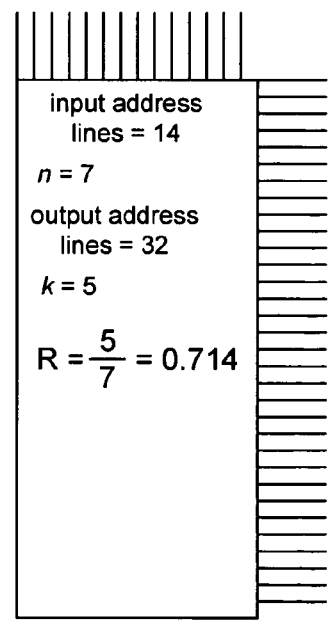

FIG. 44A shows an inefficient demultiplexer with 36 (2n) vertical address lines and 32 output signal lines defined by a [18,5,d] BLC. As shown in FIG. 44A, the computed efficiency metric R for this hypothetical demultiplexer is 0.278. FIGS. 44B-44D show a series of increasingly efficient demultiplexers with efficiency metric R values increasing from 0.5, for the demultiplexer shown in FIG. 44B, to 1.0 for the demultiplexer shown in FIG. 44D. The demultiplexer shown in FIG. 44D is designed according to a [5,5,d] BLC. There is therefore no redundancy in the input address lines with respect to the addresses of the output signal lines, and therefore the Hamming distance d is equal to 1. Thus, efficiency metric R values range from low values up to a maximum value of 1.0.

FIG. 45 shows a table of the various parameters and metrics associated with choosing BLCs for designing resistor-based demultiplexers according to various embodiments of the present invention. The first three parameters, n, k, and d, correspond to the parameters used to designate [n,k,d] BLCs, and correspond, as well, to various design parameters of resistor-based demultiplexers. The parameter n is equal to the number of address lines. The parameter k is equal to log₂(number of output signal lines). The parameter d is equal to $d_{min}$. As discussed above, the splay metrics S and S' are associated with the voltage-margin compression and address-difference of a BLC. As S decreases towards 0, the desirability of the BLC increases. The Hamming distance d and maximum address difference $d_{max}$ are related to the parameters k and n, and minimizing the splay metric S or S' tends to minimize the parameter k and maximize the parameter n. The demultiplexer efficiency metric R is related to both the parameters k and n, and reflects increasing desirability with increasing R-metric values. Maximizing R tends to maximize k and minimize n. However, in general, k is fixed for a particular demultiplexer, in which case the splay metric S favors larger values of n, and the efficiency metric R favors smaller values of n. In general, BLCs with suitable characteristics become increasingly difficult to compute or identify with increasing n and k. BLCs with moderate-to-large values of n and k may be particularly useful in designing practical demultiplexers that may include hundreds or thousands of output signal lines.

An overall figure of merit for a BLC may be computed as a function of the metrics R and S', as follows:

*FOM=f(R,S')*

Figure 46:
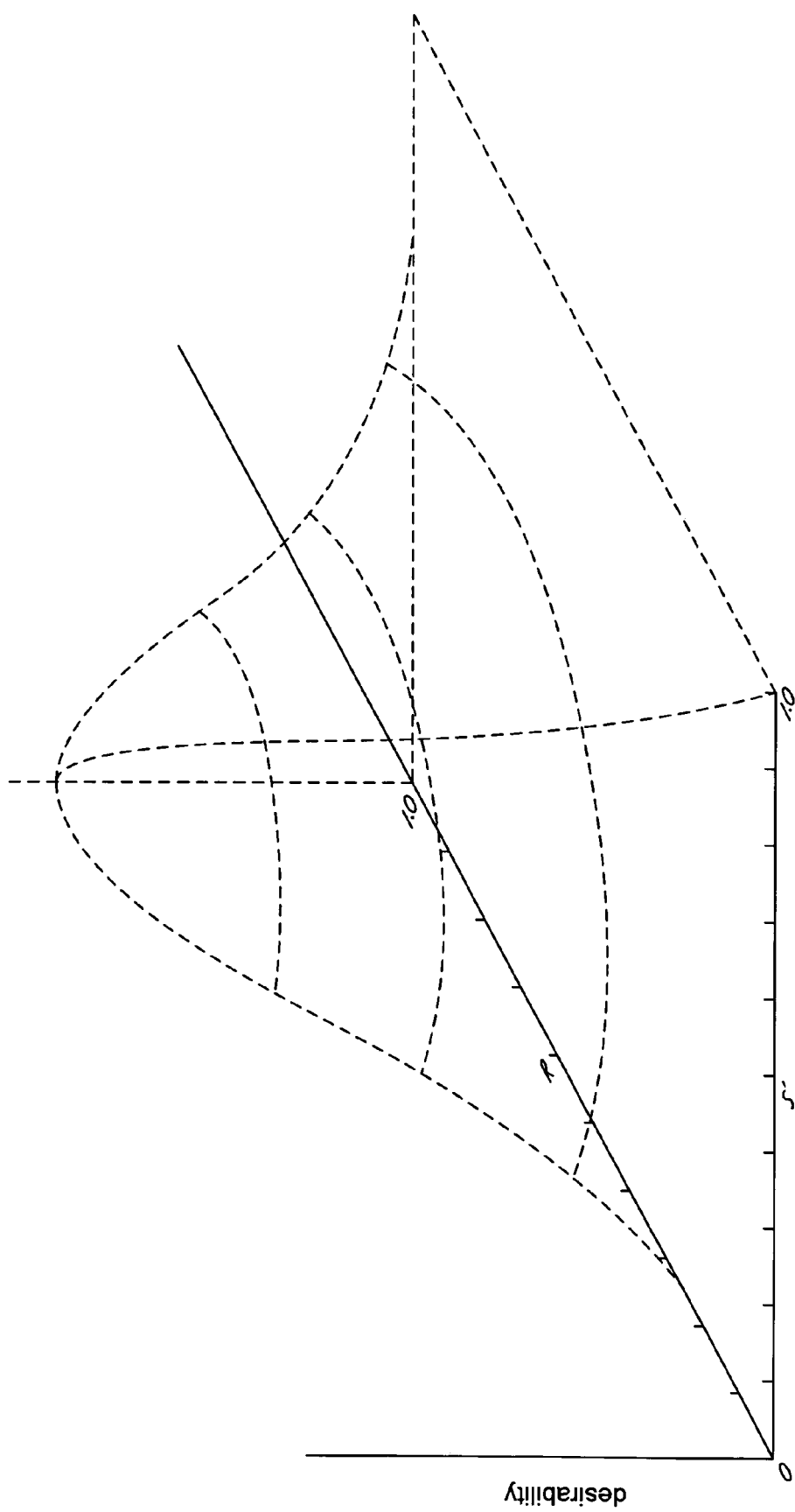
FIG. 46 shows a hypothetical figure-of-merit surface in a three-dimensional graph of an overall figure of merit FOM=f(R, S') plotted against S' and R according to various embodiments of the present invention.
Figure 47:
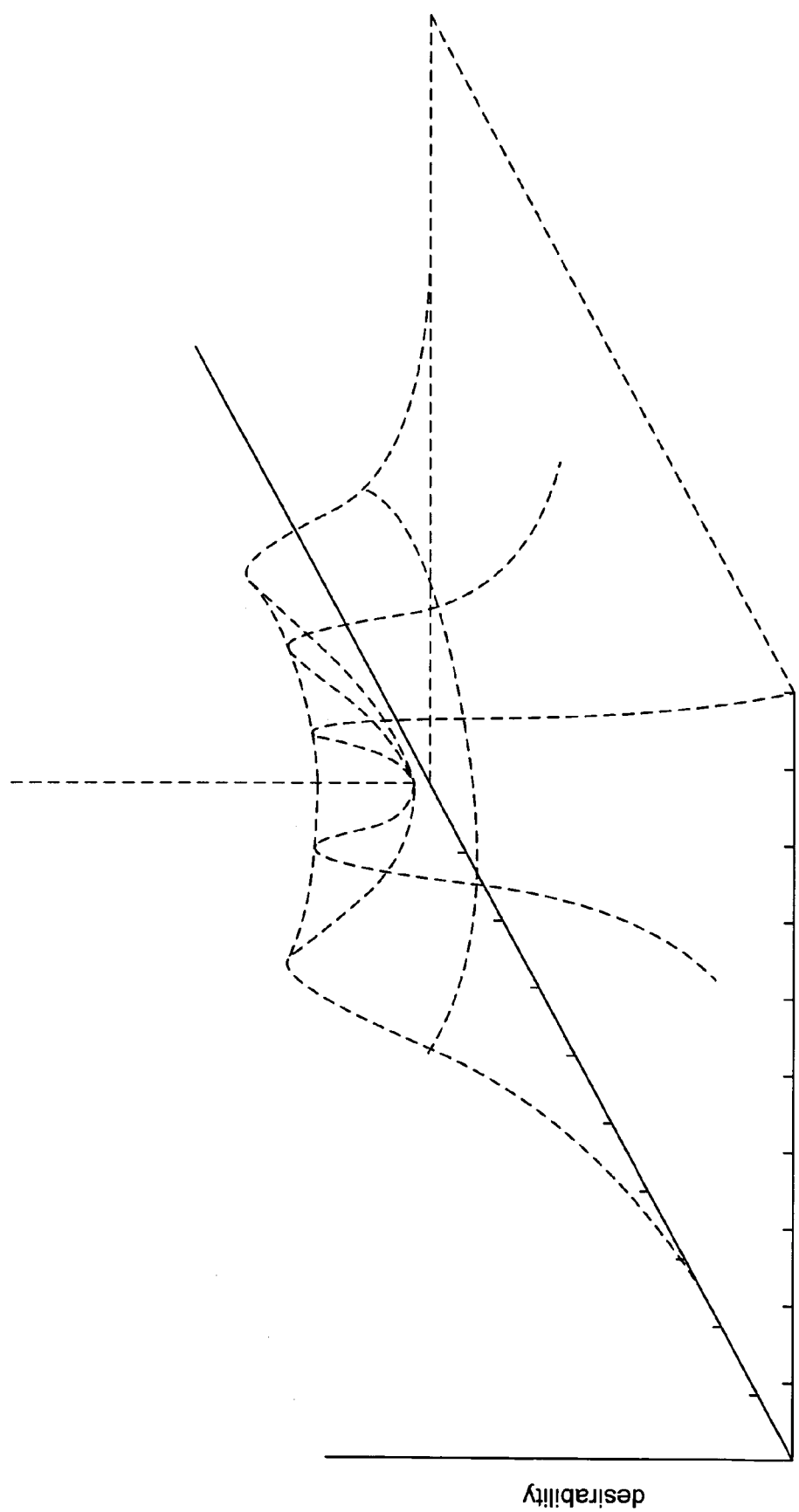
FIG. 47 illustrates a figure-of-merit surface in which the cost of identifying or computing BLCs is included in the overall figure of merit according to various embodiments of the present invention.

For example, a simple overall figure of merit may be computed as:

$$FOM = \frac{aR^x}{bS'^y}$$

where x, y, a, and b are constants. The greater the computed overall figure of merit, the more desirable the BLC. FIG. 46 shows a hypothetical figure-of-merit surface in a three-dimensional graph of an overall figure of merit FOM=f(R,S') plotted against S' and R according to various embodiments of the present invention. Note that the peak of the overall figure of merit occurs at R=1.0 and S' approaching 0. Different overall figure of merit functions produce figure-of-merit surfaces of different shapes and peak widths, but generally have forms similar to the form of the figure-of-merit surface shown in FIG. 46. Because BLCs with large n and k values may be difficult to compute and otherwise identify, when the cost of computing or finding BLCs is factored into the overall figure of merit, a figure-of-merit surface having a form reminiscent of the shape of a volcano may result. FIG. 47 illustrates a figure-of-merit surface in which the cost of identifying or computing BLCs is included in the overall figure of merit according to various embodiments of the present invention.

Figure 48:
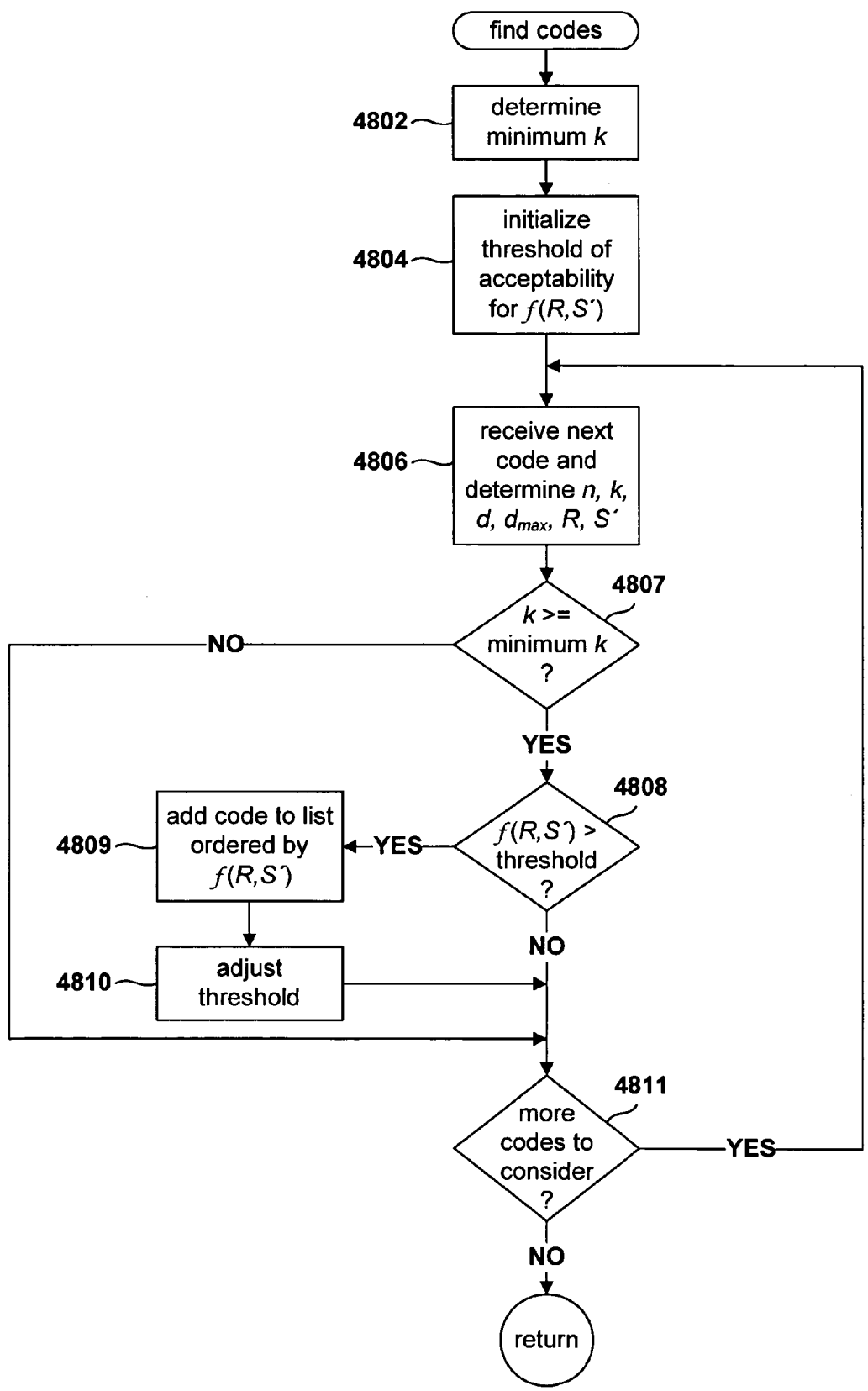
FIG. 48 is a control-flow diagram illustrating one embodiment of a method for identifying desirable BLCs for developing resistor-based demultiplexers that represents one embodiment of the present invention.

Identification of the metrics R and S' provide the basis for a method for identifying BLCs suitable for designing resistor-based demultiplexers. FIG. 48 is a control-flow diagram illustrating one embodiment of a method for identifying desirable BLCs for developing resistor-based demultiplexers that represents one embodiment of the present invention. In step 4802, a minimum k value needed for the demultiplexer is determined. Next, in step 4804, a threshold of acceptability value for a computed overall metric is determined and used to initialize a threshold-of-acceptability variable. Then, in the loop of steps 4806-4811, each of a set of different BLCs are evaluated. In step 4806, the next of the set of BLCs is received, and the parameters n, k, d, $d_{max}$, R, and S' are determined for the received BLC. In step 4807, the routine determines whether the parameter k for the received BLC is greater than a minimum k value determined in the step 4802. If not, the currently considered BLC is rejected. Then, in step 4808, overall figure of merit is computed for the currently considered BLC and compared to the threshold-of-acceptability variable. If the overall metric computed for the received BLC is greater than the threshold, then the received BLC is added to a list of acceptable codes in step 4809, and the threshold-of-acceptability variable may be adjusted, in step 4810, based on the list of accepted BLCs following addition of the currently considered BLC. If the computed overall metric falls below or equal to the threshold, as determined in step 4808, then the currently considered BLC is rejected. The loop continues if additional BLCs remain in the set of BLCs considered by the method, as determined in step 4811.

Figure 49:
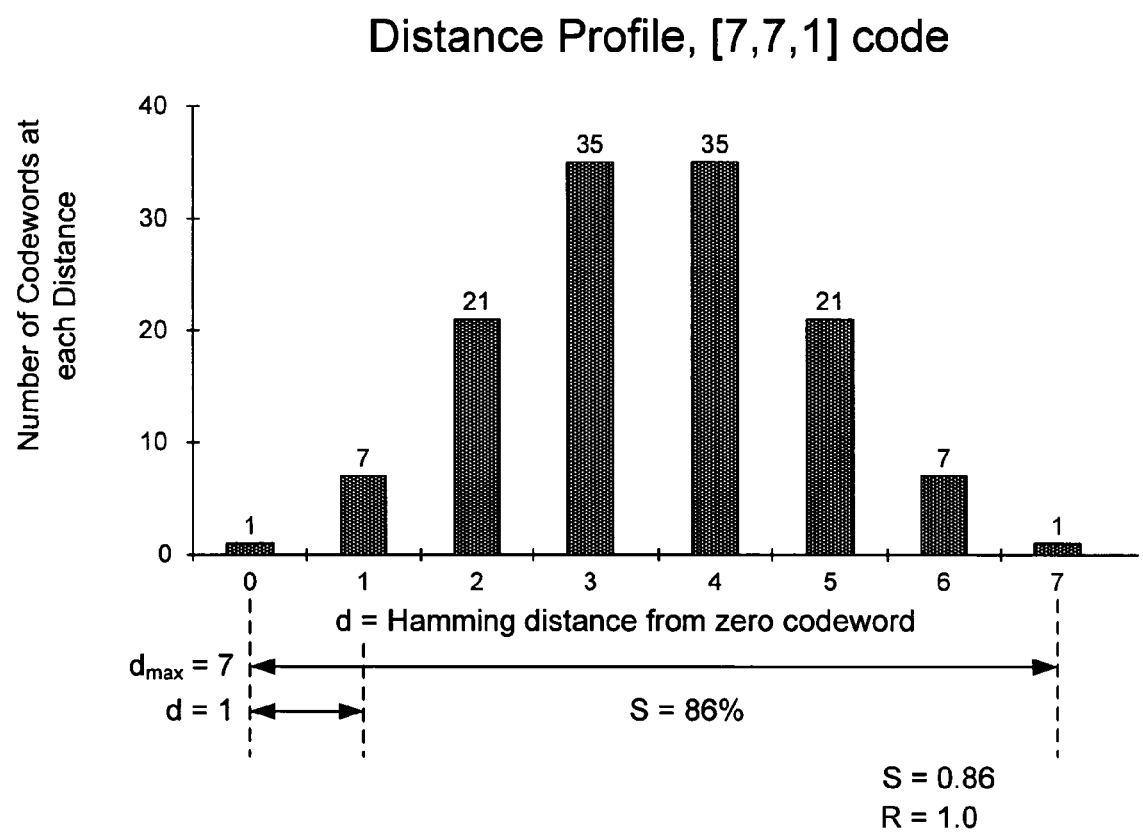
FIGS. 49-53 show address-distance distributions, or distance profiles, for a number of different linear binary codes.
Figure 50:
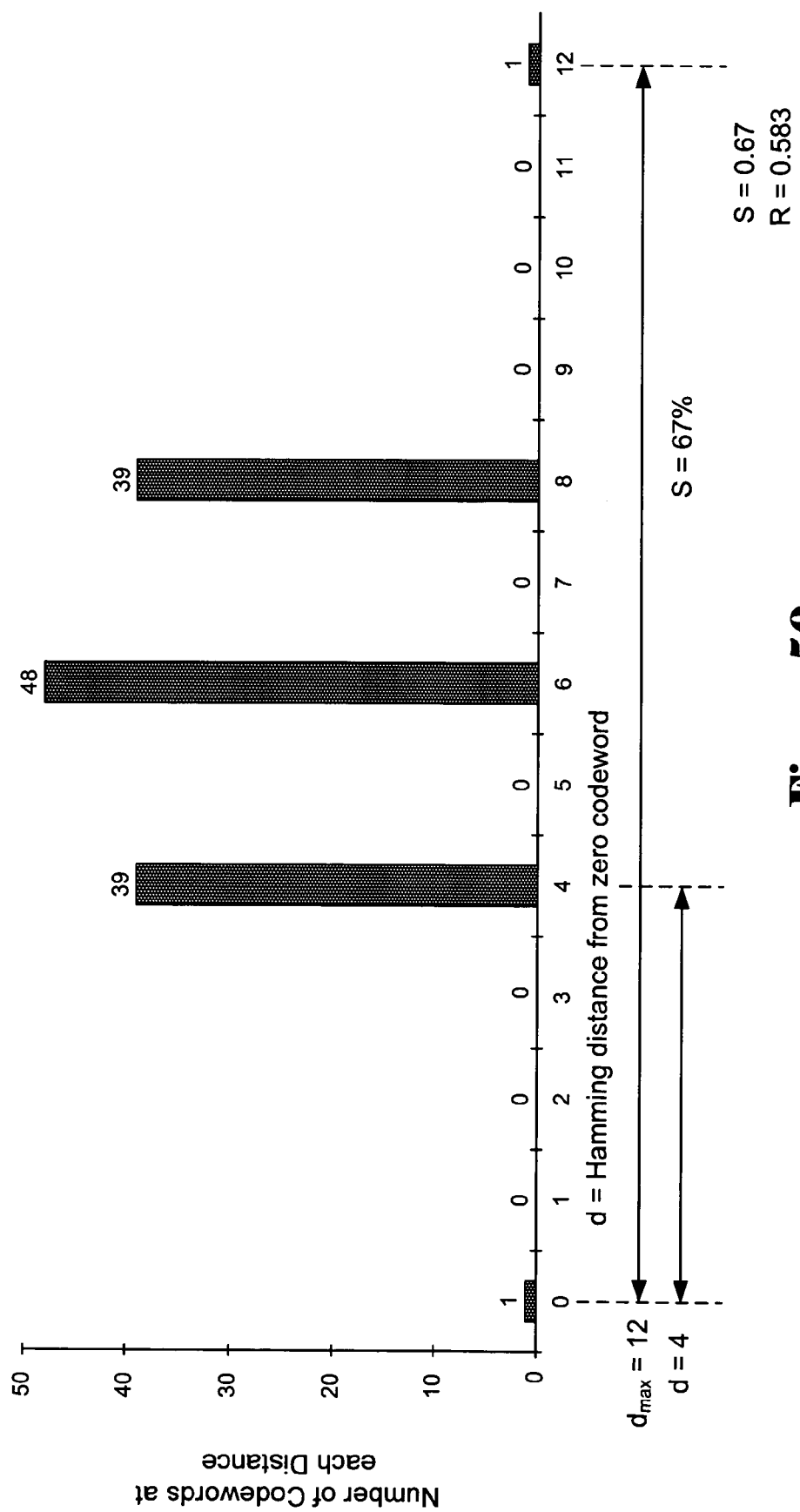
Figure 51:
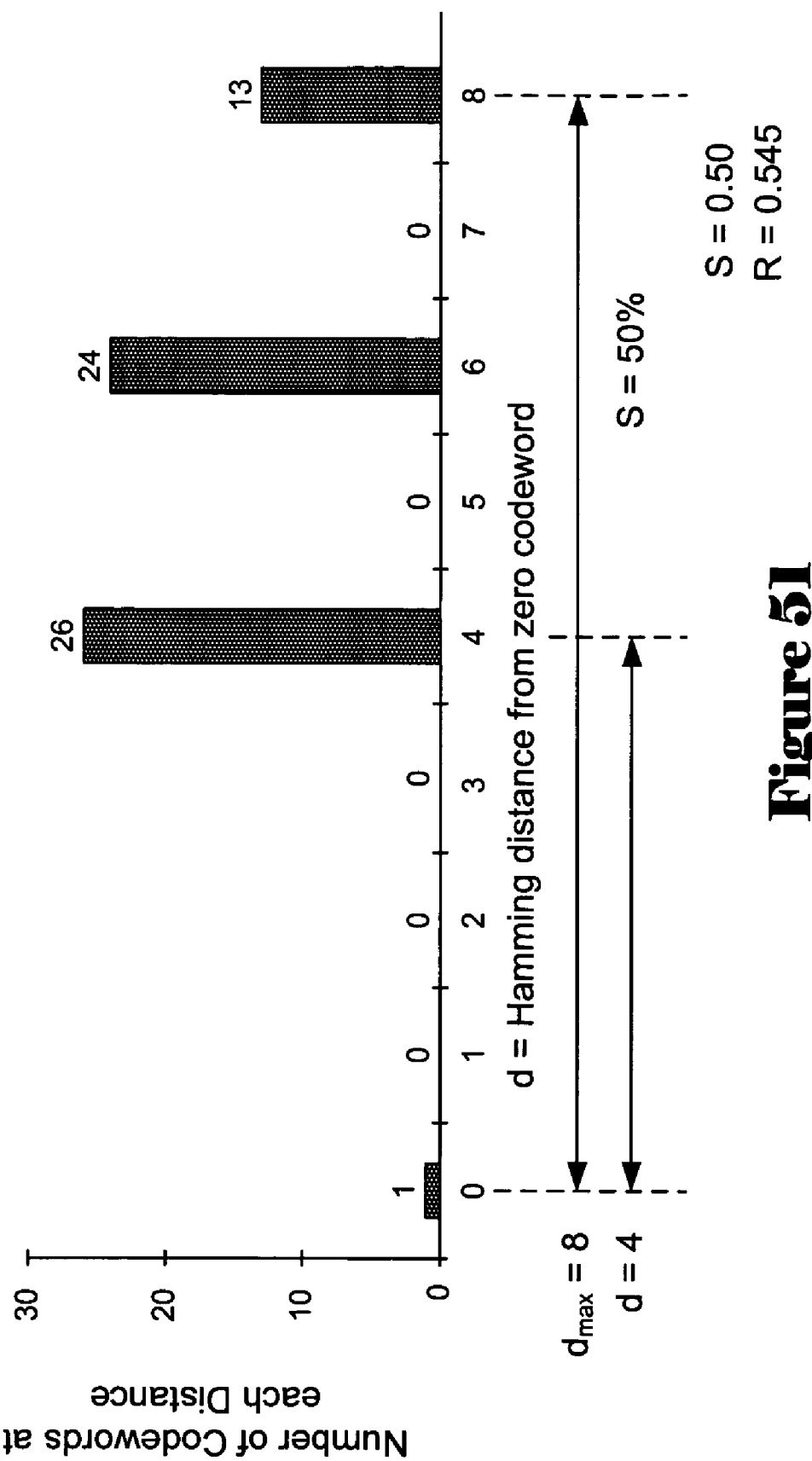
Figure 52:
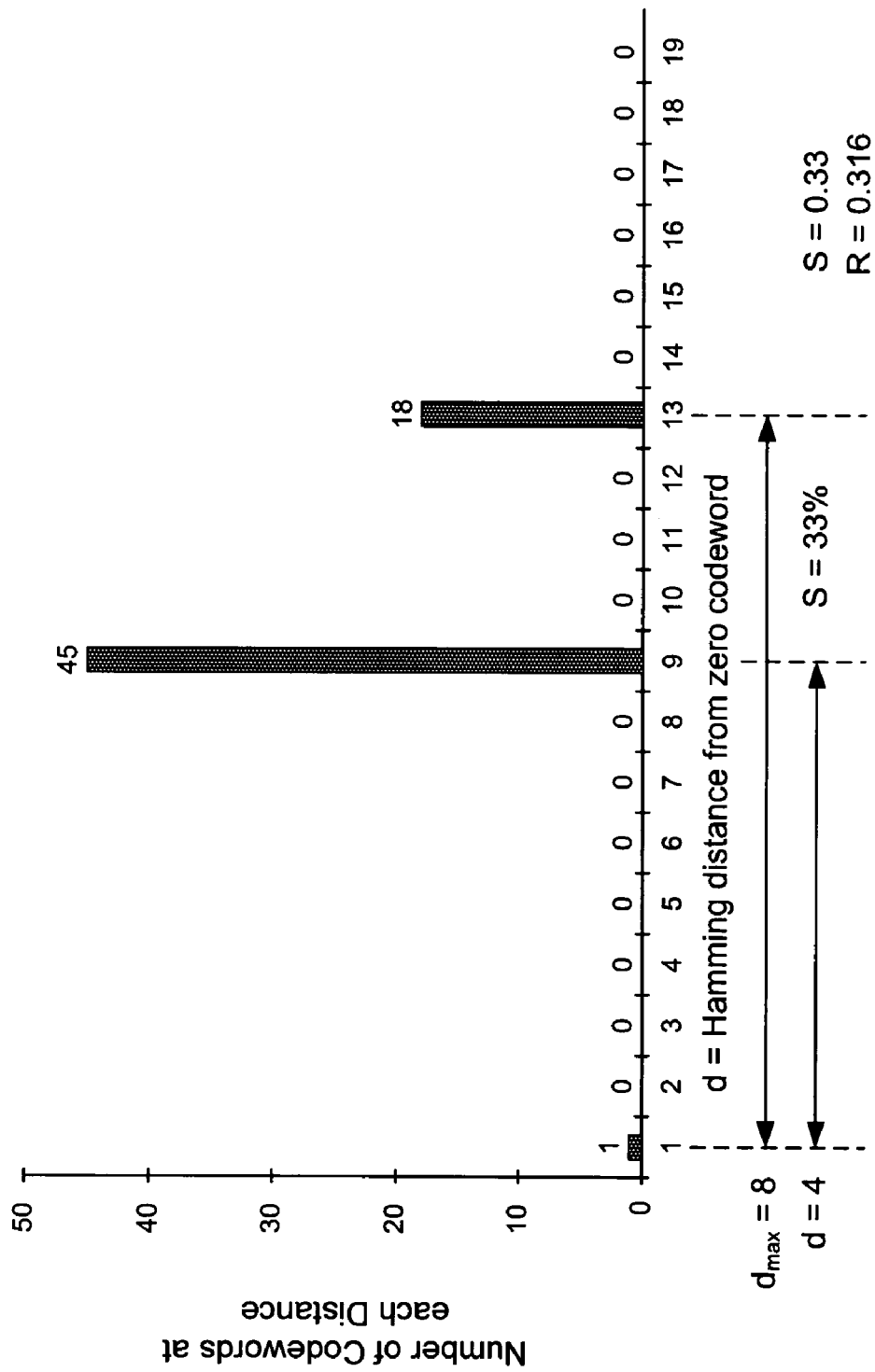
Figure 53:
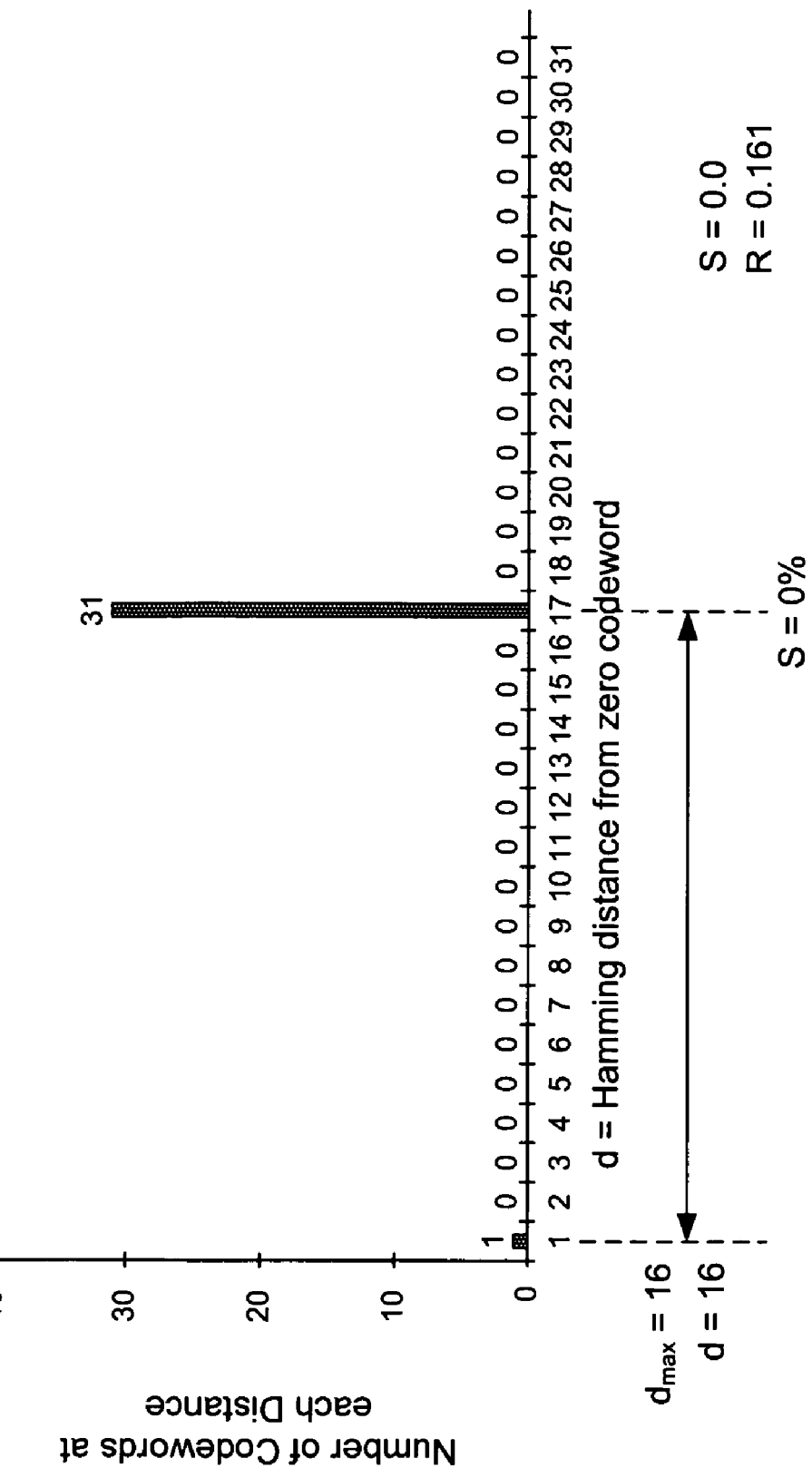
Figure 54:
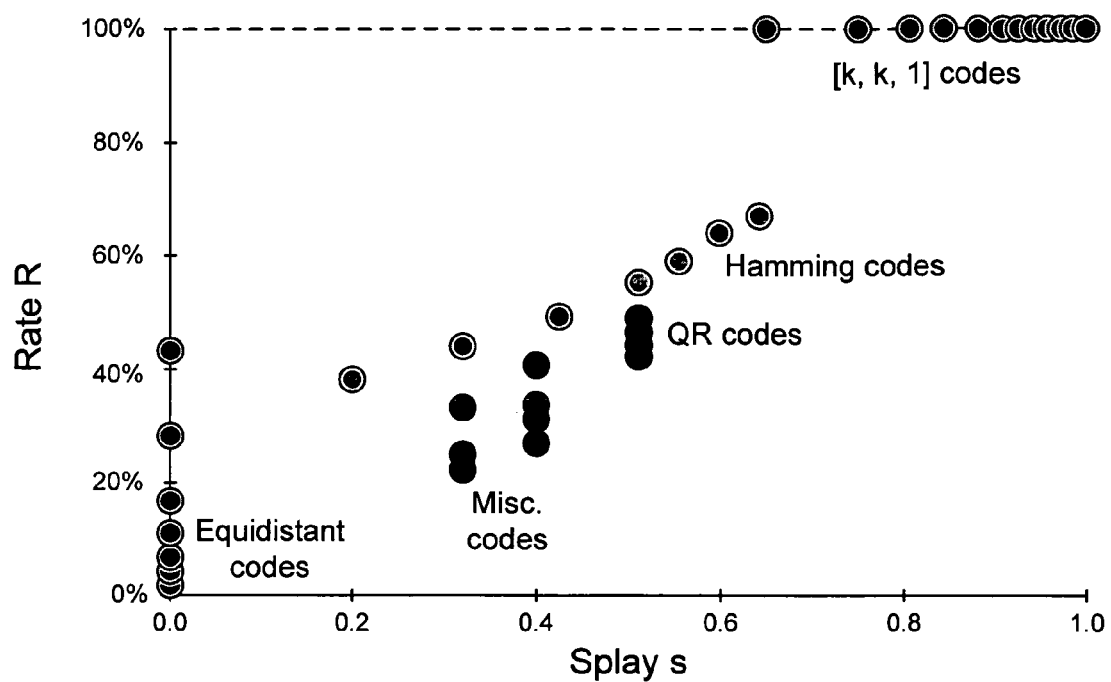
FIG. 54 shows a two-dimensional plot of efficiency metric R versus splay metric value S for a number of different types of BLCs evaluated for use in designing demultiplexers that represent various embodiments of the present invention.

FIGS. 49-53 show the address-distance distributions, or distance profiles, for a number of different linear binary codes. FIG. 49 shows the distance profile for a [7,7,1] code, with a splay S value of 0.86. FIG. 50 shows the distance profile for a [12,7,4] code, with a splay S value of 0.67. While the efficiency of the [7,7,1] code, the distance profile of which is shown in FIG. 49, is maximally valued at 1.0, the splay value S=0.86 is significantly less desirable than the splay value S=0.67 for the [12,7,4] code, the distance profile for which is shown in FIG. 50. The [12,7,4] code, by contrast, has a much lower efficiency metric value R of 0.583. FIG. 51 shows the distance profile for a [11,6,4] code constructed by removing the code word consisting of all "1" bits, referred to as an expurgated code. The splay value S is significantly decreased from that of the [12,7,4] code, the distance profile of which is shown in FIG. 50. FIG. 52 shows the distance profile for a [19,6,8] code with a dramatically lower splay value of 0.33. However, the [19,6,8] code has a relatively low efficiency metric R value of 0.316. FIG. 53 shows the distance profile for a [31,5,16] equidistance code, with an optimal splay value of 0.0, but a decidedly non-optimal efficiency metric R value of 0.161. FIG. 54 shows a two-dimensional plot of efficiency metric R versus splay metric value S for a number of different types of BLCs evaluated for use in designing demultiplexers that represent various embodiments of the present invention. Note that the R and S values of these codes tend to fall away from the most optimal, upper left-hand corner of the two-dimensional plot where, as shown in FIG. 46, the most desirable codes should fall. It is a challenge to identify BLCs that are particularly useful for demultiplexer design, with relatively high efficiency metric R values and relatively low splay metric S values.

Figure 55B:
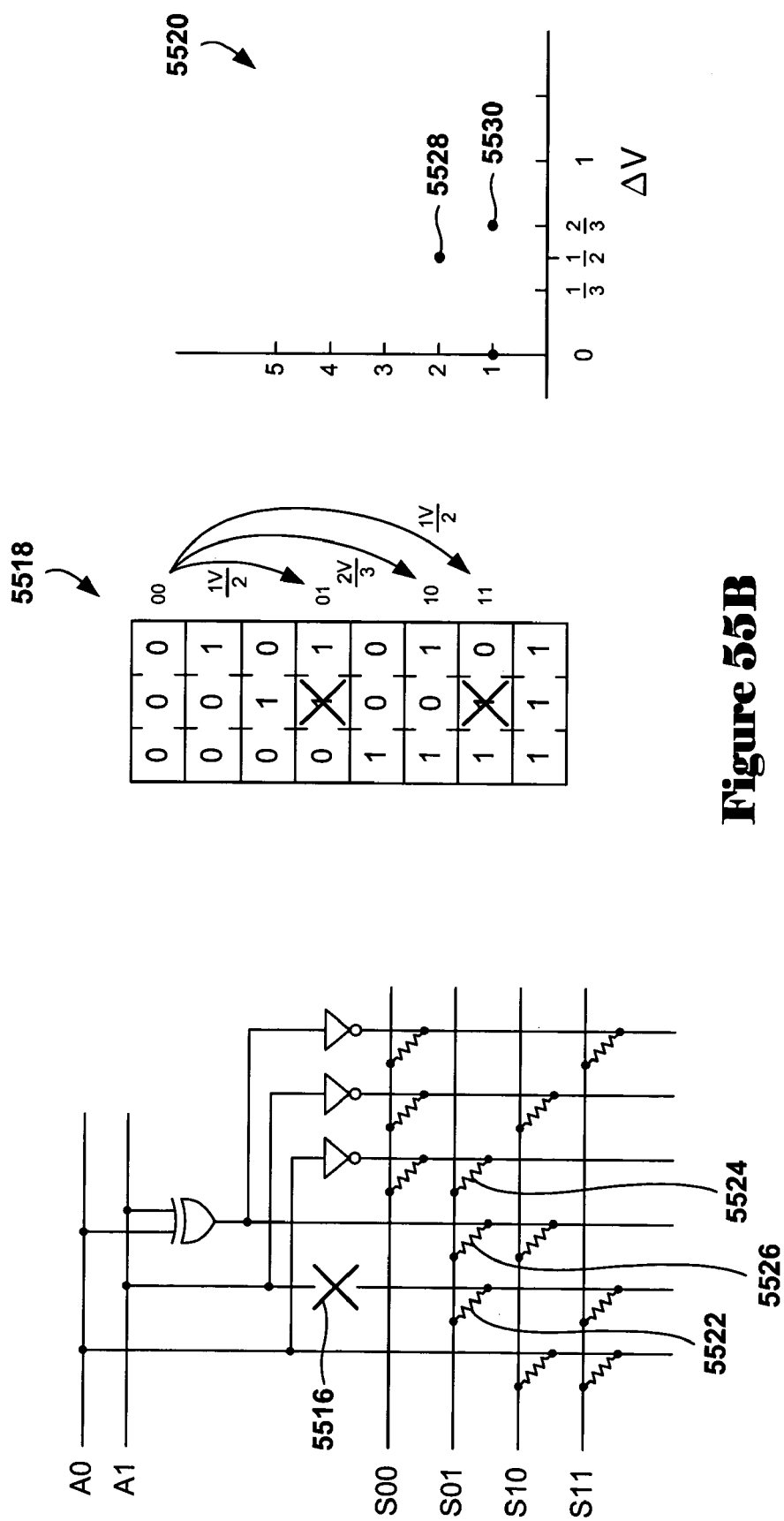

The redundancy provided by employing a greater number of address lines than needed to specify output signal lines that are densely addressed, such as in a demultiplexer designed according to an [k,k,1] code, is useful for increasing defect tolerance in nanoscale and partly nanoscale demultiplexers. A nanoscale demultiplexer designed according to a linear binary code with d>1 can suffer a number of defects before the output signal lines are no longer uniquely addressable. FIGS. 55A-D illustrate the effects of stuck-open, or broken wire, defects within the 3-address-line, 4-output-signal-line demultiplexer, representing one embodiment of the present invention, initially shown in FIG. 38. In FIG. 55A, the demultiplexer 5502 is intact, with no defects. As initially shown in FIG. 37B, the distance in bits, or voltage differential, between the all-zero code 5504 and the other 3-bit codes 5506-5508 corresponding to the 2-bit addresses of the output signal lines are easily computed. For the intact demultiplexer, the four 3-bit internal addresses corresponding to the four 2-bit addresses of the four output signal lines are separated from one other by two bits, or a voltage differential of $$\frac{2V_{in}}{3}.$$

A plot of the distribution of voltage differentials, when the address "00" is input to the address lines A0 and A1, between internal address 5504, the internal address of the selected output signal line, and the other three internal addresses 5506-5508 is shown at the right side of FIG. 55A 5510. The distribution shows that there is one three-bit internal address at a distance of 0 volts from the selected three-bit internal address 5512, namely the internal address "000," and three internal addresses (5506-5508) corresponding to the non-selected output signal lines that are $$\frac{2V_{in}}{3}$$

different, in voltage, from the selected output signal line 5514.

FIG. 55B uses the same illustration conventions of FIG. 55A to show the voltage differential distribution for output signal lines when the output signal line "00" is selected by input of address "00" to address signal lines A0 and A1 and when a stuck-open defect has occurred in the second vertical signal line of the nanowire crossbar. The stuck-open defect is shown as a broken signal line with the symbol "X" 5516. The voltage differentials between the $V_{in}$ voltage on the selected output signal line S00 and the other output signal lines is computed and shown in the address table 5518 in the center of the figure. A plot of the voltage-differential distributions is shown 5520 on the right side of the figure. The difference in voltage between a selected output signal line and two of the non-selected output signal lines S01 and S11 has been decreased by the presence of defect 5516. Consider the case of output signal line S01. The defect 5516 removes the connection of output signal line S01 through resistive element 5522 to ground when the output signal line S00 is selected. Therefore, output signal line S01 is pulled high through one resistive element 5524 and pulled low through the other remaining resistive element 5526. Therefore, the voltage state of output signal line S01 is $$\frac{V_{in}}{2}.$$

A similar decrease in the voltage-state separation between signal line S00 and unselected signal line S11 also occurs.

As can be seen in the distribution plot 5510, the single point (5514 in FIG. 55A) corresponding to the voltage differential between the selected output signal line and the non-selected output signal lines is, in FIG. 55B, split into two points 5528 and 5530, one 5528 of which represents a decreased minimum voltage separation between a selected output signal line and two of the three non-selected output signal lines.

Figure 55C:
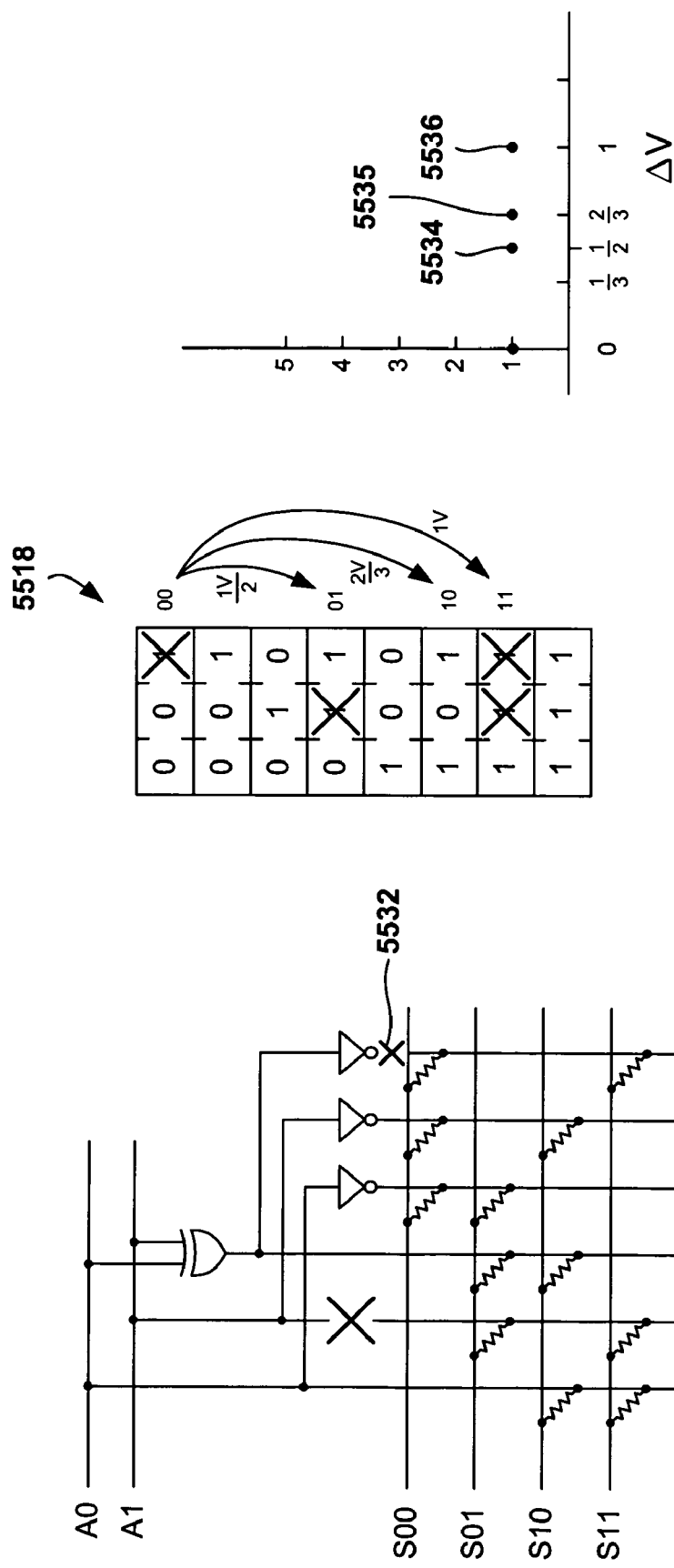
Figure 55D:
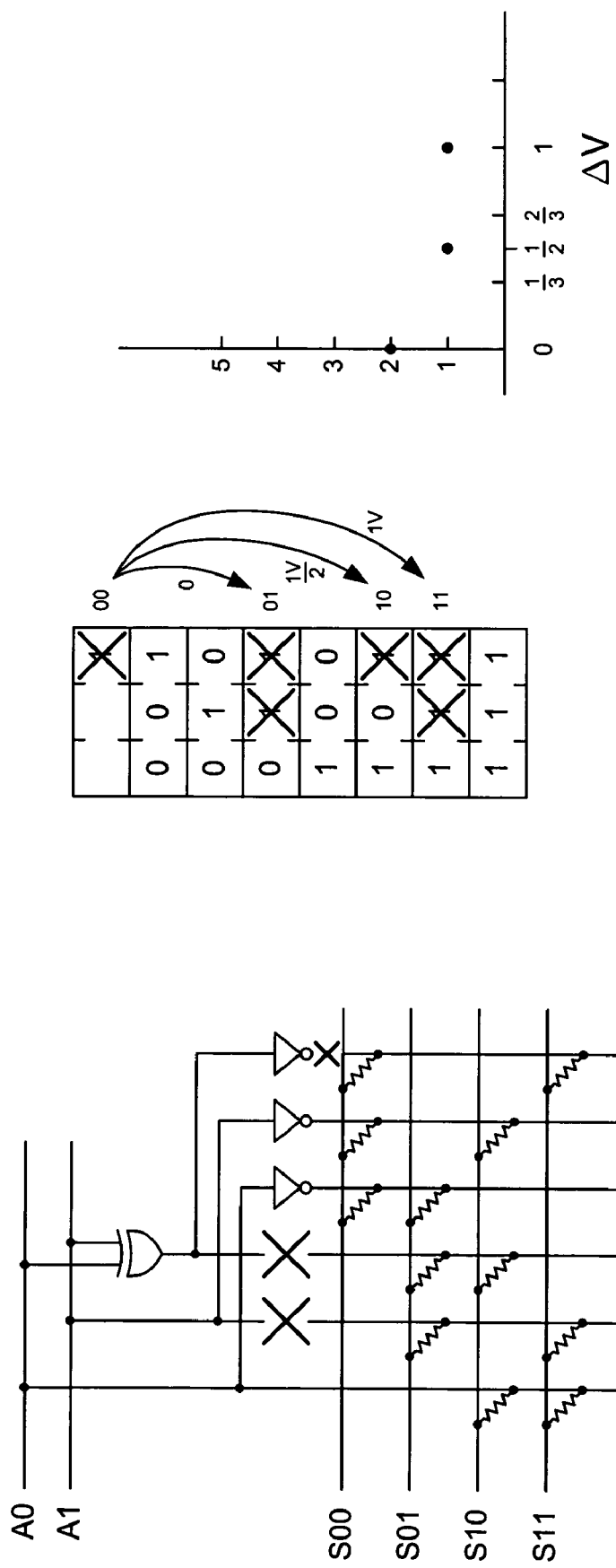

FIG. 55C uses the same illustration conventions of FIGS. 55A-B to show effects of a second stuck-open defect in the 3-address-line, 4-output-signal-line demultiplexer. The second defect 5532 results in splitting of the single non-selected signal-line voltage-differential point (5514 in FIG. 55A) into three different voltage-separation points 5534-5536. The additional defect has further broadened the range of non-selected-output-signal-line voltages. FIG. 55D 55C uses the same illustration conventions of FIGS. 55A-C to show effects of a third stuck-open defect in the 3-address-line, 4-output-signal-line demultiplexer. The third defect essentially destroys the demultiplexer, because there remains no voltage separation between selected output signal line S00 and non-selected output signal line S01. Again, the additional effect further broadens the range of voltage states of the non-selected-output signal lines and further decrease the minimum voltage separation between the selected output signal line and the closest, non-selected output signal line.

Figure 57:
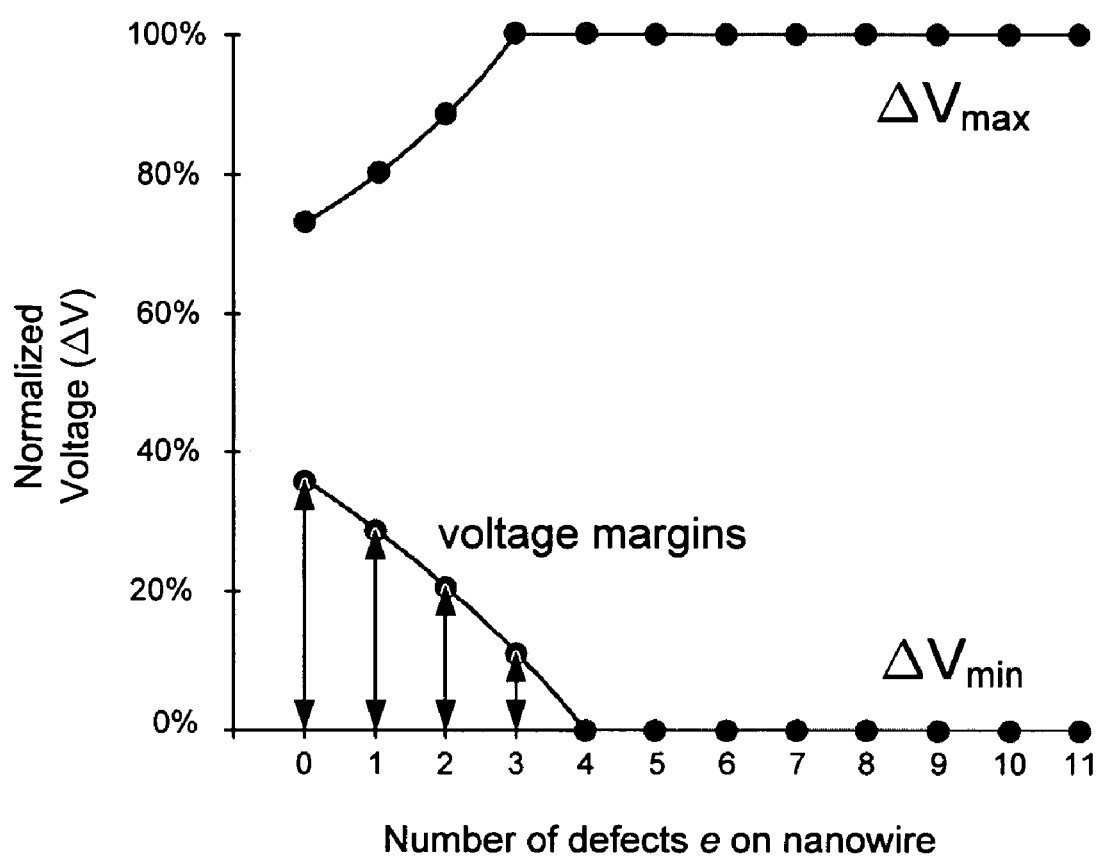
FIGS. 57 and 58 illustrate the increase in non-selected output-signal-line voltage-state range with increasing number of defects in demultiplexers, representing embodiments of the present invention, designed according to an [11,6,4] and a [31,5,16] linear binary code.
Figure 58:
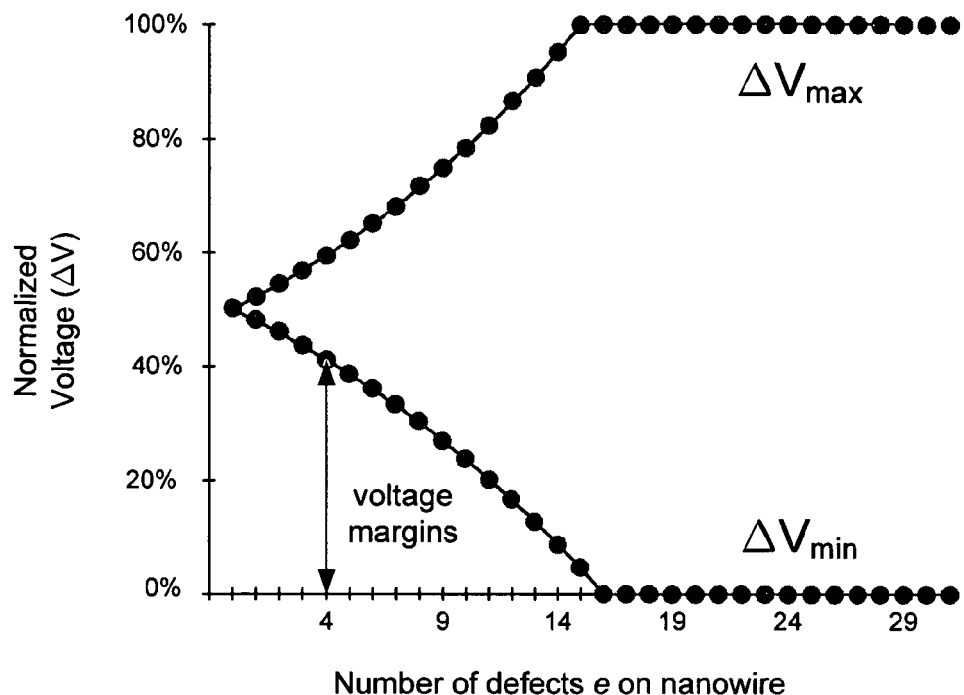
Figure 59:
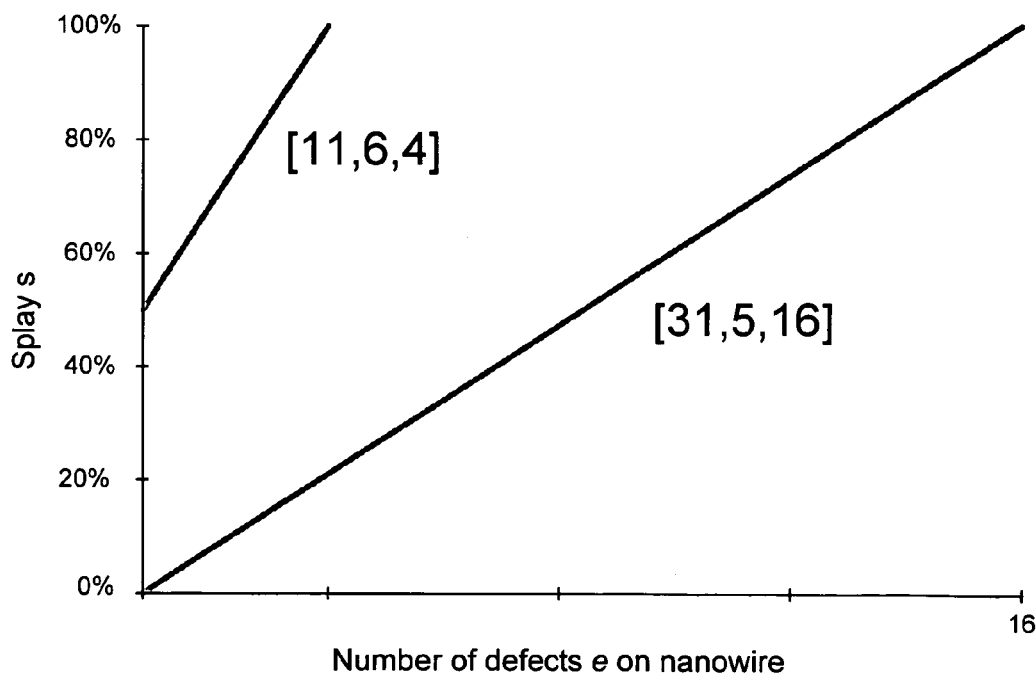
FIG. 59 illustrates a plot of the splay metric S, representing embodiments of the present invention, computed for a demultiplexer in relation to the number of defects present in the demultiplexer.

FIG. 56 illustrates the same defect trend in a demultiplexer, representing one embodiment of the present invention, designed according to an [11,6,4] linear binary code as that shown in FIGS. 55A-C. As can be seen in FIG. 56, as the number of defects, plotted along a horizontal axis 5602, increases, the voltage separations between the non-selected output signal lines decrease, the range of voltage states of the non-selected output signal lines increase, and the minimum voltage separation between the selected output signal line and the non-selected output signal lines decreases. FIGS. 57 and 58 illustrate the increase in non-selected output-signal-line voltage-state range with increasing number of defects in demultiplexers, representing embodiments of the present invention, designed according to an [11,6,4] and a [31,5,16] linear binary code. In FIG. 57, for example, three defects are tolerated by the demultiplexer, but the occurrence of a fourth defect drops the voltage separation between the selected output signal line and the closest non-selected output signal line to 0, resulting in the inability to distinguish the two output signal lines, as in FIG. 55D. In general, the smaller the splay metric value for the linear binary code, the greater defect tolerance provided by a demultiplexer designed according to the linear binary code. As can be seen in FIG. 58, 15 defects can be tolerated in a demultiplexer designed according to the [31,5,16] linear binary code, discussed above. FIG. 59 illustrates a plot of the splay metric S, representing embodiments of the present invention, computed for a demultiplexer in relation to the number of defects present in the demultiplexer. As shown in FIG. 59, the splay metric S increases linearly with the number of defects, and decreases more steeply for the [11,6,4] linear binary code with a larger initial splay metric value.

Although the present invention has been described in terms of particular embodiments, it is not intended that the invention be limited to this embodiment. Modifications within the spirit of the invention will be apparent to those skilled in the art. For example, in addition to linear-block codes, many other types of error-control encoding techniques may be used to design resistor-logic nanoscale and microscale electronic devices, such as the demultiplexer embodiments described above. The nanoscale interconnection interfaces described above are suitable for composite nanoscale and microscale electronic devices, including demultiplexers, but are generally applicable to many different interfaces between microscale and nanoscale electronic circuitry, as well as in purely nanoscale devices. Additionally, the techniques of the present invention may be applied not only to two-dimensional memories and circuits, but also to three-dimensional and higher dimensional circuits and memories. In the above discussion, several metrics, including an efficiency metric R, a splay metric S, and an overall figure of merit FOM, but many other metrics can be devised and used to quantify desirable qualities of a demultiplexer, or other addressing circuit, designed to have an encoding-based mapping between k output lines and n-bit addresses, where $\log_2 n > k$. As discussed above, those qualities include broad separation between addresses, but narrow distributions of address separations for the k addresses, and as few supplemental address lines as possible to achieve a desired robustness and voltage-margin compression. Many different embodiments for searching for desirable encodings for addresses can be implemented, in addition to the particular searching embodiment discussed above with reference to FIG. 48. These embodiments may be implemented in many different languages, using many different control structures, modular organizations, variable names, and other such programming parameters.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A nanoscale interconnection interface comprising:
   a number m of input address signal lines;
   a number n of internal address signal lines interconnected with the m input address signal lines; and
   a number of nanowires less than or equal to $2^k$, where k is less than n and the number of nanowires is less than $2^n$, each nanowire addressed by an n-bit internal address carried by the n internal address signal lines, each nanowire interconnected with one or more of the n internal address signal lines by resistor-like nanowire junctions, each nanowire mapped to an n-bit internal address, and each nanowire accessed by input of an m-bit external address to the m input address signal lines.

2. The nanoscale interconnection interface of claim 1 wherein m equals n, and an n-bit external address is input to access a particular nanowire.

3. The nanoscale interconnection interface of claim 1 wherein m is less than n, and an m-bit external address is input and mapped by the interconnection interface to an n-bit internal address to access a particular nanowire.

4. The nanoscale interconnection interface of claim 1 wherein each nanowire is associated with a k-bit nanowire number, and the nanowire junctions are implemented to map each k-bit nanowire number to a different n-bit internal address.

5. The nanoscale interconnection interface of claim 4 wherein mapping of each k-bit nanowire number to a different n-bit internal address provides for as great a minimal Hamming distance between n-bit internal addresses as possible for a selected number n.

6. The nanoscale interconnection interface of claim 4 wherein mapping of each k-bit nanowire number to a different n-bit internal address further provides for as small a number n as possible.

7. The nanoscale interconnection interface of claim 4 wherein mapping of each k-bit nanowire number to a different n-bit internal address is described by a binary linear code specifying $2^k$ bit strings of length n with a minimum Hamming distance d between code words.

8. A method for interconnecting a number m of input address signal lines to a number $2^k$ of nanowires, the method comprising:
   interconnecting the m input address signal lines with a number n of internal address signal lines; and
   interconnecting each of $2^k$ or fewer nanowires with one or more of the n internal address signal lines by resistor-like nanowire junctions, where k is less than n and the number of nanowires is less than $2^n$, each nanowire addressed by an n-bit internal address carried by the n internal address signal lines, each nanowire mapped to an n-bit internal address, and each nanowire accessed by inputting an m-bit external address to the m input address signal lines.

9. The method of claim 8 wherein m equals n, and an n-bit external address is input to access a particular nanowire.

10. The method of claim 8 wherein m is less than n, and an m-bit external address is input and mapped to an n-bit internal address to access a particular nanowire.

11. The method of claim 8 wherein each nanowire is associated with a k-bit nanowire number, and further comprising implementing the nanowire junctions to map each k-bit nanowire number to a different n-bit internal address.

12. The method of claim 11 further comprising implementing the nanowire junctions to map each k-bit nanowire number to a different n-bit internal address to provide as great a minimal Hamming distance between n-bit internal addresses as possible for a selected number n.

13. The method of claim 11 further comprising implementing the nanowire junctions to map each k-bit nanowire number to a different n-bit internal address to provide for as small a number n as possible.

14. The method of claim 11 further comprising mapping each k-bit nanowire number to a different n-bit internal address by using a binary linear code specifying $2^k$ bit strings of length n with a minimum Hamming distance d between code words.

* * * * *

UNITED STATES PATENT AND TRADEMARK OFFICE
CERTIFICATE OF CORRECTION

PATENT NO.         : 7,350,132 B2
APPLICATION NO.    : 11/115887
DATED              : March 25, 2008
INVENTOR(S)        : Philip J. Kuekes et al.

It is certified that error appears in the above-identified patent and that said Letters Patent is hereby corrected as shown below:

In column 10, line 54, delete "$k=2\text{-}m\text{-}1$" and insert -- $k=2^m\text{-}m\text{-}1$ --, therefor.

Signed and Sealed this

Fourteenth Day of July, 2009

JOHN DOLL
*Acting Director of the United States Patent and Trademark Office*